US007836245B2

(12) United States Patent
Kudo et al.

(10) Patent No.: US 7,836,245 B2
(45) Date of Patent: Nov. 16, 2010

(54) NONVOLATILE MEMORY SYSTEM, AND DATA READ/WRITE METHOD FOR NONVOLATILE MEMORY SYSTEM

(75) Inventors: Yasuo Kudo, Higashiyamato (JP); Hiroshi Sukegawa, Nerima-ku (JP); Kazuya Kawamoto, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/375,836

(22) PCT Filed: Jul. 31, 2007

(86) PCT No.: PCT/JP2007/065333

§ 371 (c)(1),
(2), (4) Date: Jan. 30, 2009

(87) PCT Pub. No.: WO2008/016170

PCT Pub. Date: Feb. 7, 2008

(65) Prior Publication Data

US 2009/0193183 A1 Jul. 30, 2009

(30) Foreign Application Priority Data

Jul. 31, 2006 (JP) ............................ 2006-207425
Feb. 20, 2007 (JP) ............................ 2007-039375

(51) Int. Cl.
*G06F 12/00* (2006.01)

(52) U.S. Cl. ...................................................... 711/103

(58) Field of Classification Search ....................... None
See application file for complete search history.

(56) References Cited

U.S. PATENT DOCUMENTS 5,386,579 A * 1/1995 Bourekas et al. .............. 712/43
5,603,001 A 2/1997 Sukegawa et al.
5,875,466 A * 2/1999 Wakerly ..................... 711/138
6,366,977 B1 * 4/2002 Mizoguchi .................. 711/103
6,411,552 B1 6/2002 Chiba
6,446,177 B1 * 9/2002 Tanaka et al. ............... 711/163
6,684,289 B1 1/2004 Gonzalez et al.
2001/0010065 A1 7/2001 Chiba
2002/0018814 A1 2/2002 Werle et al.
2002/0188814 A1 12/2002 Saito et al.
2003/0067814 A1 4/2003 Piau et al.
2003/0095437 A1 5/2003 Imamiya (Continued)

FOREIGN PATENT DOCUMENTS

JP 7 302176 11/1995

(Continued)

OTHER PUBLICATIONS

Korean Office Action for Application No. 10-2009-7002078 with English language translation Oct. 17, 2010.

*Primary Examiner*—Brian R Peugh
(74) *Attorney, Agent, or Firm*—Oblon, Spivak, McClelland, Maier & Neustadt, L.L.P.

(57) ABSTRACT

A nonvolatile memory system comprises a nonvolatile memory having a plurality of data areas; and a memory controller operative to control read and write operations to the nonvolatile memory. The memory controller successively executes read/write operations to plural sectors within a selected data area in the nonvolatile memory in accordance with a command and a sector count and sector address fed from a host device.

27 Claims, 115 Drawing Sheets

Package PIN arrangement

U.S. PATENT DOCUMENTS

2004/0205418 A1 10/2004 Sakaue et al.
2005/0141273 A1 6/2005 Park et al.
2006/0155918 A1 7/2006 Oshima
2006/0253643 A1 * 11/2006 Blanck ....................... 711/103

FOREIGN PATENT DOCUMENTS

JP 11 53248 2/1999
JP 2002 366420 12/2002
JP 2003 162453 6/2003
JP 2004 516536 6/2004
JP 2005 196764 7/2005
JP 2006-99517 4/2006
JP 2006 195565 7/2006

* cited by examiner

Package PIN arrangement

FIG. 5

PINNAMES

| PIN Number | TC58NVG2S3CFT00 (4Gbit SLC LB) | | LBA-NAND | |
|---|---|---|---|---|
| | PIN Name | Description | PIN Name | Description |
| 29 to32, 41 to 44 | I/O1 to I/O8 | I/O port | I/O1 to I/O8 | I/O port |
| 9 | $\overline{CE}$ | Chip enable | $\overline{CE}$ | Chip enable |
| | | Chip enable | $\overline{S}$ | |
| 18 | $\overline{WE}$ | Write enable | $\overline{WE}$ | Write enable |
| 8 | $\overline{RE}$ | Read enable | $\overline{RE}$ | Read enable |
| 16 | CLE | Command latch enable | CLE | Command latch enable |
| 17 | ALE | Address latch enable | ALE | Address latch enable |
| 39 | PSL | Power on select | COME | COM signal Enable |
| 19 | $\overline{WP}$ | Write protect | NC | Non Connection |
| 7 | RY/$\overline{BY}$ | Ready/Busy | RY/$\overline{BY}$ | Ready/Busy |
| 12,37 | $V_{CC}$ | Power supply | $V_{CC}$ | Power supply |
| 13,36 | $V_{SS}$ | Ground | $V_{SS}$ | Ground |
| 10 | NC | Non Connection | COM0 | Common 0 |
| 15 | NC | Non Connection | COM1 | Common 1 |
| 33 | NC | Non Connection | $\overline{HOLD}$ | SPI hold pin |
| 34 | NC | Non Connection | CLK | I2C/SPI clock pin |
| 35 | NC | Non Connection | DATA | I2C/SPI data out pin |

FIG. 6

(U: Used page, Blank:not used) [O: Odd, E: Even]

| Word # | 1KB | | 2KB | | 3KB | | 4KB | | 5KB | | 6KB | | 7KB | | 8KB | | Valid Capa | | | Page # | |
|---|---|---|---|---|---|---|---|---|---|---|---|---|---|---|---|---|---|---|---|---|---|
| | E | O | E | O | E | O | E | O | E | O | E | O | E | O | E | O | Even | Odd | Total | Even | Odd |
| 0 | | | | | | | | | | | | | | | | | | | | 0 | 1 |
| 1 | U | | U | | U | | U | | U | | U | | U | | U | | 4kB | | 4kB | 2 | 3 |
| 2 | U | | U | | U | | U | | U | | U | | U | | U | | 4kB | | 8kB | 6 | 7 |
| 3 | U | | U | | U | | U | | U | | U | | U | | U | | 4kB | | 12kB | 10 | 11 |
| 4 | U | | U | | U | | U | | U | | U | | U | | U | | 4kB | | 16kB | 14 | 15 |
| 5 | U | | U | | U | | U | | U | | U | | U | | U | | 4kB | | 20kB | 18 | 19 |
| 6 | U | | U | | U | | U | | U | | U | | U | | U | | 4kB | | 24kB | 22 | 23 |
| 7 | U | | U | | U | | U | | U | | U | | U | | U | | 4kB | | 28kB | 26 | 27 |
| 8 | U | | U | | U | | U | | U | | U | | U | | U | | 4kB | | 32kB | 30 | 31 |
| 9 | U | | U | | U | | U | | U | | U | | U | | U | | 4kB | | 36kB | 34 | 35 |
| ↓ | ↓ | | ↓ | | ↓ | | ↓ | | ↓ | | ↓ | | ↓ | | ↓ | | | | | | |
| 27 | U | | U | | U | | U | | U | | U | | U | | U | | 4kB | | 108kB | 106 | 107 |
| 28 | U | | U | | U | | U | | U | | U | | U | | U | | 4kB | | 112kB | 110 | 111 |
| 29 | U | | U | | U | | U | | U | | U | | U | | U | | 4kB | | 116kB | 114 | 115 |
| 30 | U | | U | | U | | U | | U | | U | | U | | U | | 4kB | | 120kB | 118 | 119 |
| 31 | | | | | | | | | | | | | | | | | | | | 122 | 123 |

FIG. 7

(1) Basic system image

| Area name | Capacity(Byte) | | | Pure NAND mode | | |
|---|---|---|---|---|---|---|
| | Min. | Default | Max. | | | |
| Pure NAND Read area | - | 524,288 | - | PNR | Pure NAND read | <00>-(ADD)-<30> |
| Vender Application area | - | 8,388,608 | 33,554,432 | Non | Non operation | |
| Music Data area | 950,009,856 | 1,000,341,504 | - | Non | Non operation | |
| | 1,949,827,072 | 2,000,158,720 | - | | | |
| | 3,949,985,792 | 4,000,317,440 | - | | | |
| Controller System area | | | | | | |

Operation commands

| | | LBA-NAND mode |
|---|---|---|
| PNA | Read | <00>-(ADD)-<30> |
| | Write | <80>-(ADD)-<10> |
| VFA | Read | <00h>-(SC:2Byte)-(SA:2Byte)-(Dummy:1Byte)-<30h>-[data] |
| | Write | <80h>-(SC:2Byte)-(SA:2Byte)-(Dummy:1Byte)-[data]-<10h> |
| MDA | Read | <00>-(ADD)-<30> |
| | Write | <80>-(ADD)-<10> |

FIG. 10

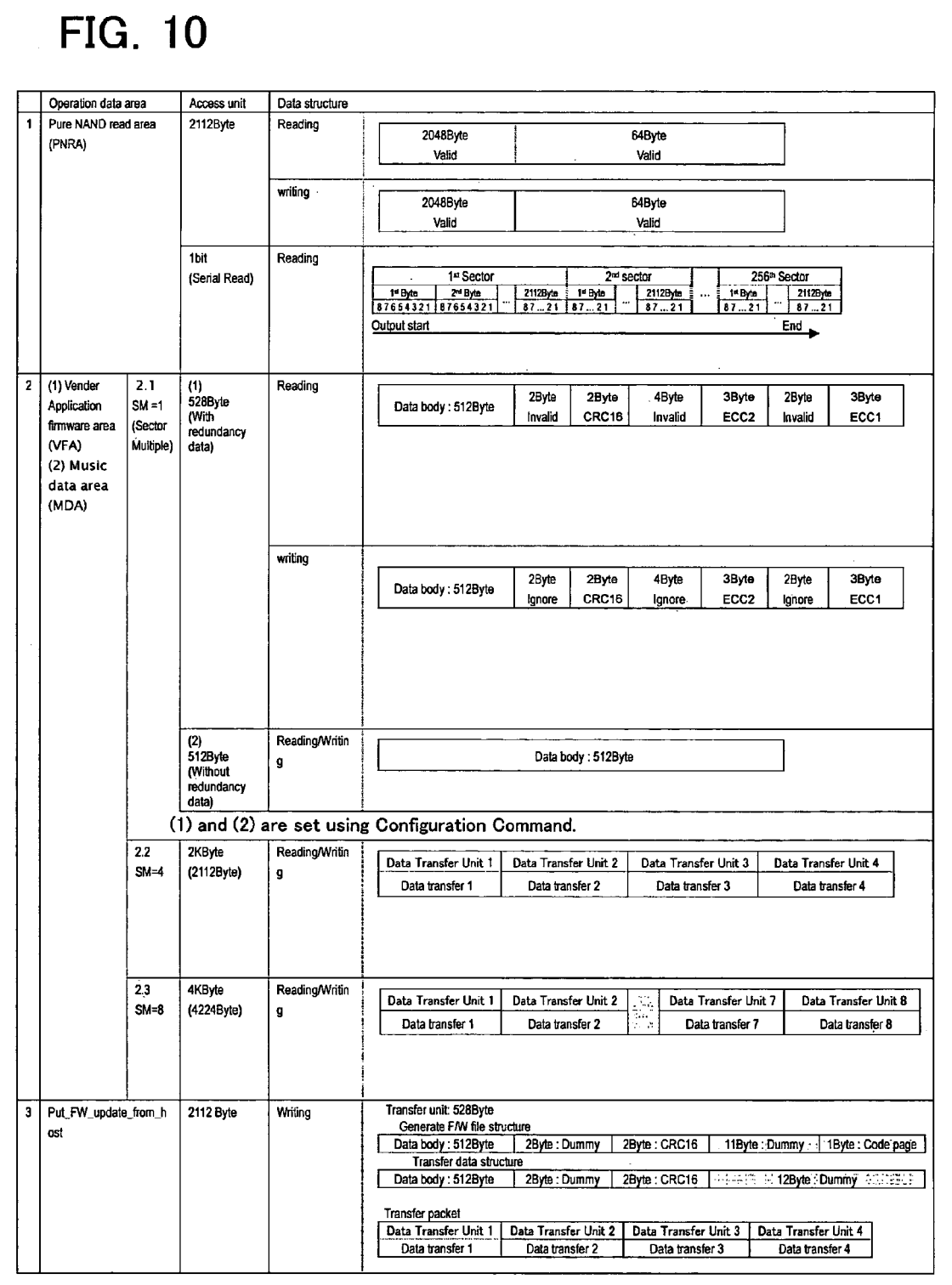

| | Operation data area | | Access unit | | Data structure |
|---|---|---|---|---|---|
| 1 | Pure NAND read area (PNRA) | | 2112Byte | Reading | 2048Byte Valid \| 64Byte Valid |
| | | | | writing | 2048Byte Valid \| 64Byte Valid |
| | | | 1bit (Serial Read) | Reading | 1st Sector: 1st Byte 87654321 \| 2nd Byte 87654321 \| … \| 2112Byte 87…21 \| 2nd sector: 1st Byte 87…21 \| … \| 2112Byte 87…21 \| … \| 256th Sector: 1st Byte 87…21 \| … \| 2112Byte 87…21<br>Output start → End |
| 2 | (1) Vender Application firmware area (VFA)<br>(2) Music data area (MDA) | 2.1 SM =1 (Sector Multiple) | (1) 528Byte (With redundancy data) | Reading | Data body : 512Byte \| 2Byte Invalid \| 2Byte CRC16 \| 4Byte Invalid \| 3Byte ECC2 \| 2Byte Invalid \| 3Byte ECC1 |
| | | | | writing | Data body : 512Byte \| 2Byte Ignore \| 2Byte CRC16 \| 4Byte Ignore \| 3Byte ECC2 \| 2Byte Ignore \| 3Byte ECC1 |
| | | | (2) 512Byte (Without redundancy data) | Reading/Writing | Data body : 512Byte |
| | | (1) and (2) are set using Configuration Command. | | | |
| | | 2.2 SM=4 | 2KByte (2112Byte) | Reading/Writing | Data Transfer Unit 1 / Data transfer 1 \| Data Transfer Unit 2 / Data transfer 2 \| Data Transfer Unit 3 / Data transfer 3 \| Data Transfer Unit 4 / Data transfer 4 |
| | | 2.3 SM=8 | 4KByte (4224Byte) | Reading/Writing | Data Transfer Unit 1 / Data transfer 1 \| Data Transfer Unit 2 / Data transfer 2 \| … \| Data Transfer Unit 7 / Data transfer 7 \| Data Transfer Unit 8 / Data transfer 8 |
| 3 | Put_FW_update_from_host | | 2112 Byte | Writing | Transfer unit: 528Byte<br>Generate F/W file structure<br>Data body : 512Byte \| 2Byte : Dummy \| 2Byte : CRC16 \| 11Byte : Dummy \| 1Byte : Code page<br>Transfer data structure<br>Data body : 512Byte \| 2Byte : Dummy \| 2Byte : CRC16 \| 12Byte : Dummy<br>Transfer packet<br>Data Transfer Unit 1 / Data transfer 1 \| Data Transfer Unit 2 / Data transfer 2 \| Data Transfer Unit 3 / Data transfer 3 \| Data Transfer Unit 4 / Data transfer 4 |

FIG. 11A

*1: Command priority

| | Command name | | valid mode PNR | PNA | VFA | MDA | *1) | | |
|---|---|---|---|---|---|---|---|---|---|
| 1 | Pure NAND read | | ○ | | | | 1 | | <00h>-(Dummy address:5Byte)-<30h>-(B2R)-[data] |
| 2 | MDA | Read | | | | ○ | 1 | 1 | <00h>-(SC:2Byte)-(SA:3Byte)-<30h>-(B2R)-[data]...- <00h>-(Dummy add. 5Byte)-<30h>-(B2R)-[data]. |
| | | | | | | | | | Same as NAND flash memory |
| | | | | | | | | 2 | <00h>-(SC:2Byte)-(SA:3Byte)-<30h>-(B2R)-[data]- <F8h>-(B2R)-[data] - <F8h>-(B2R)-[data] - <F8h>-(B2R)-[data].. |
| | | | | | | | | 3 | <00h>-(SC:2Byte)-(SA:3Byte)-<30h>-(B2R)-[data]-(B2R)-[data]-(B2R)-[data]-(B2R)-[data].... |
| | | write | | | | ○ | 1 | 1 | <80h>-(SC:2Byte)-(SA:3Byte)-<data>-<10h>-(B2R)-...<80h>-(Dummy add. 5Byte)-[data]-<10h>-(B2R)-.. |
| | | | | | | | | | Same as NAND flash memory |
| | | | | | | | | 2 | <80h>-(SC:2Byte)-(SA:3Byte)-<data>-<15h>-(B2R)-<80h>-<data>-<15h>-(B2R)...<80h>-<data>-<10h>-(B2R).. |
| 3 | PNA | Read | | ○ | | | 1 | | same as MDA mode. |
| | | write | | ○ | | | 1 | | same as MDA mode. |
| 4 | VFA | Read | | | ○ | | 1 | | same as MDA mode. |
| | | write | | | ○ | | 1 | | same as MDA mode. |
| 5 | mode change | | ○ | ○ | ○ | | 1 | | <FCh>-(B2R) |
| | | | | | ○ | ○ | 1 | | <60>-(Config:BFh)-(Dummy:2Byte)-<D0>-(B2R) |
| | | | | ○ | | ○ | 1 | | <00>-(Config:BEh)-(PW:2Byte)-(Dummy:2Byte)-<57>-(B2R) |
| 6 | NOP | | | ○ | ○ | ○ | 1 | 1 | <60h>-<Dummy:3Byte>-<D0h>-(B2R) |
| | | | | | | | | | But: <60h>-(BFh)-(Dummy:2Byte)-<D0> only valid command code |
| | | | | | | | | 2 | <FFh>-(B2R) |
| | | | | | | | | | But: <FFh> is valid in PureNAND mode. |
| 7 | Command_911 | | - | ○ | ○ | ○ | 1 | | [BY or RD]-<FEh>-(B2R)-<00h>-(FDh)-(xxh)-(xxH)-(Aah)-(55h)-<57h>-(B2R) |
| 8 | Force BUSY to READY | | - | ○ | ○ | ○ | 1 | | <FEh>-(B2R) |

FIG. 11B

| | | | | | | | | |
|---|---|---|---|---|---|---|---|---|
| 9 | ID. read | 4Gbit SLC LB | o | o | o | o | 1 | <90h>-(x0h) -(B2R)-[Maker code:98h]-[Device code:DCh]-[Character code:x0h]-[ Organization code:15h]-[ Plane Information:60h] |
| | | LBA-NAND (True-ID) For opening to the customer | o | o | o | o | 1 | <92h>-(00h) -(B2R)-[Maker code:98h]-[Device code:21h]-[Capacity code:xxh]-[ Dummy:2Byte]-[Controller version&maker] Device code : 21 to 2F are LBA-NAND ID. |

| Description | | I/O 8 | 7 | 6 | 5 | 4 | 3 | 2 | 1 | Hex Data |
|---|---|---|---|---|---|---|---|---|---|---|
| 1st Byte | Maker Code | 1 | 0 | 0 | 1 | 1 | 0 | 0 | 0 | 98h |
| 2nd Byte | Device code | 1 | 1 | 0 | 1 | 1 | 1 | 0 | 0 | DCh |
| 3rd Byte | 1 Chip/SLC | x | 0 | x | x | 0 | 0 | 0 | 0 | x0h |
| 4th Byte | 128KB / 2KB | 0 | 0 | 0 | 1 | 0 | 1 | 0 | 1 | 15h |
| 5th Byte | | x | x | x | x | x | x | 1 | x | xxh |

| | Description | I/O8 | I/O7 | I/O6 | I/O5 | I/O4 | I/O3 | I/O2 | I/O1 | Hex Data |
|---|---|---|---|---|---|---|---|---|---|---|
| 1st Byte | Maker Code | 1 | 0 | 0 | 1 | 1 | 0 | 0 | 0 | 98h |
| 2nd Byte | Device code | 0 | 0 | 1 | 0 | 0 | 0 | 0 | 1 | 21h |
| 3rd Byte | 1GByte | Res | Res | Res | Res | Res | Res | 0 | 0 | xxh |
| | 2GByte | Res | Res | Res | Res | Res | Res | 0 | 1 | xxh |
| | 4GByte | Res | Res | Res | Res | Res | Res | 1 | 0 | xxh |
| | 8GByte | Res | Res | Res | Res | Res | Res | 1 | 1 | xxh |
| 4th Byte | Reserved | Res | Res | Res | Res | Res | Res | Res | Res | xxh |
| 5th Byte | Reserved | Res | Res | Res | Res | Res | Res | Res | Res | Xxh |
| 6th Byte | Controller ver. | Maker code | | x | x | H/W version | | | | xxh |

FIG. 11C

| | | | | | | | | |
|---|---|---|---|---|---|---|---|---|
| 10 | Status read | Primary | | o | o | o | 1 | <70h> Error/Pass/etc (see table below) |
| | | Secondary | | o | o | o | 1 | <71h> Send special information to host (see table below) |

<70h>

Error/Pass/etc

| Description | | I/O 8 | 7 | 6 | 5 | 4 | 3 | 2 | 1 | Remark |
|---|---|---|---|---|---|---|---|---|---|---|
| Summary Pass or Fail | Pass | 1 | | | Reserved | Reserved | | | 0 | |
| | Fail | 1 | | | Reserved | Reserved | | | 1 | |
| Pass or Fail | Pass | 1 | | | Reserved | Reserved | | 0 | | |
| | Fail | 1 | | | Reserved | Reserved | | 1 | | |
| | Transfer Pass | 1 | | | Reserved | Reserved | 0 | | | |
| | Transfer Fail | 1 | | | Reserved | Reserved | 1 | | | |
| Ready/Busy | Busy | 1 | 0 | 0 | Reserved | Reserved | | | | |
| | Ready | 1 | 1 | 1 | Reserved | Reserved | | | | |

Reserved: set 0

<71h>

Send special information to host

| Description | | | I/O 8 | 7 | 6 | 5 | 4 | 3 | 2 | 1 | Remark |
|---|---|---|---|---|---|---|---|---|---|---|---|
| Show Mode | Power mode | Peak Current Reducing mode | | | | | | | | 0 | |
| | | Full power mode | | | | | | | | 1 | |
| | Operation mode | PNR mode | | | | | | 0 | 0 | | |
| | | PNA mode | | | | | | 0 | 1 | | |
| | | VFA mode | | | | | | 1 | 0 | | |
| | | MDA mode | | | | | | 1 | 1 | | |
| Spare block exhaust | | | | | | | 1 | | | | |
| Over sector count | | | | | | 1 | | | | | |
| Password status | | Original | | | 0 | | | | | | |
| | | Customer setted | | | 1 | | | | | | |
| Reserved | | | R | R | | | | | | | |

FIG. 11D

| | | | | | | | | | |
|---|---|---|---|---|---|---|---|---|---|
| 11 | Set_Password | | | | ○ | | 1 | <00h>-(Config:21h)-(Old Password 2Byte)-(New Password:2Byte)-<57h>-(B2R) | |
| 12 | Set_VFA_Unit | | | | ○ | | 1 | <00h>-(Config:A5h)-(New value:1Byte)-(Dummy:3Byte)-<57h>-(B2R) | |
| 13 | Reset series | Exe_FW update from host | | | ○ | | 1 | 13.1 | <FAh>-(B2R) |
| | | Address reset | ○ | - | - | - | 1 | 13.2 | <FFh>-(B2R) |
| | | FW reload from flash memory | - | ○ | ○ | ○ | 1 | 13.3 | <FDh>-(B2R) |
| 14 | Termination R/W | | ○ | ○ | ○ | ○ | 1 | <FBh>-(B2R) | |
| 15 | Send_FW_update _from_host | | ○ | | ○ | | | <00h>-(Config:53h)-(Password:2Byte)-(55h)-(AAh)-<57h>-(B2R)-<80h>-(Dummy:2Byte)-(code_page:1Byte)-(Dummy:2Byte)-[Data:2112Byte]-<10h>-(B2R)-<80h>-(Dummy:2Byte)-(code_page:1Byte)-(Dummy:2Byte)-[Data:2112Byte]-<10h>-(B2R) | |
| 16 | Exe_Data _refresh **TBD** | | | | ○ | | 2 | (TBD) <00h>-(Config:5Ah)-(55h)-(AAh)-(55h)-(AAh)-<57h>-(B2R) | |
| 17 | Exe_Security _Erase Unit **TBD** | | | | ○ | | 2 | (TBD) <00h>-(Config:55h)-(55h)-(AAh)-(55h)-(AAh)-<57h>-(B2R) | |
| 18 | Exe_Flush_Cache | | | ○ | ○ | ○ | 1 | <F9h>-(B2R) | |

FIG. 11E

| 19 | Sel_Transfer protocol | | | o | | 1 | <00h>-(Config:A2h)-(Data:2Byte)-(Dummy:2Byte;Reserved)-<57h>-(B2R) |
|---|---|---|---|---|---|---|---|

1st byte

| I/O | | | 8 | 7 | 6 | 5 | 4 | 3 | 2 | 1 | Remark |
|---|---|---|---|---|---|---|---|---|---|---|---|
| ECC | No check | | 0 | 0 | - | - | - | - | - | - | |
| | CRC16 Enable | | 0 | 1 | - | - | - | - | - | - | CRC16 check and report |
| | ECC | Check Enable | 1 | 0 | - | | | | | | Error check and report |
| | | Correct Enable | 1 | 1 | - | - | - | - | - | - | Self Error correction and report at writing |
| Transfer Sector Size & Multi Sector | 512Byte & Multiple is 1 | | - | - | 0 | 0 | 0 | 0 | 0 | 1 | |
| | 528Byte & Multiple is 1 | | - | - | 1 | 0 | 0 | 0 | 0 | 1 | |
| | 512Byte & Multiple is 4 | | - | | 0 | 0 | 0 | 0 | 1 | 0 | |
| | 528Byte & Multiple is 4 | | | - | 1 | 0 | 0 | 0 | 1 | 0 | |
| | 512Byte & Multiple is 8 | | - | | 0 | 0 | 0 | 1 | 0 | 0 | |
| | 528Byte & Multiple is 8 | | | - | 1 | 0 | 0 | 1 | 0 | 0 | |

Default value: 11100001 · E1h

2nd Byte

| I/O | | | 8 | 7 | 6 | 5 | 4 | 3 | 2 | 1 | Remark |
|---|---|---|---|---|---|---|---|---|---|---|---|
| Read | Lock like 4Gbit SLC(LB) type | | - | - | - | - | - | - | 0 | 0 | Type A |
| | Optional | With continuation command (18h/F8h) | - | - | - | - | - | - | 1 | 0 | Type B |
| | | With Busy state | - | - | - | - | - | - | 1 | 1 | Type C |
| Write | Lock like 4Gbit SLC(LB) type | | - | - | - | - | - | 0 | - | - | Type A |
| | Optional | Without dummy address | - | - | - | - | - | 1 | - | - | Type B |
| Reserved | | | R | R | R | R | R | | | | |

Default value: xxxxx000

Reading

Type A : <00h>-(ADD)-<30h>-(B2R)-[Data]-<00h>-(ADD)-<30h>-(B2R)-[Data]···

Type B : <00h>-(ADD)-<30h>-(B2R)-[Data]-<48h/F8h>-(B2R)-[Data]-<48h/F8h>-(B2R)-[Data]···

Type C : <00h>-(ADD)-<30h>-(B2R)-[Data]-(B2R])-[Data]···

Writing

Type A : <80h>-(ADD)-[Data]-<10h>-(B2R)-<80h>-(ADD)-[Data]-<10h>-(B2R)···

Type B : <80h>-(ADD)-[Data]-<10h>-(B2R)-<80h>-[Data]-<10h>-(B2R)···

3rd Byte

Reserved

4th Byte

Reserved

Default value

FIG. 11F

| | | | | | | | |
|---|---|---|---|---|---|---|---|
| 20 | Set_Minimum_bus y_time | | | ○ | | 1 | <00h>-(Config:A4h)-(Data:1Byte)-(Dummy:3Byte)-<57h>-(B2R) |
| 21 | Set_Power_Save_ mode | | | | ○ | 1 | <00h>-(Config:BBh)-(Dummy:4Byte)-<57h>-(B2R) |

| IO | 8 | 7 | 6 | 5 | 4 | 3 | 2 | 1 | |
|---|---|---|---|---|---|---|---|---|---|
| 0ns | 0 | 0 | 0 | 0 | 0 | 0 | 0 | 0 | Best performance mode<br>Default(in LBA-NAND mode) |
| 500ns | 0 | 0 | 0 | 0 | 0 | 0 | 0 | 1 | |
| 1us | 0 | 0 | 0 | 0 | 0 | 0 | 1 | 0 | |
| 2us | 0 | 0 | 0 | 0 | 0 | 1 | 0 | 0 | |
| 3us | 0 | 0 | 0 | 0 | 1 | 0 | 0 | 0 | |
| 5us | 0 | 0 | 0 | 1 | 0 | 0 | 0 | 0 | |
| 10us | 0 | 0 | 1 | 0 | 0 | 0 | 0 | 0 | Default (in PNR) |
| 20us | 0 | 1 | 0 | 0 | 0 | 0 | 0 | 0 | |
| 50us | 1 | 0 | 0 | 0 | 0 | 0 | 0 | 0 | |
| 100us | 1 | 0 | 0 | 0 | 0 | 0 | 0 | 1 | |
| 500us | 1 | 0 | 0 | 0 | 0 | 0 | 1 | 0 | |
| 1ms | 1 | 0 | 0 | 0 | 0 | 1 | 0 | 0 | |

R: Reserved Bit

FIG. 11G

| | | | | | | | |
|---|---|---|---|---|---|---|---|
| 22 | Exit_Power_Save_mode | | | | o | 1 | <00h>-(Config:BAh)-(Dummy:4Byte)-<57h>-(B2R) |
| 23 | Get_address_info | | o | o | o | 1 | <00h>-(Config:BCh)-(Dummy:4Byte)-<57h>-(B2R)-[Data:1Byte]-[Dummy:4Byte] |

| | 8 | 7 | 6 | 5 | 4 | 3 | 2 | 1 | |
|---|---|---|---|---|---|---|---|---|---|
| Valid Sector Address Byte | - | - | - | - | - | 0 | 0 | 0 | 3Byte |
| | - | - | - | - | - | 0 | 0 | 1 | 4Byte |
| | - | - | - | - | - | 0 | 1 | 0 | 5Byte |
| | - | - | - | - | - | 0 | 1 | 1 | 6Byte |
| Valid Sector count Byte | - | - | 0 | 0 | 0 | - | - | - | 2Byte |
| | - | - | 0 | 0 | 1 | - | - | - | 3Byte |
| | - | - | 0 | 1 | 0 | - | - | - | 4Byte |
| | - | - | 0 | 1 | 1 | - | - | - | 5Byte |
| Total Address Cycle Number | 0 | 0 | - | - | - | - | - | - | 5 Cycle |
| | 0 | 1 | - | - | - | - | - | - | 6 Cycle |

R: Reserved Bit

FIG. 11H

<table>
<tr><td>24</td><td>Get_Maximum_cap_info</td><td></td><td>○</td><td>○</td><td>○</td><td></td><td><00h>-(Config:B0h)-(Dummy:4Byte)-<57h>-(B2R)-[Data:4Byte]-[Dummy:1Byte]
<table>
<tr><td colspan="2">Out put</td><td>8</td><td>7</td><td>6</td><td>5</td><td>4</td><td>3</td><td>2</td><td>1</td><td></td></tr>
<tr><td>1st Byte</td><td>Lowest</td><td>1</td><td>1</td><td>1</td><td>0</td><td>0</td><td>0</td><td>1</td><td>0</td><td>E 2</td></tr>
<tr><td>2nd Byte</td><td>2nd</td><td>1</td><td>1</td><td>1</td><td>0</td><td>1</td><td>1</td><td>1</td><td>0</td><td>E E</td></tr>
<tr><td>3rd Byte</td><td>3rd</td><td>0</td><td>0</td><td>0</td><td>0</td><td>1</td><td>0</td><td>1</td><td>1</td><td>0 B</td></tr>
<tr><td>4th Byte</td><td>4th</td><td>0</td><td>0</td><td>0</td><td>0</td><td>0</td><td>0</td><td>0</td><td>0</td><td>0 0</td></tr>
<tr><td>5th Byte</td><td>Highest</td><td>0</td><td>0</td><td>0</td><td>0</td><td>0</td><td>0</td><td>0</td><td>0</td><td>0 0</td></tr>
</table>
EX; 4GByte Drive<br>4GB: 4,000,317,400 Byte ==> 781,870 Unit ==> 00 00 0B EE E2</td></tr>
<tr><td>25</td><td>Get_Pin_info</td><td></td><td>○</td><td>○</td><td>○</td><td></td><td><00h>-(Config:B1h)-(Dummy:4Byte)-<57h>-(B2R)-[Data:1Byte]-[Dummy:4Byte]
<table>
<tr><td colspan="2"></td><td>8</td><td>7</td><td>6</td><td>5</td><td>4</td><td>3</td><td>2</td><td>1</td><td></td></tr>
<tr><td>COME</td><td>Enable</td><td></td><td></td><td></td><td></td><td></td><td></td><td></td><td>1</td><td></td></tr>
<tr><td></td><td>Disable</td><td></td><td></td><td></td><td></td><td></td><td></td><td></td><td>0</td><td></td></tr>
<tr><td>COM0</td><td>Level</td><td></td><td></td><td></td><td></td><td></td><td></td><td>H/L</td><td></td><td></td></tr>
<tr><td>COM1</td><td>Level</td><td></td><td></td><td></td><td></td><td></td><td>H/L</td><td></td><td></td><td></td></tr>
<tr><td colspan="2">Reserved</td><td>R</td><td>R</td><td>R</td><td>R</td><td>R</td><td></td><td></td><td></td><td></td></tr>
</table></td></tr>
<tr><td>26</td><td>Pass through mode commands</td><td></td><td></td><td></td><td></td><td>1</td><td><A6 h>-<59 h>-<99 h></td></tr>
<tr><td>27</td><td>FW_upload_on_MP</td><td></td><td></td><td></td><td></td><td></td><td><A6 h>-<59 h>-<66 h>-(B2R)-<80h>-(Dummy:2Byte)-(code_page:1Byte)-(Dummy:2Byte)-[Data:2112Byte]-<10h>-(B2R)-...</td></tr>
<tr><td>28</td><td>Reading_retry</td><td></td><td>○</td><td>○</td><td>○</td><td></td><td><31 h></td></tr>
</table>

FIG. 11I

| | | | | | | |
|---|---|---|---|---|---|---|
| 29 | Get_VFA_unit | | | | | <00h>-(Config:B5h)-(Dummy:4Byte)-<57h>-(B2R)-[Data:1 Byte] |
| 30 | Get_Transfer_protocol | | | | | <00h>-(Config:B2h)-(Dummy:4Byte)-<57h>-(B2R)-[Data:2 Byte] |

1st byte

| I/O | | | 8 | 7 | 6 | 5 | 4 | 3 | 2 | 1 | Remark |
|---|---|---|---|---|---|---|---|---|---|---|---|
| ECC | No check | | 0 | 0 | - | - | - | - | - | - | |
| | CRC16 Enable | | 0 | 1 | - | - | - | - | - | - | CRC16 check and report |
| | ECC | Check Enable | 1 | 0 | - | | | | | | Error check and report |
| | | Correct Enable | 1 | 1 | - | - | - | - | - | - | Self Error correction and report at writing |
| Transfer Sector Size & Multi Sector | 512Byte & Multiple is 1 | | - | - | 0 | 0 | 0 | 0 | 0 | 1 | |
| | 528Byte & Multiple is 1 | | - | - | 1 | 0 | 0 | 0 | 0 | 1 | |
| | 512Byte & Multiple is 4 | | - | | 0 | 0 | 0 | 0 | 1 | 0 | |
| | 528Byte & Multiple is 4 | | | - | 1 | 0 | 0 | 0 | 1 | 0 | |
| | 512Byte & Multiple is 8 | | - | | 0 | 0 | 0 | 1 | 0 | 0 | |
| | 528Byte & Multiple is 8 | | | - | 1 | 0 | 0 | 1 | 0 | 0 | |

Default value: 11100001 => E1h

2nd Byte

| I/O | | | 8 | 7 | 6 | 5 | 4 | 3 | 2 | 1 | Remark |
|---|---|---|---|---|---|---|---|---|---|---|---|
| Read | Lock like 4Gbit SLC(LB) type | | - | - | - | - | - | - | 0 | 0 | Type A |
| | Optional | With connection command(48h/F8h) | - | - | - | - | - | - | 1 | 0 | Type B |
| | | With Busy state | - | - | - | - | - | - | 1 | 1 | Type C |
| Write | Lock like 4Gbit SLC(LB) type | | - | - | - | - | - | 0 | - | - | Type A |
| | Optional | Without dummy address | - | - | - | - | - | 1 | - | - | Type B |
| Reserved | | | R | R | R | R | R | | | | |

FIG. 11J

| | | | | | | | |
|---|---|---|---|---|---|---|---|
| 31 | Get_minimum_busy_time | | | | | | <00h>-(Config:B4h)-(Dummy:4Byte)-<57h>-(B2R)-[Data:1 Byte] |

| IO | 8 | 7 | 6 | 5 | 4 | 3 | 2 | 1 | |
|---|---|---|---|---|---|---|---|---|---|
| 0ns | 0 | 0 | 0 | 0 | 0 | 0 | 0 | 0 | Best performance mode<br>Default(in LBA-NAND mode) |
| 500ns | 0 | 0 | 0 | 0 | 0 | 0 | 0 | 1 | |
| 1us | 0 | 0 | 0 | 0 | 0 | 0 | 1 | 0 | |
| 2us | 0 | 0 | 0 | 0 | 0 | 1 | 0 | 0 | |
| 3us | 0 | 0 | 0 | 0 | 1 | 0 | 0 | 0 | |
| 5us | 0 | 0 | 0 | 1 | 0 | 0 | 0 | 0 | |
| 10us | 0 | 0 | 1 | 0 | 0 | 0 | 0 | 0 | Default (in PNR) |
| 20us | 0 | 1 | 0 | 0 | 0 | 0 | 0 | 0 | |
| 50us | 1 | 0 | 0 | 0 | 0 | 0 | 0 | 0 | |
| 100us | 1 | 0 | 0 | 0 | 0 | 0 | 0 | 1 | |
| 500us | 1 | 0 | 0 | 0 | 0 | 0 | 1 | 0 | |
| 1ms | 1 | 0 | 0 | 0 | 0 | 1 | 0 | 0 | |

FIG. 12

| | Command name | | valid operation mode: PNR | PNA | VFA | MDA | command priority | Acceptable while Busy | Input command, address, configuration and data: CMD Pre | CMD 1st | SC:L or Configuration | SC:H | SA:L | SA:M | SA:H | In data | CMD 2nd | CMD 3rd | Out Data |
|---|---|---|---|---|---|---|---|---|---|---|---|---|---|---|---|---|---|---|---|
| 1 | Pure NAND read | | o | - | - | - | 1 | - | - | 00 h | Dummy | Dummy | Dummy | Dummy | Dummy | - | 30 h | - | 2112 B |
| 2 | MDA | Read | - | - | - | o | 1 | - | - | 00 h | Low | Hi | Low | Mid | Hi | - | 30 h | - | Data |
| | | write | - | - | - | o | 1 | - | - | 80 h | Low | Hi | Low | Mid | Hi | Data | 10 h | - | - |
| 3 | PNA | Read | - | o | - | - | 1 | - | - | 00 h | Low | Dummy | Low | Dummy | Dummy | - | 30 h | - | 2112Byte |
| | | write | - | o | - | - | 1 | - | - | 80 h | Low | Dummy | Low | Dummy | Dummy | 2112Byte | 10 h | - | - |
| 4 | VFA | Read | - | - | o | - | 1 | - | - | 00 h | Low | Hi | Low | Hi | Dummy | - | 30 h | - | Data |
| | | write | - | - | o | - | 1 | - | - | 80 h | Low | Hi | Low | Hi | Dummy | Data | 10 h | - | - |
| 5 | mode change | | o | o | o | o | 1 | - | - | FCh | - | - | - | - | - | - | - | - | - |
| | | | - | | o | o | 1 | - | - | 60 h | BF h | Dummy | Dummy | - | - | - | D0 h | - | - |
| | | | - | o | | o | 1 | - | - | 00 h | BE h | PW | PW | Dummy | Dummy | - | 57 h | - | - |
| 6 | NOP | (There is an exception.) | - | o | o | o | 1 | - | - | 60 h | Dummy | Dummy | Dummy | - | - | - | D0 h | - | - |
| | | | | | | | | - | - | FF h | - | - | - | - | - | - | - | - | - |
| 7 | Command_911 | | - | o | o | o | 1 | - | FE h | 00 h | FD h | Dummy | Dummy | Dummy | Dummy | - | 57 h | - | - |
| 8 | BUSY to READY | | - | o | o | o | 1 | - | - | FE h | - | - | - | - | - | - | - | - | - |
| 9 | ID read | 1st | o | o | o | o | 1 | - | - | 90 h | 00 h | - | - | - | - | - | - | - | 5 Byte |
| | | 2nd | o | o | o | o | 1 | - | - | 92 h | 00 h | - | - | - | - | - | - | - | 6 Byte |
| 10 | Status read | Status read1 | - | o | o | o | 1 | - | - | 70 h | - | - | - | - | - | - | - | - | 1 Byte |
| | | Status read2 | - | o | o | o | 1 | - | - | 71 h | - | - | - | - | - | - | - | - | 1 Byte |
| 11 | Set_Password | | - | - | o | | - | - | - | 00 h | 21 h | Old:L | Old:H | New:L | New:H | - | 57 h | - | - |
| 12 | Set_VFA_Unit | | - | - | o | | - | - | - | 00 h | A5 h | Blks | Dummy | Dummy | Dummy | - | 57 h | - | - |
| 13 | Reset series | Exe_FW update from host | - | - | o | - | 1 | - | - | FA h | - | - | - | - | - | - | - | - | - |
| | | Address Reset | o | - | - | - | 1 | - | - | FF h | - | - | - | - | - | - | - | - | - |
| | | FW reload from flash memory | - | o | o | o | 1 | - | - | FD h | - | - | - | - | - | - | - | - | - |
| 14 | Termination R/W | | - | o | o | o | 1 | o | - | FB h | - | - | - | - | - | - | - | - | - |
| 15 | Send_FW_update_from_host | | - | - | o | - | 1 | - | 1st | 00 h | 53 h | PW:L | PW:H | 55 h | AA h | | 57 h | - | - |
| | | | | | | | | | 2nd | 80 h | Dummy | Dummy | Page | Dummy | Dummy | 2112 B | 10 h | - | - |
| 16 | Exe_Data_refresh | | - | - | o | - | 2 | - | - | 00 h | 5A h | 55 h | AAh | 55 h | AA h | - | 57 h | - | - |
| 17 | Exe_Security_Erase_Unit | | - | - | o | - | 2 | - | - | 00 h | 55 h | 55 h | AAh | 55 h | AA h | - | 57 h | - | - |
| 18 | Exe_Flush_Cache | | - | o | o | o | 1 | - | - | F9h | - | - | - | - | - | - | - | - | - |
| 19 | Set_Transfer_protocol | | - | - | o | - | 1 | - | - | 00 h | A2 h | Data | Data | Reserved | Reserved | - | 57 h | - | - |
| 20 | Set_Minimum_busy_time | | - | - | o | - | 1 | - | - | 00 h | A4 h | Data | Dummy | Dummy | Dummy | - | 57 h | - | - |
| 21 | Set_Power_Save_mode | | - | - | - | o | 1 | - | - | 00 h | BB h | Dummy | Dummy | Dummy | Dummy | - | 57 h | - | - |
| 22 | Exit_Power_Save_mode | | - | - | - | o | 1 | - | - | 00 h | BA h | Dummy | Dummy | Dummy | Dummy | - | 57 h | - | - |
| 23 | Get_Address_info | | - | o | o | o | 1 | - | - | 00 h | BC h | Dummy | Dummy | Dummy | Dummy | - | 57 h | - | 5Byte |
| 24 | Get_Maximum_cap_info | | - | o | o | o | 1 | - | - | 00 h | B0 h | Dummy | Dummy | Dummy | Dummy | - | 57 h | - | 5Byte |
| 25 | Get_Pin_info | | - | o | o | o | 1 | - | - | 00 h | B1 h | Dummy | Dummy | Dummy | Dummy | - | 57 h | - | 5Byte |
| 26 | Pass through mode | | | | ? | | 1 | - | - | A6h | - | - | - | - | - | - | 59 h | 99 h | - |
| 27 | FW_upload_on_MP | | o | - | - | - | 1 | - | 1st | A6 h | - | - | - | - | - | - | 59 h | 66 h | - |
| | | | | | | | | | 2nd | 80 h | Dummy | Dummy | Page | Dummy | Dummy | 2112 B | 10 h | - | - |
| 28 | Reading_retry | | - | o | o | o | 1 | | | 31h | - | - | - | - | - | - | - | - | Data |
| 29 | Get_VFA_Unit | | - | o | o | o | 1 | | - | 00 h | B5 h | Dummy | Dummy | Dummy | Dummy | - | 57 h | - | 1Byte |
| 30 | Get_Transfer_Protocol | | - | o | o | o | 1 | | - | 00 h | B2 h | Dummy | Dummy | Dummy | Dummy | - | 57 h | - | 5Byte |
| 31 | Get_minimum_busy_time | | - | o | o | o | 1 | | - | 00 h | B4 h | Dummy | Dummy | Dummy | Dummy | - | 57 h | - | 1Byte |

OCT data bit assignment (Example) 8 0

Serial Data Input: 80h

| I/O | 8 | 7 | 6 | 5 | 4 | 3 | 2 | 1 |
|---|---|---|---|---|---|---|---|---|
| | 1 | 0 | 0 | 0 | 0 | 0 | 0 | 0 |

Address Input Cycle Timing Diagram

Address Input Cycle Timing Diagram
for Peak Current Reducing mode

FIG. 24

Summary of PNR mode selection

| | | Only PNR | | | | | | PNR with SPI |
|---|---|---|---|---|---|---|---|---|
| Signals | COME | L | H | | Open | Any value | Any value | H |
| | COM0 | Don't care | H | L | Any value | Open | Any value | H |
| | COM1 | Don't care | H | L | Any value | Any value | Open | L |
| Operation mode | PNR | available | available | available | available | | | available |
| | SPI | Not service | Not service | Not service | Not service | | | available |

PNR with Error check (1-1)

PNR with Error check (1-3)

PNR with Error check (1-4)

MDA Reading with Default Read Type (1 Sector)

MDA Reading with Default Read Type (64K Sectors)

MDA Reading with Optional Read Type B (1)

MDA Reading with Optional Read Type B (2)

MDA Reading with Optional Read Type B (4)

MDA Reading , Illegal Command Case (2)

MDA Writing (1 Sector)

MDA Writing (256 Sectors)

MDA Writing (64K Sectors)

MDA Writing interrupted by Termination Command

MDA Writing with Error Recovery

FIG. 52

| | Description | I/O8 | I/O7 | I/O6 | I/O5 | I/O4 | I/O3 | I/O2 | I/O1 |
|---|---|---|---|---|---|---|---|---|---|
| 1 | Pass | 1 | x | x | x | x | 0 | 0 | 0 |
| 2 | ECC/CRC16 uncorrectable error | 1 | x | x | x | x | 1 | 1 | 1 |
| 3 | ECC correctable error | 1 | x | x | x | x | 1 | 0 | 0 |
| 4 | Writing fail | 1 | x | x | x | x | 0 | 1 | 1 |

Res: set 0

MDA Writing with Optional Write Type

PNA Reading with Default Read Type (1 Sector)

PNA Reading interrupted by Termination Command

PNA Reading with Optional Read Type B (1)

PNA Reading with Optional Read Type B (2)

PNA Reading with Optional Read Type B (3)

PNA Reading with Optional Read Type B (4)

PNA Reading with Optional Read Type C (1)

PNA Reading with Optional Read Type C (3)

PNA Writing interrupted by Termination Command

PNA Writing with Optional Write Type

VFA Reading with Default Read Type

VFA Reading interrupted by Termination Command

VFA Reading with Optional Read Type B (1)

VFA Reading with Optional Read Type B (2)

VFA Reading with Optional Read Type B (4)

VFA Reading with Optional Read Type C (2)

VFA Writing with Optional Write Type

PNR Mode

PNA Mode, VFA Mode, MDA Mode reading

PNA Mode, VFA Mode, MDA Mode writing

1) Type A (Manner: Repetition of Large Block Type NAND Flash page read sequence)

FIG. 124

<Under Pure NAND Read Mode (Emulation on conventional NAND Flash Status Read <70h>)>

| Description | | I/O8 | I/O7 | I/O6 | I/O5 | I/O4 | I/O3 | I/O2 | I/O1 | Remark |
|---|---|---|---|---|---|---|---|---|---|---|
| Don't Care | | x(Note1) | | | x | x | X | x | x | |
| Ready/Busy | Busy | | 0 | 0 | | | | | | |
| | Ready | | 1 | 1 | | | | | | |

FIG. 125

<at VFA/MDA >

| Description | | I/O8 | I/O7 | I/O6 | I/O5 | I/O4 | I/O3 | I/O2 | I/O1 | Remark |
|---|---|---|---|---|---|---|---|---|---|---|
| Fail with Summary Fail | No Fail up to now | | | | | | | | 0 | |
| | Fail detected | | | | | | | | 1 | Note1 |
| Don't Care | | x | | | x | x | | x | | |
| Transfer Error | Pass | | | | | | 0 | | | |
| | Fail | | | | | | 1 | | | Note2 |
| New Command Start | Busy | | | 0 | | | | | | Note3 |
| | Ready | | | 1 | | | | | | |
| Ready/Busy | Busy | | 0 | | | | | | | Same as Ready/Busy signal behavior. |
| | Ready | | 1 | | | | | | | |

FIG. 126

< At Boot Code Maintenance>

| Description | | I/O8 | I/O7 | I/O6 | I/O5 | I/O4 | I/O3 | I/O2 | I/O1 | Remark |
|---|---|---|---|---|---|---|---|---|---|---|
| Fail | No Fail | | | | | | | | 0 | |
| | Fail detected | | | | | | | | 1 | Note1 |
| Don't Care | | x | | | x | x | x | x | | |
| Ready/Busy | Busy | | 0 | 0 | | | | | | |
| | Ready | | 1 | 1 | | | | | | |

NONVOLATILE MEMORY SYSTEM, AND DATA READ/WRITE METHOD FOR NONVOLATILE MEMORY SYSTEM

FIELD OF THE INVENTION

The present invention relates to a nonvolatile memory system including a nonvolatile memory and a memory controller operative to execute a read/write control for the memory, and a data read/write method of nonvolatile memory system.

DESCRIPTION OF THE RELATED ART

A NAND-type flash memory has been known as one of electrically erasable programmable nonvolatile semiconductor memories (EEPROM). The NAND-type flash memory is smaller in unit cell area than the NOR type and easy to achieve mass storage. A read/write speed per cell is slower than the NOR type though a cell range (physical page length) effective to execute read/write operations simultaneously between a cell array and a page buffer can be enlarged to substantially achieve a fast read/write operation.

With the effective use of such the properties, the NAND-type flash memory has been employed in various record media including a file memory and a memory card.

In the memory card and the like, a nonvolatile memory and a memory controller are packaged together to execute a read/write control for the nonvolatile memory in accordance with a command and a logical address fed from a host. For example, a logical address and a sector count are fed from the host to read data from plural sectors as proposed (JP 2006/155335 A).

DISCLOSURE OF THE INVENTION

In one aspect the present invention provides a nonvolatile memory system connectable to a host device. The system comprises a nonvolatile memory having a plurality of data areas; and a memory controller operative to control read and write operations to the nonvolatile memory. The memory controller successively executes read/write operations to plural sectors within a selected data area in the nonvolatile memory in accordance with a command, a sector count and sector address fed from a host device.

In one aspect the present invention provides a data read/write method for nonvolatile memory system connectable to a host device. The system comprises a nonvolatile memory having a plurality of data areas and a memory controller operative to control read and write operations to the nonvolatile memory. The method comprises: providing a command, a sector count and sector address from a host device; and successively executing read/write to plural sectors within a selected data area in the nonvolatile memory in accordance with a command, a sector count and sector address under a control of the memory controller.

BRIEF DESCRIPTION OF THE DRAWINGS

FIG. 5 is a diagram illustrative of pin names and functions of the LBA-NAND memory.

FIG. 6 is a diagram illustrative of system data recorded in the LBA-NAND memory.

FIG. 7 is a diagram illustrative of operation modes of the LBA-NAND memory together with commands.

FIG. 10 is a diagram illustrative of a data structure in the LBA-NAND memory.

FIG. 11A is a diagram illustrative of a command configuration for the LBA-NAND memory (Part 1).

FIG. 11B is a diagram illustrative of a command configuration for the LBA-NAND memory (Part 2).

FIG. 11C is a diagram illustrative of a command configuration for the LBA-NAND memory (Part 3).

FIG. 11D is a diagram illustrative of a command configuration for the LBA-NAND memory (Part 4).

FIG. 11E is a diagram illustrative of a command configuration for the LBA-NAND memory (Part 5).

FIG. 11F is a diagram illustrative of a command configuration for the LBA-NAND memory (Part 6).

FIG. 11G is a diagram illustrative of a command configuration for the LBA-NAND memory (Part 7).

FIG. 11H is a diagram illustrative of a command configuration for the LBA-NAND memory (Part 8).

FIG. 11I is a diagram illustrative of a command configuration for the LBA-NAND memory (Part 9).

FIG. 11J is a diagram illustrative of a command configuration for the LBA-NAND memory (Part 10).

FIG. 12 is a command list for the LBA-NAND memory.

FIG. 24 is a diagram illustrative of an example of selection from a PNR mode and a serial-EEP mode using common pins.

FIG. 52 is a diagram illustrative of types of write errors on MDA mode write.

FIG. 111 is a timing diagram of a power save mode setting command.

FIG. 112 is a timing diagram of read to which a power save mode setting command is applied.

FIG. 113 is a timing diagram of command latch to which a power save mode setting command is applied.

FIG. 114 is a timing diagram of a power save mode exit command.

FIG. 115 is a timing diagram of an address information acquisition command.

FIG. 116 is a timing diagram of a maximum capacity information acquisition command.

FIG. 117 is a timing diagram of a pin information acquisition command.

FIG. 118 is a timing diagram of read in association with a read retry command.

FIG. 119 is a timing diagram of sector read type A accompanied by a status information read.

FIG. 120 is a timing diagram of sector read type B accompanied by a status information read.

FIG. 121 is a timing diagram of sector read type C accompanied by a status information read.

FIG. 122 is a timing diagram of the sector write type A accompanied by a status information read.

Figure 123:
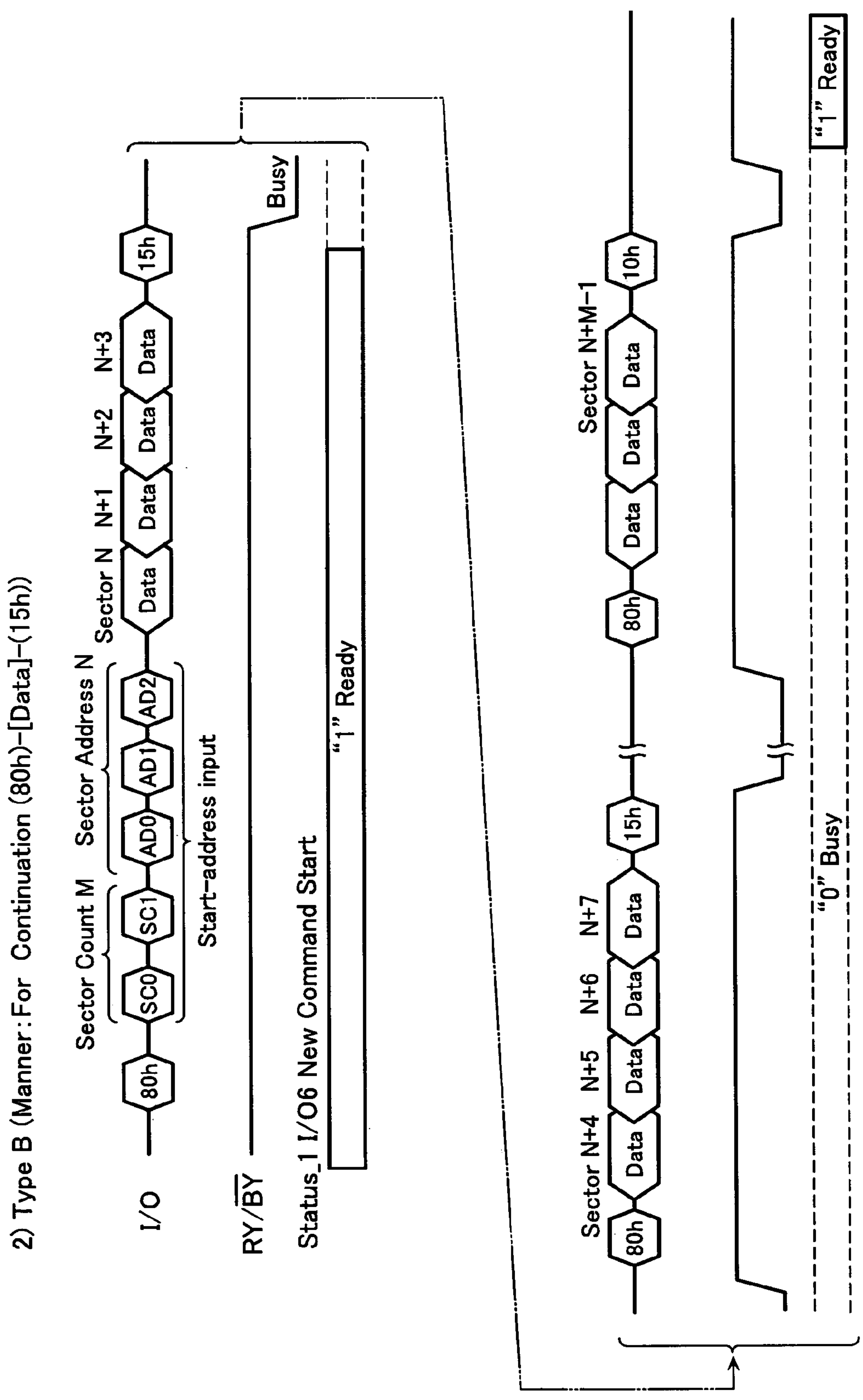

FIG. 123 is a timing diagram of the sector write type B accompanied by a status information read.

FIG. 124 is a figure for explaining an operation of the status information read under a PNR mode.

FIG. 125 is a figure for explaining an operation of the status information read under a VFA/MDA mode.

FIG. 126 is a figure for explaining an operation of the status information read under a boot code maintenance mode.

Figure 127:
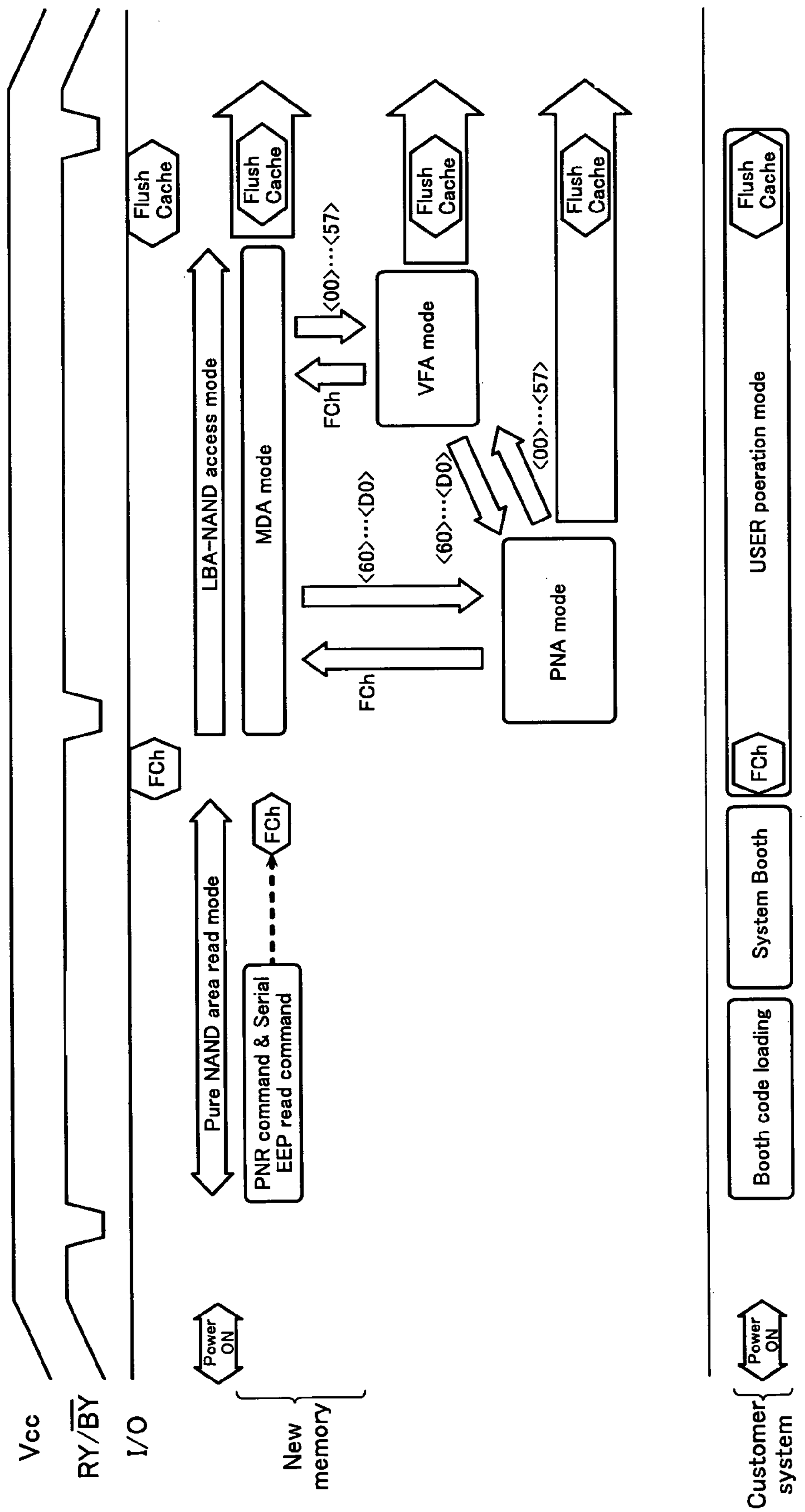

FIG. 127 is a figure showing each operational mode of a LBA-NAND memory, and a wave-mode switching collectively.

The embodiments of the invention will now be described with reference to the drawings.

[Memory System Overview]

A nonvolatile memory system of this embodiment is configured in a memory module, which comprises a single or plurality of NAND-type flash memories and a memory controller operative to execute a read/write control for the memory. All flash memories mounted can be controlled from a single memory controller as a logical memory, which is hereinafter referred to as a Logical Block Address NAND flash memory (hereinafter abbreviated as a LBA-NAND memory).

A LBA-NAND memory has a plurality of data areas (logical block access areas) changeable in accordance with a command. Specifically, this embodiment includes the following three data areas, which are divided on the basis of the uses and the reliability of data.

(1) A program area for vender applications, "Vender Application Firmware Area", which is hereinafter referred to as a "VFA" area.

(2) A program area for end user applications, "Music Data Area", which is hereinafter referred to as a "MDA" area.

(3) A system data record area for recording boot data of a host system, "Pure NAND Area" except for the VFA and MDA areas, which is hereinafter referred to as a "PNA" area.

The PNA area is given a normal access mode for execution of read/write operations in accordance with input commands and addresses (hereinafter referred to as a "PNA" mode) and additionally two read only modes to be set at the time of power-on.

One is a read mode that is set with the input of a first PNA read mode command after power-on. This is hereinafter referred to as a "PNR (Pure NAND Read)" mode.

Another is a read mode that is set with the input of a second PNA read mode command after power-on for serial read in a SPI (Serial Peripheral Interface) mode in synchronization with an external clock. This is hereinafter referred to as a "Serial-EEP" mode.

These two read modes are the same with respect to reading system data required for read/write operations to the LBA-NAND memory and boot data of the host itself from the LBA-NAND memory. Therefore, the PNR mode may be interpreted as that containing both in a broad sense and the Serial-EEP mode may be regarded as a special mode among the PNR mode.

The system data (firmware FW) and boot data required for the memory controller are automatically read from the flash memory and transferred to a data register (buffer RAM) in an initialization operation automatically executed after power-on (power-on initial setup operation). This read control is executed, for example, at a hardware sequencer prepared in the memory controller.

When the host enters a command on elapse of a certain time after power-on, the PNR mode or the Serial-EEP mode is established to read out the system data set in the data register of the LBA-NAND memory. The memory controller can be booted after data is read into the PNR area in the host (or in parallel with this).

Aside from the read mode for the PNR area at the time of power-on, modes for read and write accesses to the PNA, MDA and VFA areas can be established in accordance with commands. Hereinafter, these are referred to as a PNA access mode, a MDA access mode and a VFA access mode.

In the application program areas, or VFA and MDA areas, the data transfer unit of read/write access is a sector (512 Bytes or 528 Bytes), and the data transfer format is a SSFDC (Solid State Floppy Disk Card) format. The LBA-NAND memory uses sector multiples to select the number of sectors accessible at a time using an access command. A user can select among sector multiples of 1, 4 and 8, for example.

The use of a sector count enables many successive sectors to be accessed per one command. In a word, together with the command, the host device supplies a sector count indicative of the quantity of data and a sector address (logical address) initial value such that data can be successively read from or written into plural sectors defined thereby.

Specifically, an address input is composed of 5 Bytes, of which the first half, 2 Bytes, is assigned to a sector count and the second half, 3 Bytes, is assigned to a sector address. This access mode allows the sector count and the sector address to be identified using an address condition ID command. The number of bytes of the address input is made extensible.

A mode change command is entered to change the mode of the LBA-NAND memory. In a word, the PNR mode or the Serial-EEP mode at the time of power-on is changed to the MDA access mode with the input of a special command. Further, the input of a special change command changes among the PNR mode, the VFA access mode and the MDA access mode.

An internal chip enable signal /CE is created at the memory controller. Each flash memory check is controlled using this signal.

An erase command and a reset command to the LBA-NAND memory are NOP. On issue of this command, the control executes nothing and returns Ready to the host.

[LBA-NAND Memory Configuration]

Figure 1:
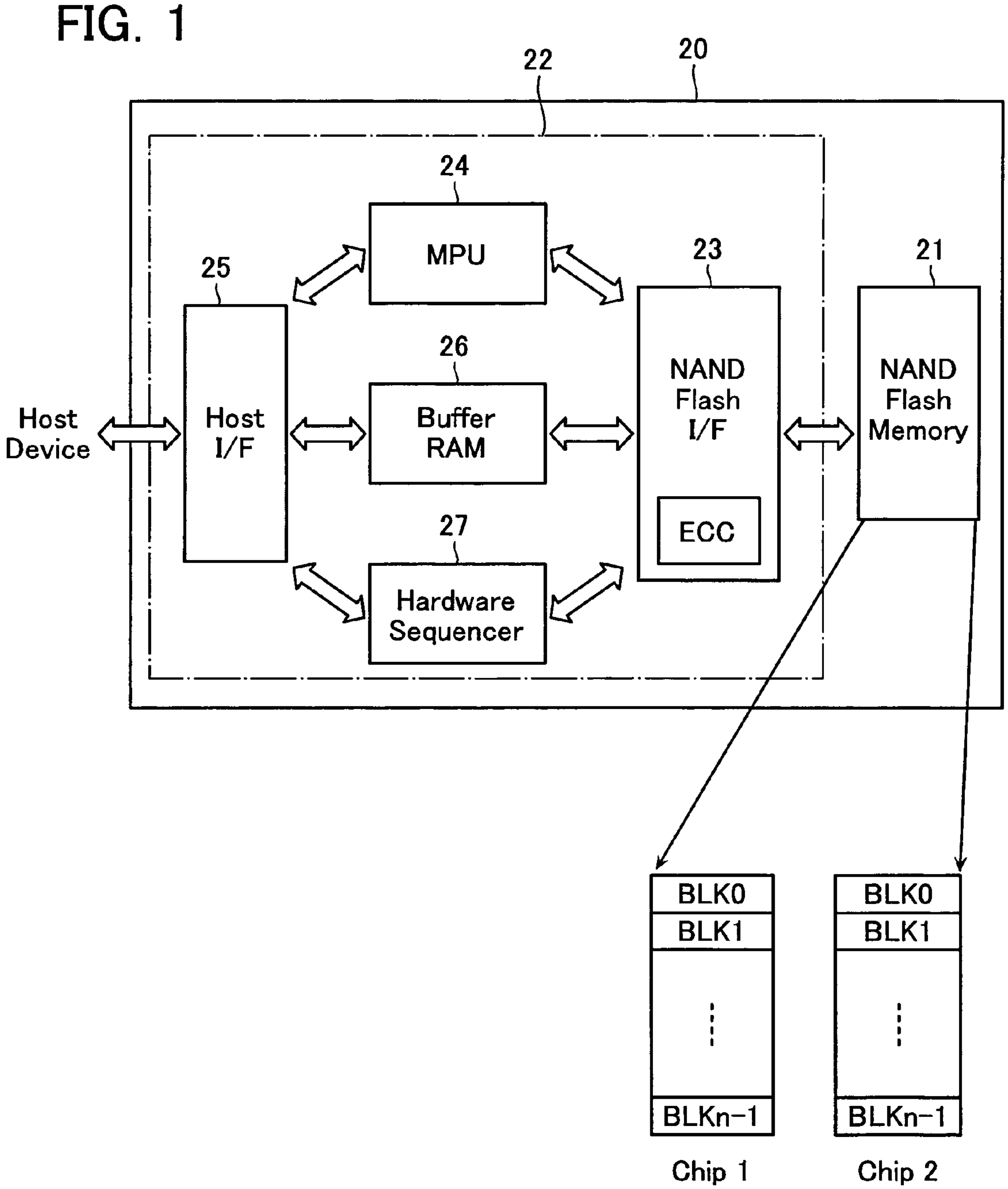
FIG. 1 is a diagram illustrative of an LBA-NAND memory system configuration according to an embodiment of the invention.

FIG. 1 shows a configuration of a nonvolatile memory system, or an LBA-NAND memory 20, according to an embodiment. This memory 20 comprises a NAND-type flash memory chip 21 and a memory controller 22 operative to execute a read/write control for the memory, which are both packaged integrally.

The flash memory chip 21 may include a plurality of memory chips. FIG. 1 shows two memory chips Chip 1, Chip 2, which can be controlled from the single memory controller 22 also in this case. The maximum mountable number of memory chips can be determined from the electric current ability of a regulator and other factors and may be 4 chips, for example.

The memory controller 22 is a one-chip controller, which includes a NAND flash interface 23 for processing data transfer to/from the flash memory chip 21; a host interface 25 for processing data transfer to/from a host device; a buffer RAM 26 operative to temporarily hold read/write data and so forth; a MPU 24 operative to execute a data transfer control; and a hardware sequencer 27 for use in a read/write sequence control and so forth for a firmware (FW) in the NAND-type flash memory 21.

Figure 2:
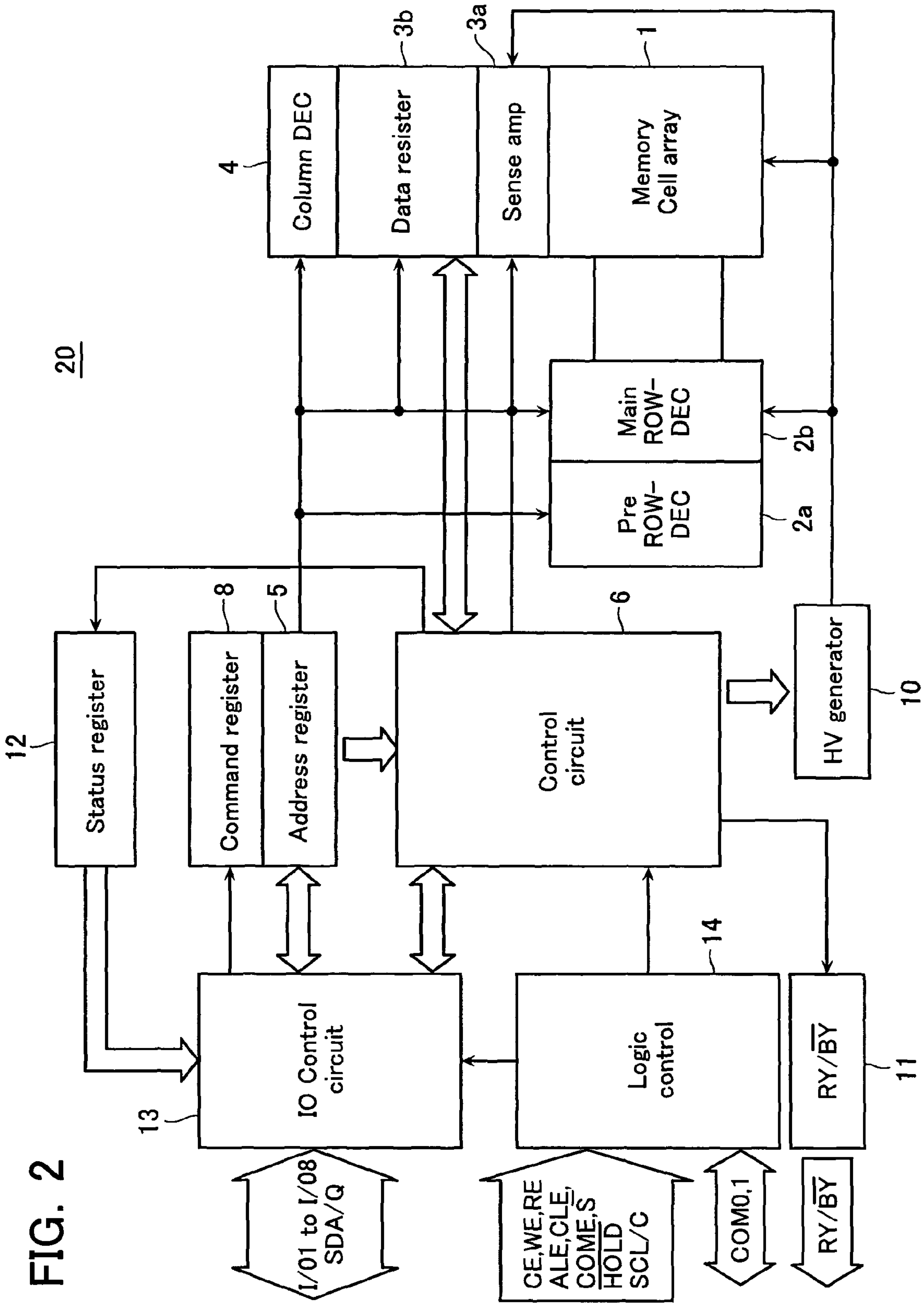
FIG. 2 is a diagram illustrative of a functional block of the LBA-NAND memory.
Figure 3:
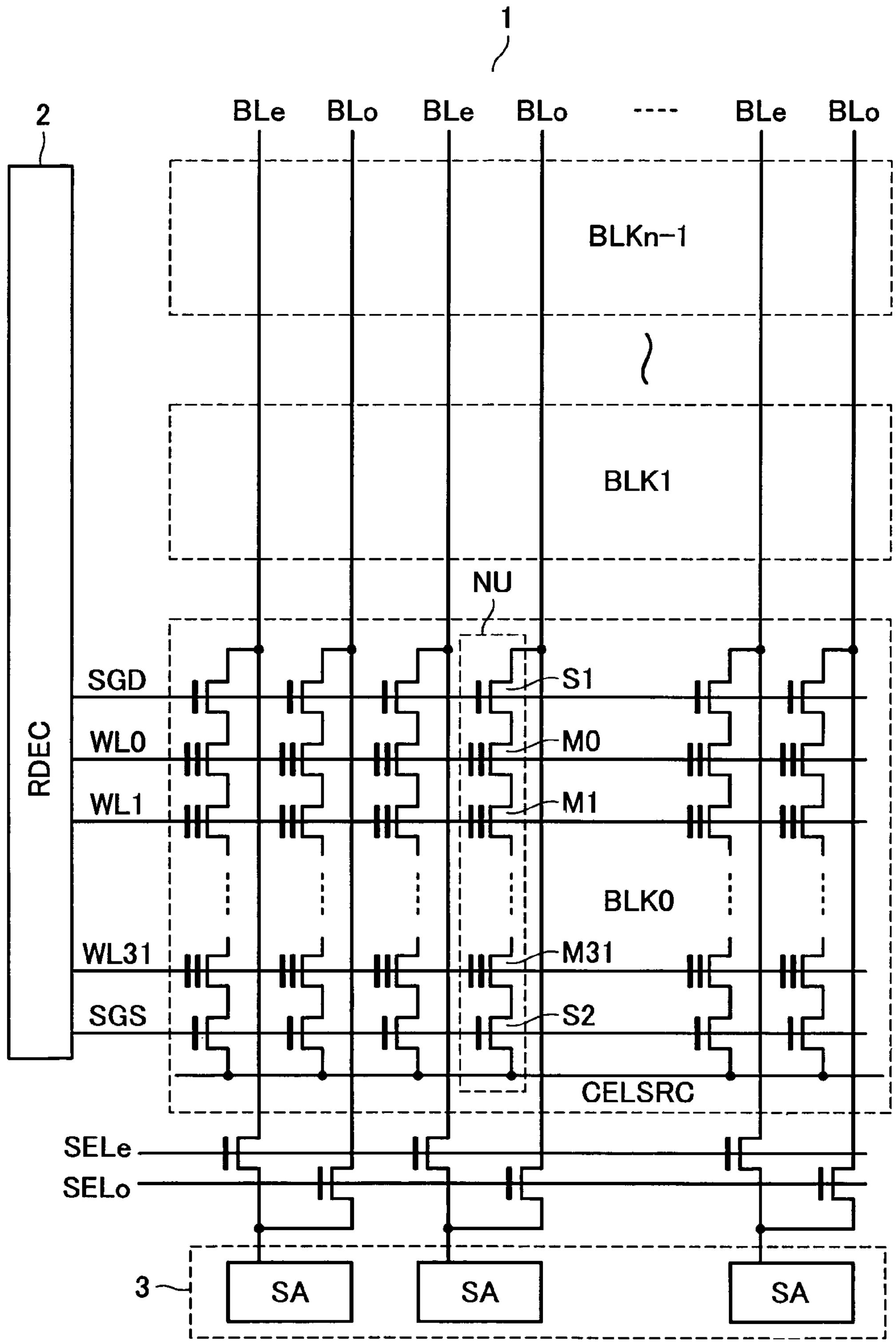
FIG. 3 is a diagram illustrative of a memory cell array configuration in the LBA-NAND memory.

That the memory chip 21 and the memory controller 22 are composed of different chips is not essential for this LBA-NAND memory system. FIG. 2 shows a functional block configuration of the LBA-NAND memory 20 of FIG. 1 where logic control of the memory chip 21 and the memory controller 22 are viewed together. FIG. 3 shows a cell array configuration of a memory core thereof.

A memory cell array 1 comprises a plurality of electrically erasable programmable nonvolatile semiconductor memory cells (32 memory cells in the shown example) M0-M31 serially connected to form one of NAND cell units (NAND strings) NU arrayed as shown in FIG. 3.

The NAND cell unit NU has one end connected to bit lines BLo, BLe via a selection gate transistor S1 and the other end connected to a common source line CELSRC via a selection gate transistor S2. The memory cells M0-M31 have control gates connected to word lines WL0-WL31, respectively. The selection gate transistors S1, S2 have gates connected to selection gate lines SGD, SGS.

A set of NAND cell units arrayed along the word line configures a data erase minimum unit, or a block, and plural such blocks BLK0-BLKn−1 are arranged along the bit line as shown.

A sense amp circuit 3 is arranged at one end of the bit lines BLo, BLe to serve cell data read and write operations. A row decoder 2 is arranged at one end of the word line to selectively drive the word lines and the selection gate lines. In the shown case, an even bit line BLe and an adjacent odd bit line BLo are selectively connected through a bit line selector to each sense amp SA in the sense amp circuit 3.

A command, an address and data are entered through an input controller 13. A chip enable signal /CE, a write enable signal /WE, a read enable signal /RE and other external control signals are entered into a logic circuit 14 for use in timing control. The command is decoded at a command decoder 8.

A controller 6 is operative to execute a control of data transfer and a sequence control of write/erase/read. A status register 11 is operative to provide a Ready/Busy terminal with the Ready/Busy status of the LBA-NAND memory 20. Aside from this, a status register 12 is prepared to inform the host of the status of the memory 20 (Pass/Fail, Ready/Busy and so forth) via I/O ports.

The address is transferred via an address register 5 to the row decoder 2 (including a pre-row decoder 2a and a main row decoder 2b) and a column decoder 4. The write data is loaded via an I/O control circuit 7 and via a control circuit 6 into the sense amp circuit 3 (including a sense amp 3a and a data register 3b). The read data is provided to external via the control circuit 6 and the I/O control circuit 7.

A high-voltage generator 10 is provided to generate high voltages required in accordance with different operation modes. The high-voltage generator 10 generates a certain high voltage based on an instruction given from the control circuit 6.

Figure 4:
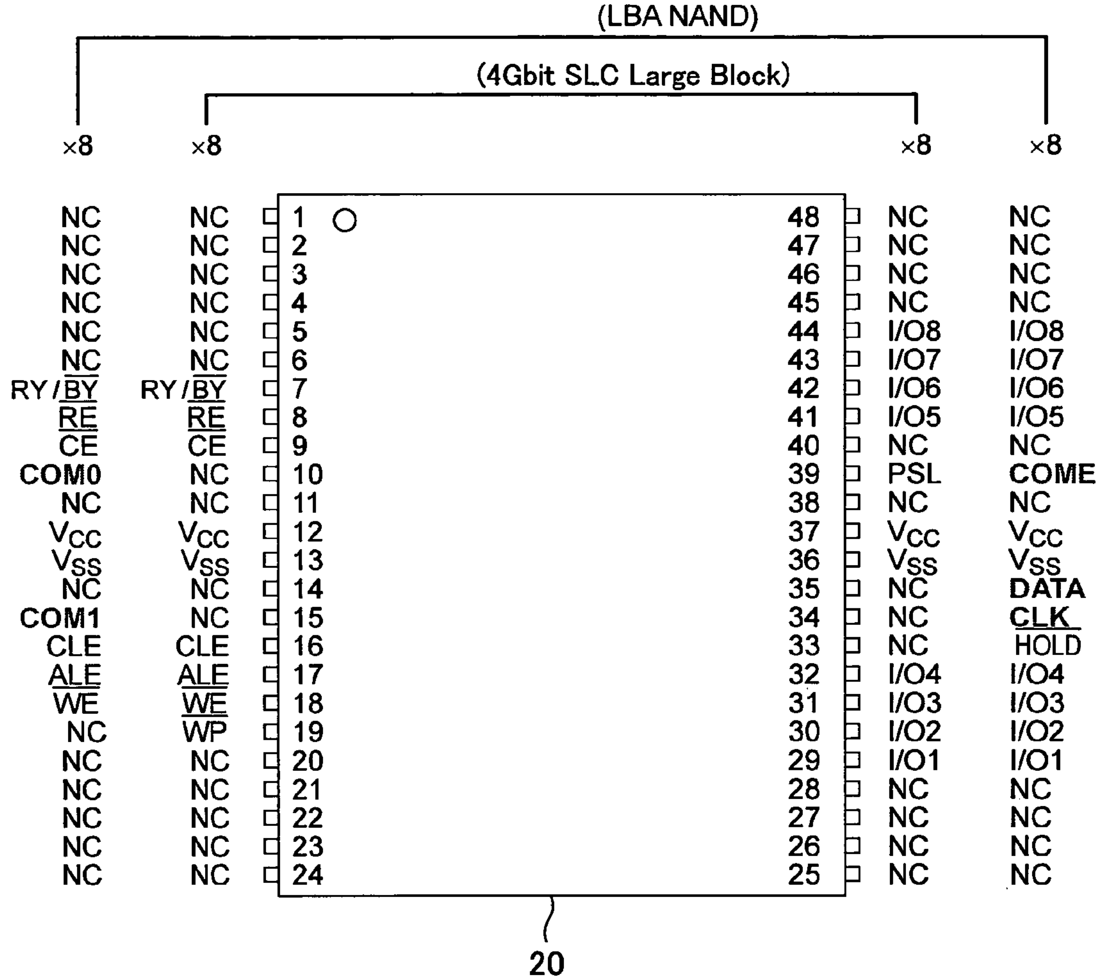
FIG. 4 is a diagram illustrative of a pin arrangement in the LBA-NAND memory.

FIG. 4 shows a package pin arrangement in the LBA-NAND memory of this embodiment, and FIG. 5 shows pin names and functions in summary. These figures show a package pin arrangement in a conventional NAND-type flash memory (4 Gbit SLC Large Block) together for comparison.

Input/output ports I/O1-I/O8 are employed for input/output of a command, an address and data on a Byte basis. External control signal terminals may include terminals for a chip enable signal /CE, a write enable signal /WE, a read enable signal /RE, a command latch enable signal CLE, and an address latch enable signal ALE.

An I/O signal is an address, data or command signal. The command latch enable (CLE) signal is a signal to control taking an operation command in the LBA-NAND memory. When this signal is set at "H" level in response to the rise or fall of the write enable (/WE) signal, data on the input/output ports I/O0-I/O7 can be taken in the LBA-NAND memory as command data.

The address latch enable (ALE) signal is a signal to control taking address data in the LBA-NAND memory. When this signal is set at "H" level in response to the rise or fall of the write enable (/WE) signal, data on the input/output ports I/O0-I/O7 can be taken in the LBA-NAND memory as address data.

The chip enable (/CE) signal is a device selection signal and this signal establishes a low power standby mode when set at "H" level in Ready state.

The write enable (/WE) signal is a signal to take data from the input/output ports I/O0-I/O7 into the device.

The read enable (/RE) signal is a signal to allow the input/output ports I/O0-I/O7 to provide data serially to external.

The memory of this embodiment has the same signal terminal arrangement as in a conventional NAND-type flash memory seen from the host device, and can be handled like the conventional NAND-type flash memory as one characteristic. In other words, the host interface 25 shown in FIG. 1 has an electric configuration equivalent to the NAND flash interface 23.

Therefore, except that the address supplied from the host is not a physical address on the NAND-type flash memory 21 but a logical address, it can be handled like the conventional NAND-type flash memory. The logical address supplied from the host is subjected to address conversion at the MPU 24 to access the NAND-type flash memory 21.

"DATA" and "CLK" are data and clock terminals for use in operation of the LBA-NAND memory 20 in the Serial-EEP mode, and "/HOLD" is a pause terminal thereof.

Custom control pins "COM0", "COM1" and "COME" are prepared for use in requests for current information on a device and for a special data input/output.

FIG. 6 shows a recorded state of system data (including boot data) of the host system to be recorded in the PNA area. This system data is recorded in the leading block BLK0 in the flash memory chip 21. The system data is required to have high reliability and thus the following consideration is given in particular.

Among the word lines WL0-WL31 in a block, at least the word lines WL0, WL31 at both ends are not employed because a cell adjacent to the selection gate transistor has a larger write disturbance than other cells have. Alternatively, much higher data reliability can be ensured through the use of the word lines every other line or every several lines.

The cell array has simultaneous read/write ranges such as an even page selected using an even bit line BLe and one word line and an odd page selected using an odd bit line BLo and one word line. The system data is only recorded in one of the pages (an even page in this example). The use of the bit line per every several lines is also effective to further enhance the reliability.

As the minimum process dimension (design rule) is made smaller, the interference between adjacent cells causes a larger data fluctuation. Thus, this embodiment ensures the reliability of the system data through the use of only an even page or an odd page.

For example, if the LBA-NAND memory is a multivalue memory capable of storing data of 2 bits (4 values) in one memory cell, 2 page addresses, or an upper page and a lower page, are assigned to the 2 bits. Even when the LBA-NAND memory is used to store a multivalue in this way, a binary storage scheme using only the lower page is preferably applied for the system data part that is required to have higher reliability.

As shown in FIG. 6, only the lower page of the even page is used for the system data part.

The output of the system data in the Serial-EEP mode is executed in the form of data that includes a redundant area. If a data error of certain symbols occurs at the time of read, the data is replaced with a spare block. If a data error of 8 or more symbols occurs, uncorrected data is output as it is and a read error is displayed on the status.

[System Overview and Mode Change]

FIG. 7 shows a system overview of the LBA-NAND memory in summary. As described above, this memory has three data areas, or PNA, VFA and MDA areas, and additionally has a controller system area. This controller system area is an area in which firmware (FW) of the memory controller in the LBA-NAND memory is stored.

As the "Pure NAND" mode, there is a PNR mode, which is a read mode for the PNA area established at the time of power-on. The PNR mode is established using a command <00h>-<Add>-<30h>. In this case, the address <Add> is a dummy address.

In this example, <h> in the command denotes a hexadecimal number. In practice, a signal of 8 bits "00000000" is given in parallel to 8 input/output ports I/O0-I/O7.

Examples of the "LBA-NAND" mode include a PNA access mode, a VFA access mode and a MDA access mode for use in read/write accesses to the PNA, VFA and MDA areas, respectively.

Figure 8:
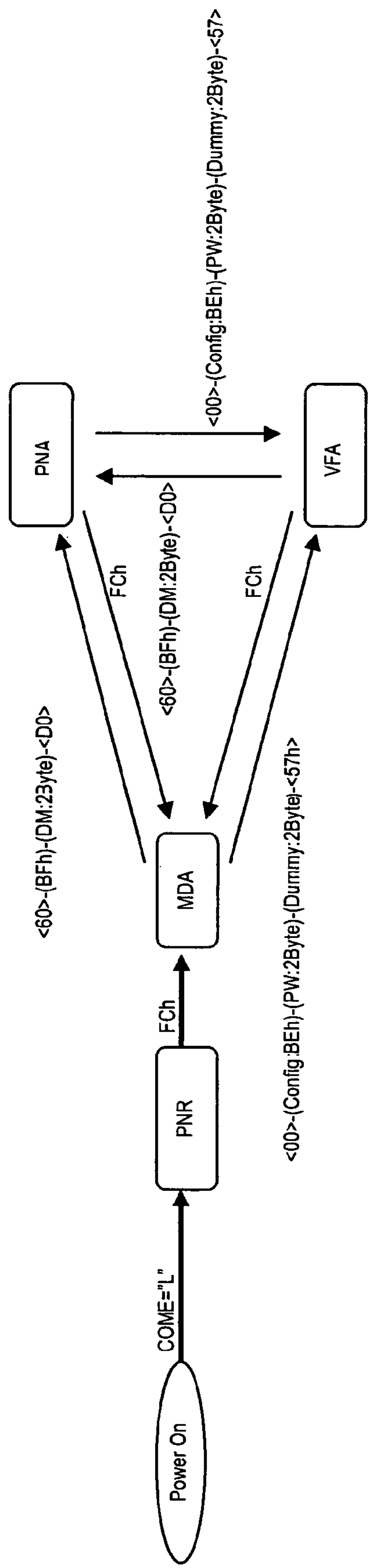
FIG. 8 is a diagram illustrative of an example of switching among operation modes of the LBA-NAND memory.
Figure 9:
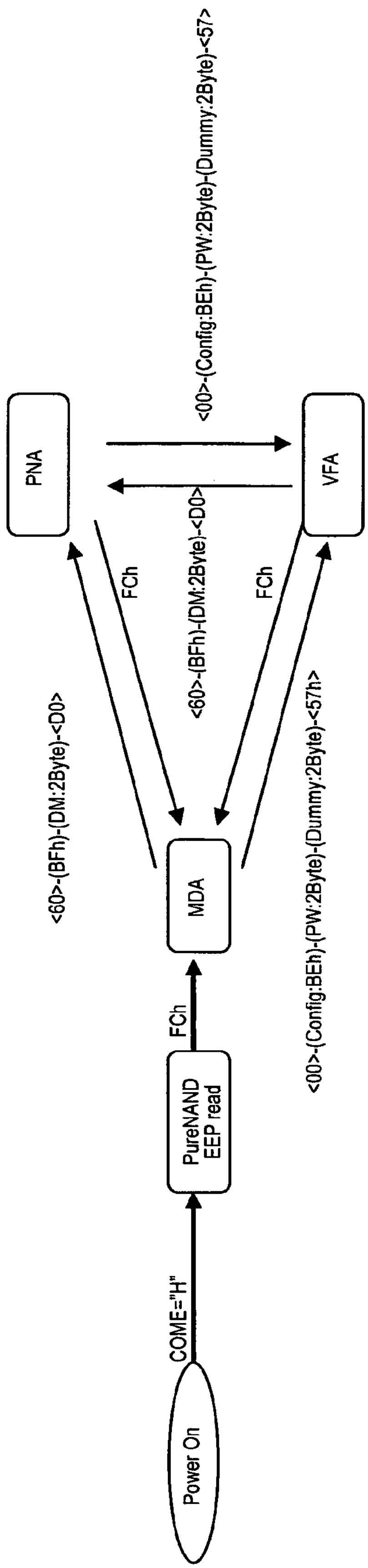
FIG. 9 is a diagram illustrative of another example of switching among operation modes of the LBA-NAND memory.

Changing among the PNR mode, the PNA access mode, the VFA access mode and the MDA access mode is executed using commands. FIGS. 8 and 9 show two mode change diagrams.

As shown in FIG. 8, with COME="L" (or COME="H") and the PNR mode command <00h>-<Add>-<30h>, the PNR mode is established after power-on. After completion of a job in the PNR mode, the input of a command <FCh> causes a transition to the MDA access mode.

Thereafter, the input of a change command makes it possible to change among access modes PNA-MDA-VFA.

As shown in FIG. 9, with COME="H", COM0="H" and COM1="L", the Serial-EEP mode is established after power-on. The Serial-EEP mode is a mode in which data readable in PNR is provided to external also through a Serial EEP interface. As the Serial EEP interface, the SPI interface may be adopted.

Also in this case, after completion of a job, the input of a command <FCh> causes a transition to the MDA access mode. Thereafter, the input of a change command makes it possible to change among access modes PNA-MDA-VFA.

[Data Structure]

FIG. 10 shows data structures in different data areas.

Data in the PNA area is given a transfer unit of 2112 Bytes (2048 Bytes+64 Bytes) for both read and write. When all pieces of data are serially output, they are sequentially provided, from the first sector to the 256th sector, on a sector basis (=2112 Bytes), resulting in a total of 512 KB (=540, 6278 Bytes).

In the case of a sector multiple of 1 (SM=1), the VFA and MDA areas are given a transfer unit of 528 Bytes in total including 512 Bytes (data body) in the shown-data format and 16 Bytes (redundant data) for both read and write. CRC data and ECC data are created in the host device at the time of write and in the memory controller of the LBA-NAND memory at the time of read.

A portion of 512 Bytes is stored in the NAND-type flash memory. Of the transferred data, only the data body is written. Actually, the extended 16 bytes are deleted in the flash memory, and an ECC code is created in accordance with write data and stored together with the write data.

The correctness of the transferred data is checked with the ECC data of 6 Bytes in the memory controller of the LBA-NAND memory at the time of write and in the host system at the time of read.

It is also possible to execute read/write operations in a transfer unit of 512 Bytes except for the redundant data of 16 Bytes. These can be changed and set using a configuration command for instructing a modification or change of the data configuration.

A sector multiple of SM=4 or 8 results in a data transfer unit of 2 KB or 4 KB. These are made through repetitions of the SM=1 data format four times or eight times.

In a mode to update firmware (FW) of the controller from the host, write data transfer is executed in a transfer unit of 528 Bytes as shown. The VFA area has a default data size of 8 MB and has a capacity modifiable using a resize command and selectable up to 32 MB in a capacity modification unit of 256 KB. The data to be stored includes only the data body and the redundant area data is not stored. The ECC code input at the time of data write is used only for identification of transfer data and is corrected when one bit error occurs.

Resize/Password are set in the following command sequences.

Resize: <00h>-<Config: A5>-<New Value: 1 Byte>-<Dummy: 3 Byte>-<57h>

Password Change: <00h>-<Config: 11>-<Old PW (Password): 2 Byte>-(New PW: 2 Byte>-<57h>

In accordance with an increase or decrease in capacity of the VFA area, the capacity of the MDA area decreases or increases correspondingly. The output format in the MDA access mode is a SSFDC mode of +16 Bytes. Of the extended 16 Bytes, effective data is only ECC data of 6 Bytes and other data is neglected/invalidated.

[Command Structure]

FIGS. 11A-11J show command structures in different operation modes. In these figures, < > indicates the input to the LBA-NAND memory, and [ ] indicates the output from the LBA-NAND memory. In addition, (B2R) indicates that a busy/ready signal RY/BY makes a transition to busy and then returns to ready.

The PNR mode is a read mode that requires no address input and an address is input as a dummy (Command No. 1 in FIG. 11A). In this PNR mode, data is read out in a unit of 2112 Bytes, sequentially from a logical address LBA=0.

Read/write in the MDA access mode is executed successively for plural sectors in the following command sequences in which, following a command, a sector count <SC> and a sector address (initial value) <SA> are entered (Command No. 2 in FIG. 11A)

Read:

(1) <00h>-(SC: 2Byte)-(SA: 3Byte)-<30h>-(B2R)-[Data]-...<00h>-(DummyAdd)-<30h>-[Data] ...; or (2) <00h>-(SC: 2Byte)-(SA: 3Byte)-<30h>-(B2R)-[Data]-<F8h>-(B2R)-[Data]...; or (3) <00h>-(SC: 2Byte)-(SA: 3Byte)-<30h>-(B2R)-[Data]-(B2R)-[Data]-(B2R)-[Data]...

Write:

(1) <80h>-(SC: 2Byte)-(SA: 3Byte)-<data>-<10h>-(B2R)-...<80h>-(DummyAdd)-<data>-<10h> -(B2R)...; or (2) <80h>-(SC: 2Byte)-(SA: 3Byte)-<data>-<15h>-(B2R)-<F2h>-<data>-<10h>-(B2R)-<F2h>-< data>-<10h>-(B2R)...

The PNA access mode is performed in a similar to the MDA access mode (Command No. 3 in FIG. 11A). At the time of write, write data of 2112 Byte/command is written using the area of 4224 Bytes. At the time of write, all data is stored with ECC.

The VFA access mode is also similar to the MDA access mode (Command No. 4 in FIG. 11A).

Mode change command codes are prepared for a change from the PNR mode to the MDA access mode, a change from the Serial-EEP mode to the MDA access mode, and changes among the MDA access mode-PNA access mode-VFA access mode, respectively (Command No. 5 in FIG. 11A).

A firmware (FW) reload command, "Command-911", at Command No. 7 in FIG. 11A is used to reread FW of the controller stored in the flash memory chip. When operation of the memory controller becomes out of order, reconstruction of the buffer RAM is required and accordingly this command is executed. With this command, data in the buffer RAM is backed up and, after execution of system boot, the system returns to the MDA access mode. The minimum busy time is 1 sec.

Execution of an IF read command makes it possible to read out ID codes assigned to respective I/O ports as shown at Command No. 9 in FIG. 11B. Specifically, in accordance with the ID codes, ID data for emulation of a 4 Gbit NAND flash memory of the binary storage type (with an erase block size of 128K Bytes and a page length of 2 K Bytes) and ID data for an actual LBA-NAND memory can be distinctively read out using commands.

As shown in FIG. 11C, with a status read command, status information can be output to the host. Specifically, as shown in FIG. 11C, information such as general Pass/Fail, transfer error Pass/Fail, Ready/Busy, and special information unique to LBA-NAND such as power save modes, operation modes and others can be selected using commands. Aside from the Ready/busy terminal, these pieces of status information are provided to the input/output ports I/O.

As for Pass/Fail associated with I/O1 and I/O2, the former indicates a summary of commands with a summary bit when a large amount of sectors are transferred using one command. To the contrary, the latter shows the result of Pass/Fail aimed at data transfer immediately before implementation of status check. Both include transfer error Pass/Fail.

Setting and modifying a password is executed using a custom command (Command No. 11 in FIG. 11D).

A VFA unit setting command is used to set the capacity size of the VFA area up to 32 MB in a unit of 256 KB (Command No. 12 in FIG. 11D). An input value is an integer multiple of 256 KB (from "04h 00h" to "00h 00h"). This command is used to erase old VFA data and MDA data.

A FW update execution command is used to validate FW data updated from the host to the buffer RAM of the memory controller and transfer and write it into the NAND flash memory (Command No. 13.1 in FIG. 11D).

An address reset command is used to clear the sector count and sector address (Command No. 13.2 in FIG. 11D). After completion of the command, the system returns to the PNR mode and can execute the PNR mode again, from the address 00h. This command is effective in PNR.

A FW reload command is applied to reread FW from the flash memory and used when FW update from the host fails (Command No. 13.3 in FIG. 11D).

A termination command is used to force termination of read/write. Once this command is entered, further new data is not accepted and all data left in the buffer RAM is written in the flash memory (Command No. 14 in FIG. 11D). After completion of write, the system returns Ready to the host. Write is carried out until it passes. If write can not be completed in a write time tPROG, though, the control goes to error termination.

A FW update send command (Command No. 15 in FIG. 11D) is used to update FW when a FW-caused bug is found after shipping to the user. A FW rewrite command is prepared during setting by the user to provide an environment that allows execution of easy FW update in the market.

In an operation sequence of commands, data is updated in the buffer RAM and then the data is validated. The data is given additional CRC16 data at intervals of 512 Bytes. The memory controller executes data comparison and, in the case of fail, it returns a transfer error to the host. Data correction of SSFDC is not executed.

A data refresh command (Command No. 16 in FIG. 11D) is exhibited to the user as a recommended command. In this case, harmful influences (such as the possibility of power interruption and the issue of power consumption) are clearly expressed.

A security erase command (Command No. 17 in FIG. 11D) is a command used to erase only the whole data in the MDA area from the flash memory.

A flush cache (Flash-cache) command (Command No. 18 in FIG. 11D) is a command of which issue from the host before power-off is recommended. This enables the system to terminate the whole of uncompleted processing in the controller and return Ready to the host.

A transfer protocol setting command (Command No. 19 in FIG. 11E) is employed to modify the conditions used in the system. The modifiable conditions are shown in the table.

The first byte is used to set the condition of ECC/CRC16 check/correction and the transfer sector size (that is, sector multiple). When an error bit is detected with ECC Check Enable, the transfer result is noticed to the status register. With retransfer of data at this stage, non-error correct data can be written.

The second byte in the table of FIG. 11E is used to set an optional read/write style. Specifically, as the read style, in contrast to a normal read type A, it is possible to set a type B that continues a read operation with the use of a continuation command <48h/F8h>. It is also possible without the use of the continuation command to set a type C that continues read with the use of a busy status signal (B2R) to repeat (B2R)-[Data]-(B2R).

As the write style, it is possible to set a normal write type A and a type B that continues a write operation exclusive of address input.

A minimum busy time setting command (Command No. 20 in FIG. 11F) is applied to set a host-detectable minimum busy time as shown in the table. The memory controller sets the busy time longer than the minimum busy time.

Power save mode setting and cancel commands (Command No. 21 in FIG. 11F and Command No. 22 in FIG. 11G) are employed to set and cancel a low power consumption mode for the LBA-NAND module.

An address information acquisition command (Command No. 23 in FIG. 11F) is used to provide address space information as shown in the table. The address space information includes information that shows the numbers of bytes assigned to a sector address and a sector count, respectively.

A MDA area capacity acquisition command (Command No. 24 in FIG. 11G) is used to identify the allocation size of a MDA area at each product. Specifically, it is provided to the input/output ports as the maximum address expressed with a 5-Byte logical address. For example, in the case of 4 G Bytes, 5-Byte data is formed as shown in the table.

A pin information acquisition command (Command No. 25 in FIG. 11H) is used to show the situations of custom control pins detected by the LBA-NAND module. Specifically, the situations of COME, COM0, COM1 can be shown as in the table.

There are other commands such as: a pass through mode command for performing a mode-change by directly informing the NAND flash memory 21 of an access to the host I/F 25 in the LBA-NAND memory 20 from the host device, without interpreting a meaning of a command in the controller (Command No. 26 in FIG. 11H); a firmware update command for use in update of firmware on the MPU in the memory controller (Command No. 27 in FIG. 11H); and a read retry command for instructing reread (Command No. 28 in FIG. 11H).

A VFA unit acquisition command (Command No. 29 in FIG. 11I) is used to identify the allocation size of a VFA area at each product.

A transfer protocol acquisition command (Command No. 30 in FIG. 11I) is used to identify the data transfer protocol for the LBA-NAND memory as shown in the table.

A minimum busy time acquisition command (Command No. 31 in FIG. 11I) enables the host to identify the operational situation of the LBA-NAND memory as shown in the table.

FIG. 12 shows the above commands in summary.

[Basic Timing Diagrams]

The following specific description is given to input/output timings of commands, addresses and data in different operation modes.

Figure 13:
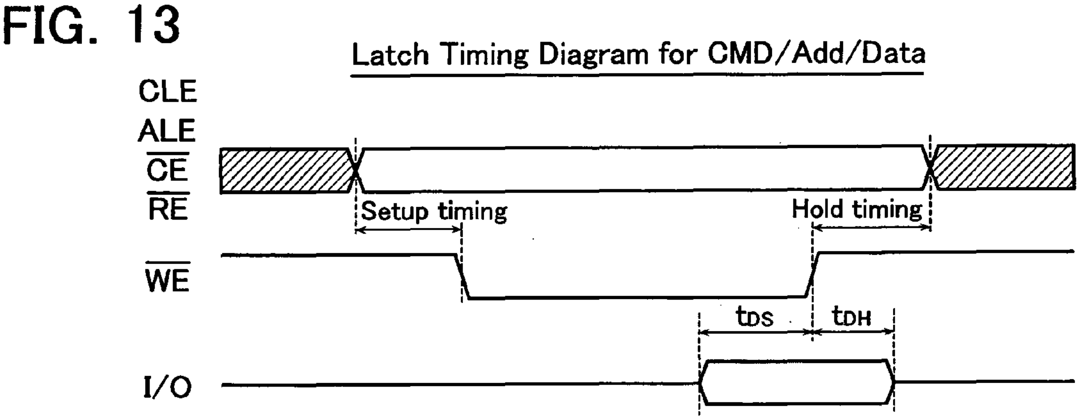
FIG. 13 is a diagram illustrative of latch timing of various signals to the LBA-NAND memory.

FIG. 13 is a diagram of basic timing commonly applied to command, address and data inputs. An address latch enable ALE, a command latch enable CLE and so forth are validated. Then, after a certain setup time wait, a write enable /WE is made "L" to allow the signal input of a command and so forth. The input signal is latched in response to a transition of /WE to "H".

Figure 14:
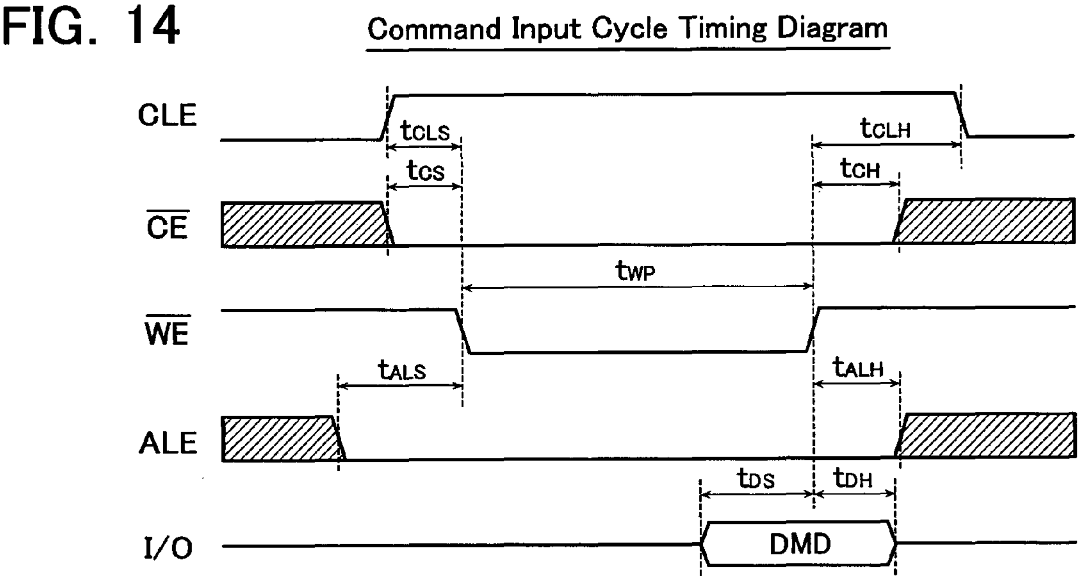
FIG. 14 is a diagram illustrative of command input cycle timing in the same manner.

FIG. 14 is a timing diagram of a command input. After the command latch CLE is made "H", a chip enable /CE is made "L", the address latch enable ALE is invalidated, and the write enable /WE is made "L", a command "CMD" is allowed to input in synchronization with a transition of /WE to "H".

Figure 15:
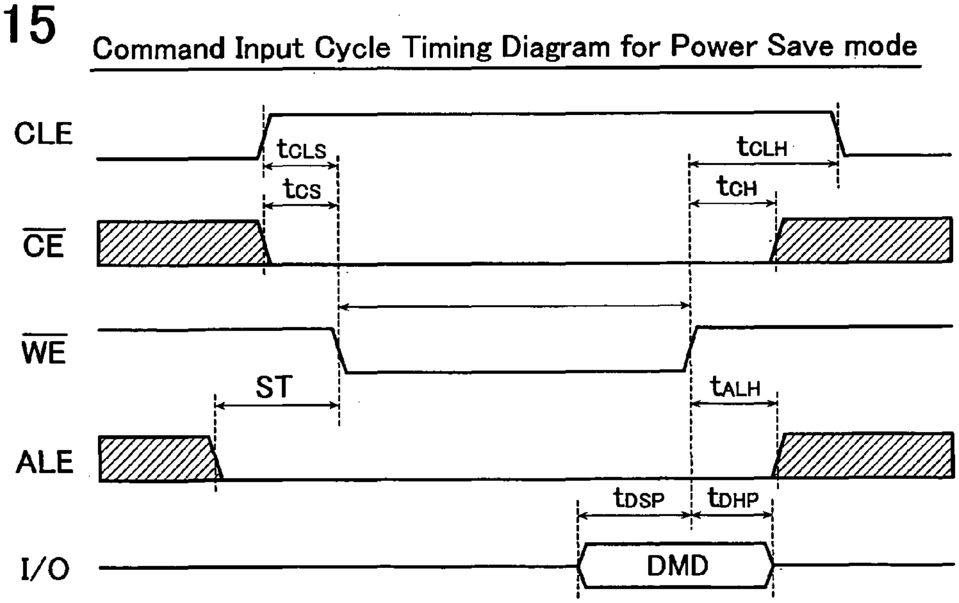
FIG. 15 is a diagram illustrative of command input cycle timing for a power save mode in the same manner.

FIG. 15 is a timing diagram of a command input for a power save mode, which is basically same as in FIG. 14.

Figure 16:
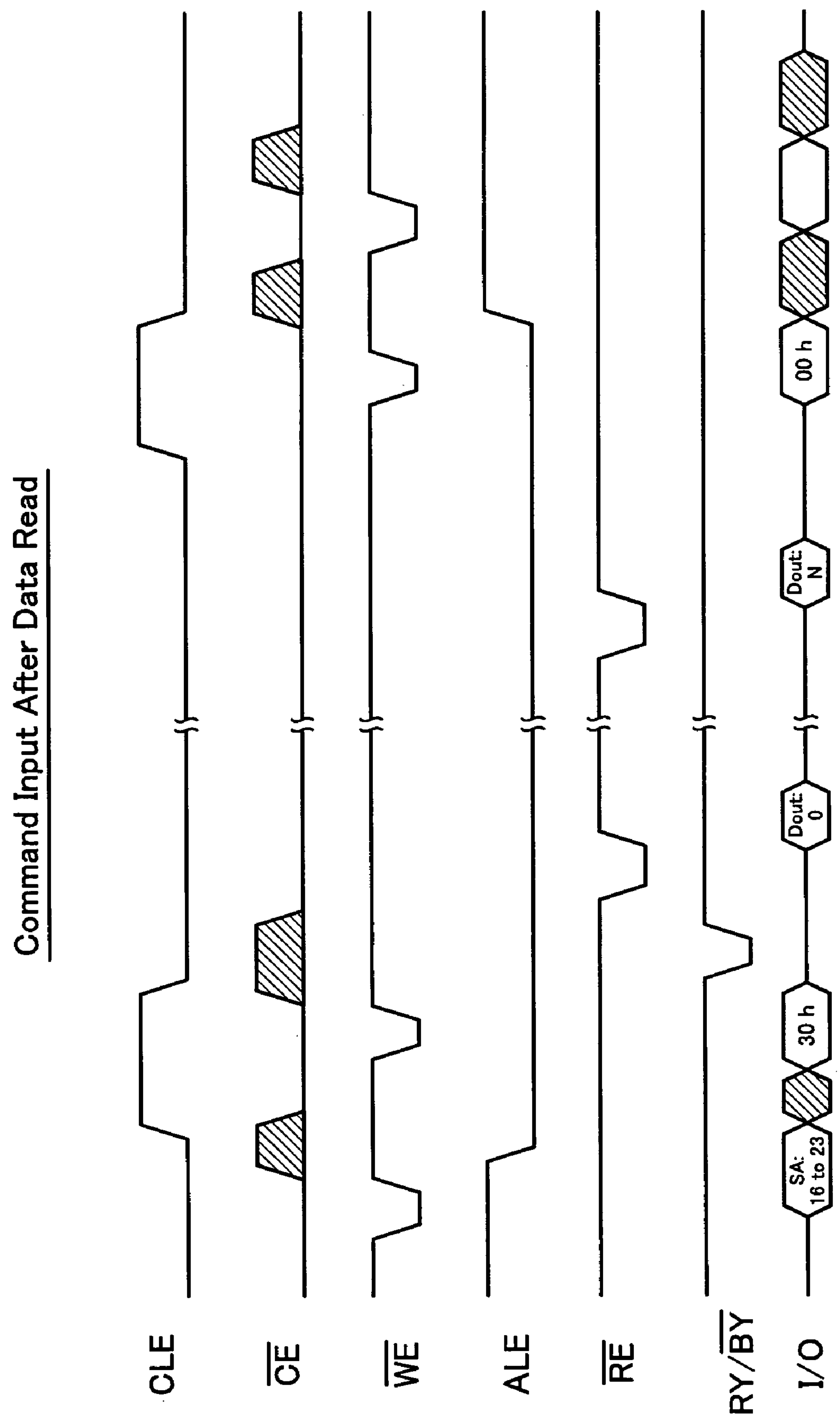
FIG. 16 is a diagram illustrative of command input timing after data read in the same manner.

FIG. 16 is a timing diagram of the next command input after data read. An address input sandwiched between commands <00h> and <30h> allows data read. Then, after certain busy, a read enable /RE is input to allow read data Dout0-DoutN to be output on a sector basis in synchronization therewith.

Thereafter, when the command latch enable CLE is made "H" again and the write enable /WE is made "L", the next command <00h> after data read is allowed to input.

Figure 17:
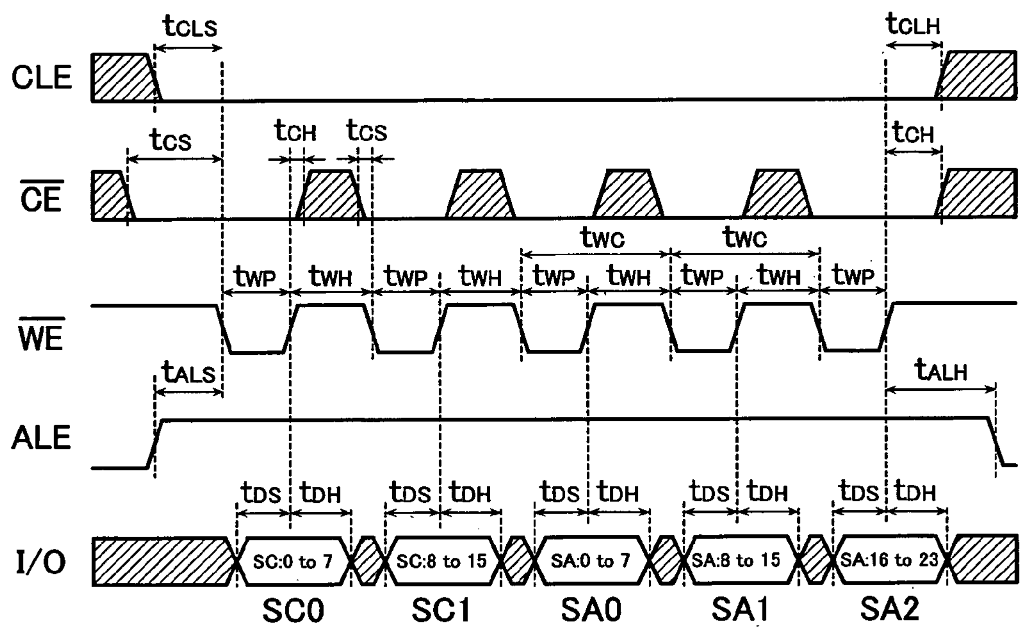
FIG. 17 is a diagram illustrative of address input cycle timing in the same manner.

FIG. 17 is a timing diagram of an address input. After the address latch enable ALE is made "H" and during the duration of "H", a sector count of 2 Bytes SC0, SC1 and a subsequent sector address of 3 Bytes SA0, SA1, SA2 are input in synchronization with the write enable /WE. This enables successive data accesses within a logical address range determined from the sector count and the sector address (initial value).

Figure 18:
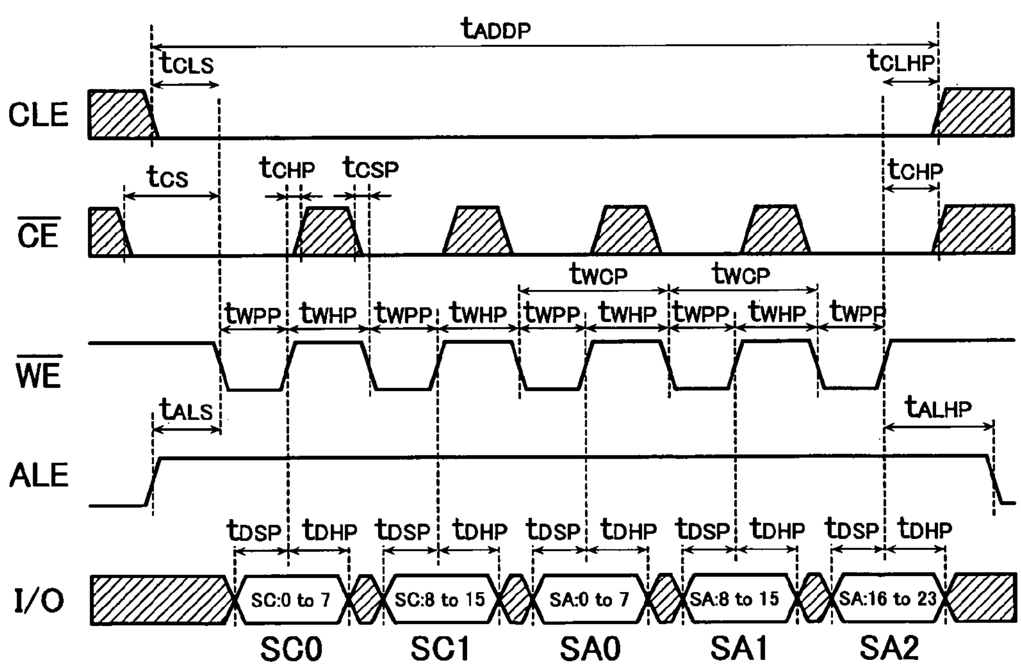
FIG. 18 is a diagram illustrative of address input cycle timing for a peak current reducing mode in the same manner.

FIG. 18 is a timing diagram of an address input in the power save mode, which is basically same as in FIG. 17. It is possible to set the power save mode through a selection of the effective period tADDP of the command latch enable CLE and the periods tWHP and tWPP of "H" and "L" levels of the write enable /WE.

Figure 19:
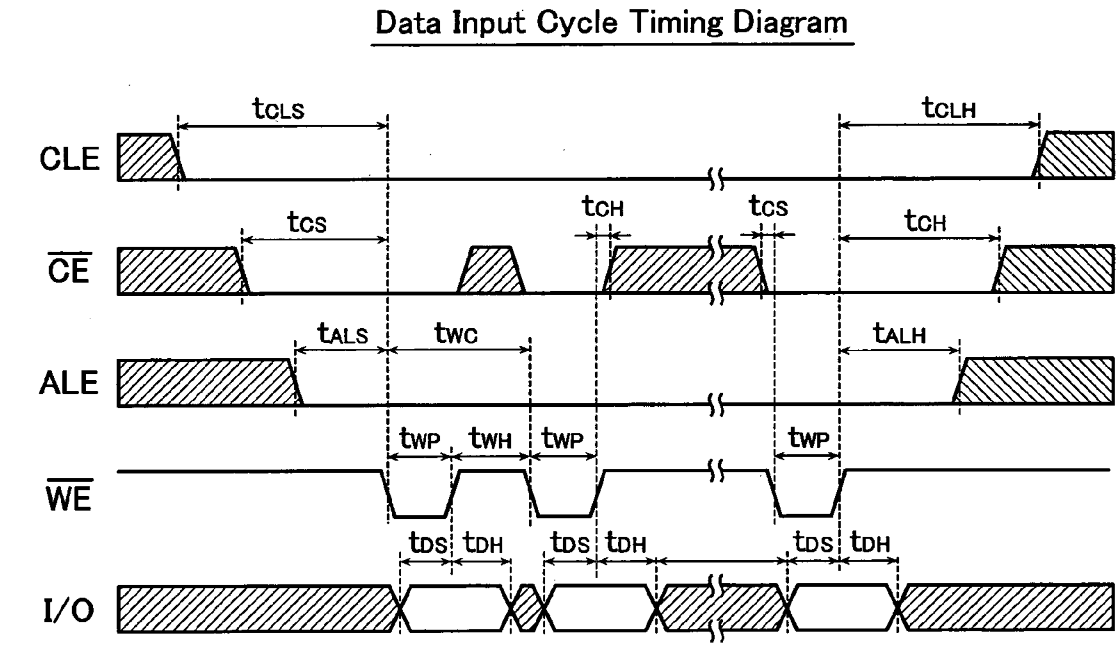
FIG. 19 is a diagram illustrative of data input timing in the same manner.

FIG. 19 is a timing diagram of a data input. Subsequent to command and address inputs, it is possible to input data in synchronization with the write enable /WE.

Figure 20:
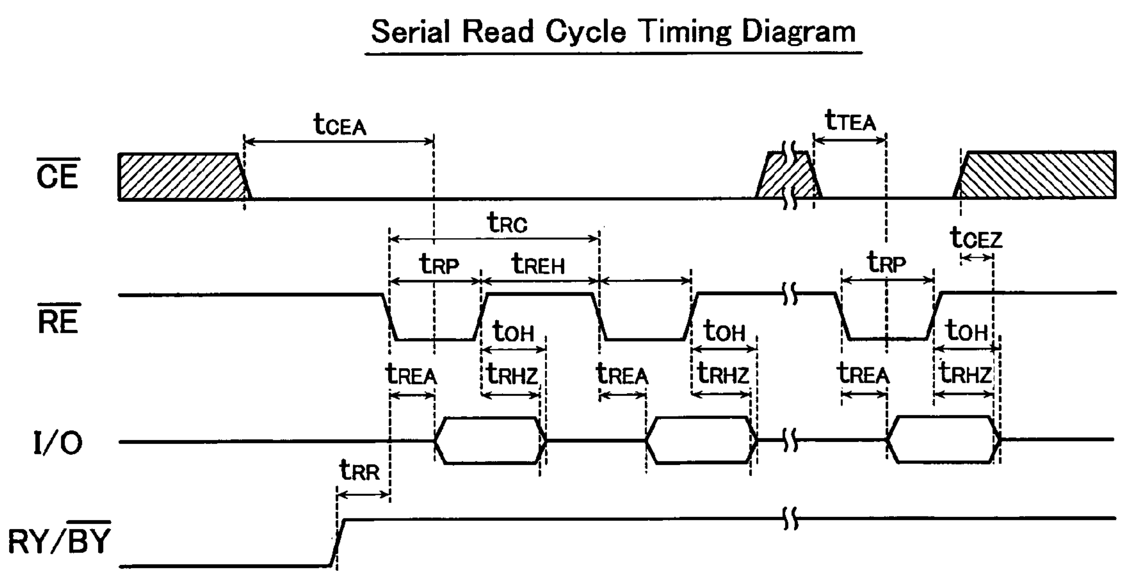
FIG. 20 is a diagram illustrative of serial read timing in the same manner.

FIG. 20 is a timing diagram of data that is read out of the cell array and serially read to external. The data read out of the cell array can be serially transferred and output in synchronization with the read enable /RE on a 1-Byte basis. During this output operation, the write operation to the NAND flash memory can be executed and accordingly the LBA-NAND memory outputs Ready.

Figure 21:
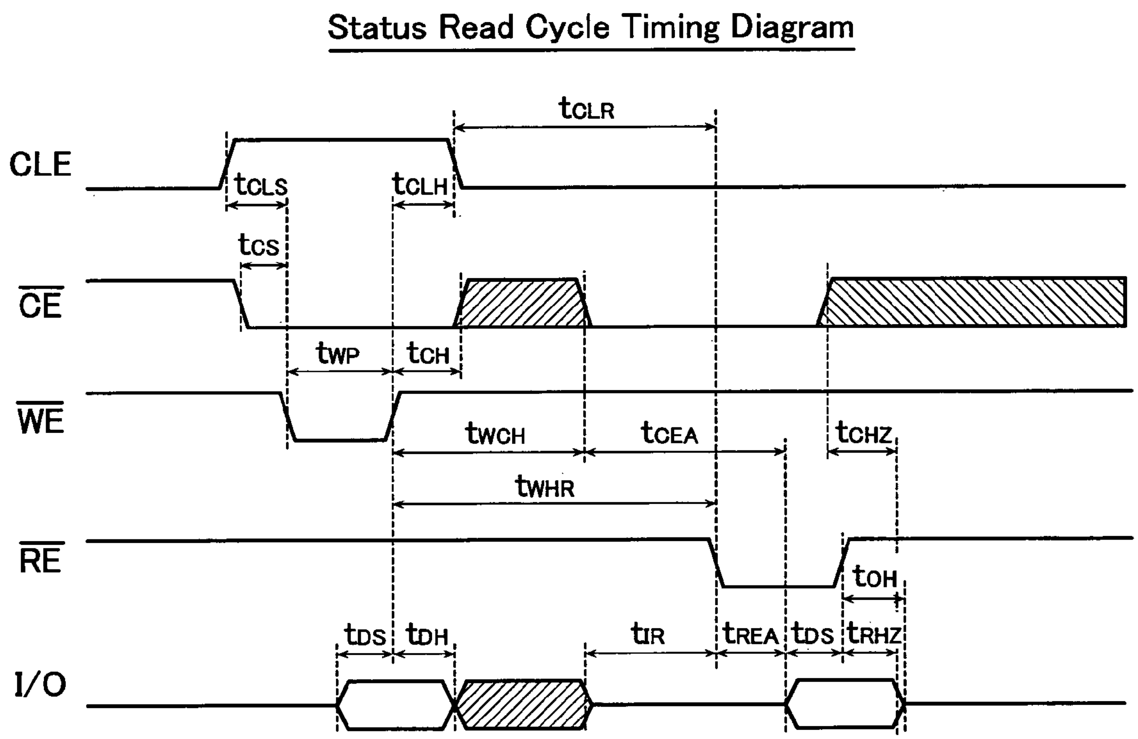
FIG. 21 is a diagram illustrative of status read timing in the same manner.

FIG. 21 is a read timing of status data (Pass/Fail, Ready/Busy and others). In synchronization with the write enable /WE, a status read command "CMD" is input. Then, in synchronization with the read enable /RE, the status "ST" can be read out.

Figure 22:
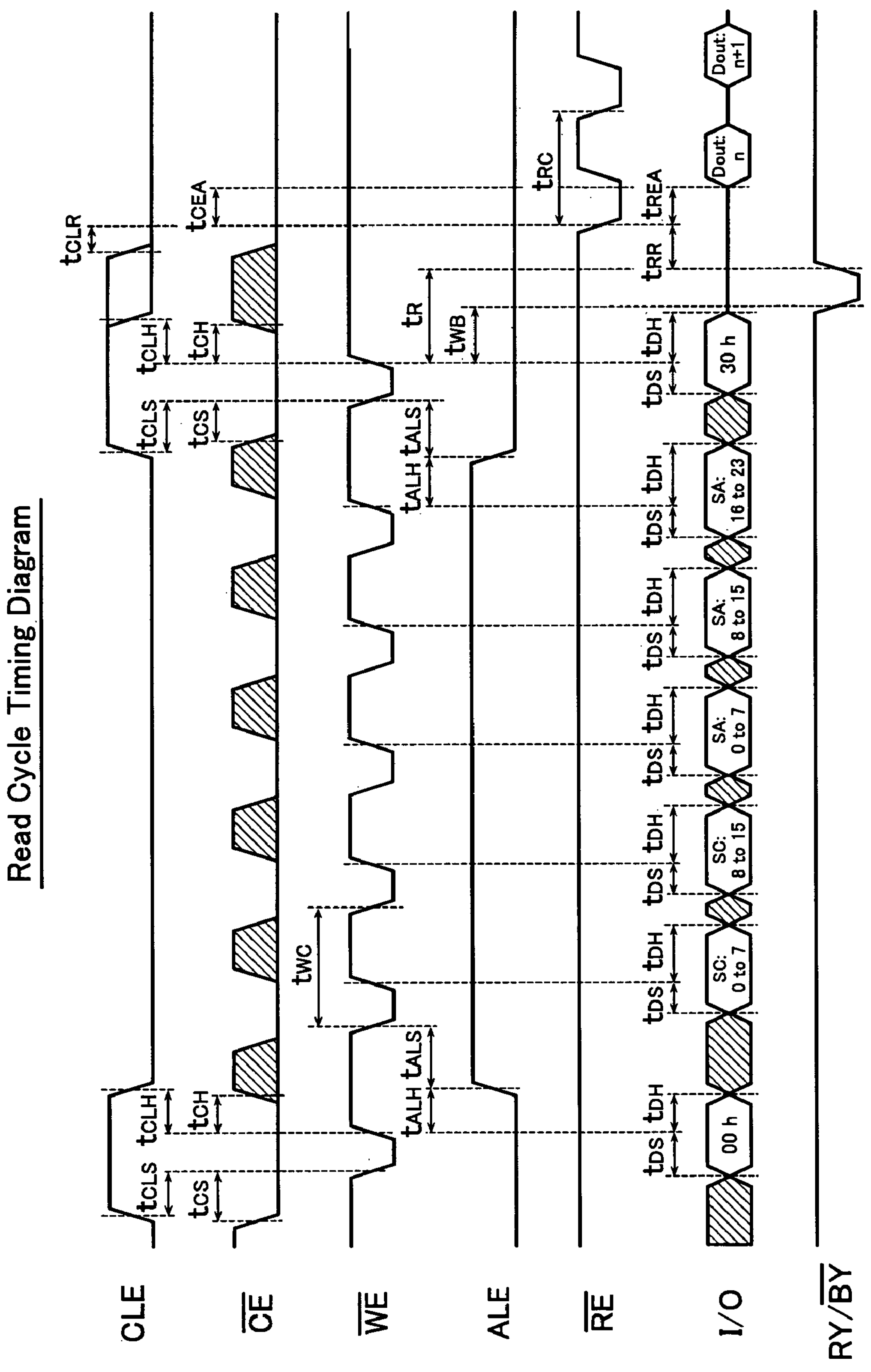
FIG. 22 is a diagram illustrative of read cycle timing in the same manner.

FIG. 22 shows a timing diagram of a data read cycle containing a command input and an address input. As described earlier, as sandwiched between the first command <00h> and the second command <30h>, a sector count SC and a sector address SA are input to execute a read operation to the cell array.

Then, after a certain busy time, with toggle of the read enable /RE, read data is serially output as described in FIG. 20.

Figure 23:
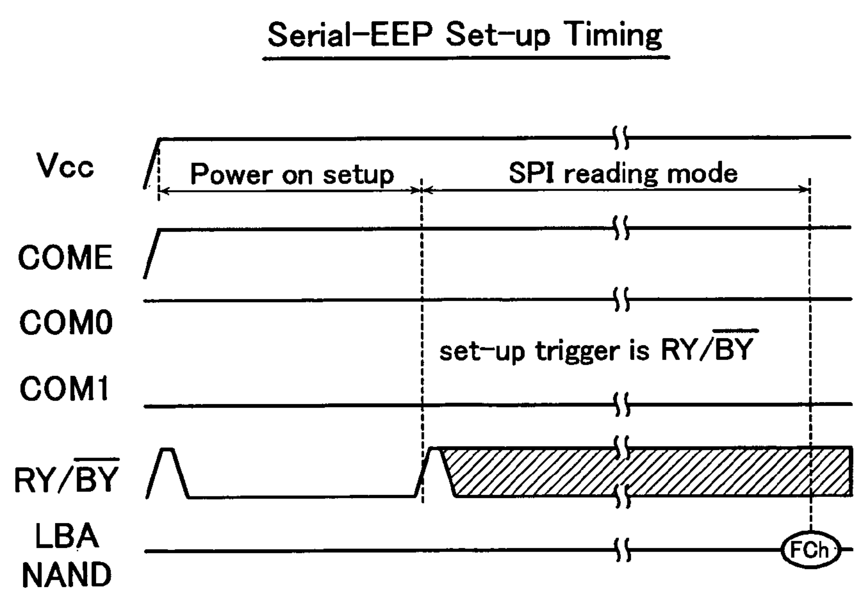
FIG. 23 is a diagram illustrative of serial-EEP mode setup timing in the same manner.

FIG. 23 shows a setup timing of the Serial-EEP mode at power-on. After initial setup at power-on and when the LBA-NAND memory becomes Ready, signal levels on the custom control pins are identified for mode setting.

Specifically, with COME="H", COM0="H" and COM1="L", the SPI mode (that is, Serial-EEP mode) is set. The input of the command <FCh> cancels the mode.

FIG. 24 shows the conditions for PNR mode selection in summary. The Serial-EEP mode is indicated with "PNR with SPI". A normal PNR mode can be set with only COME="L", as well as COME="H" and COM0=COM1="H", or COME="H" and COM0=COM1="L". Alternatively, setting may be achieved when one of these custom control pins is made open and other two pins are made at appropriate levels.

[PNR Mode Read Timing]

Figure 25:
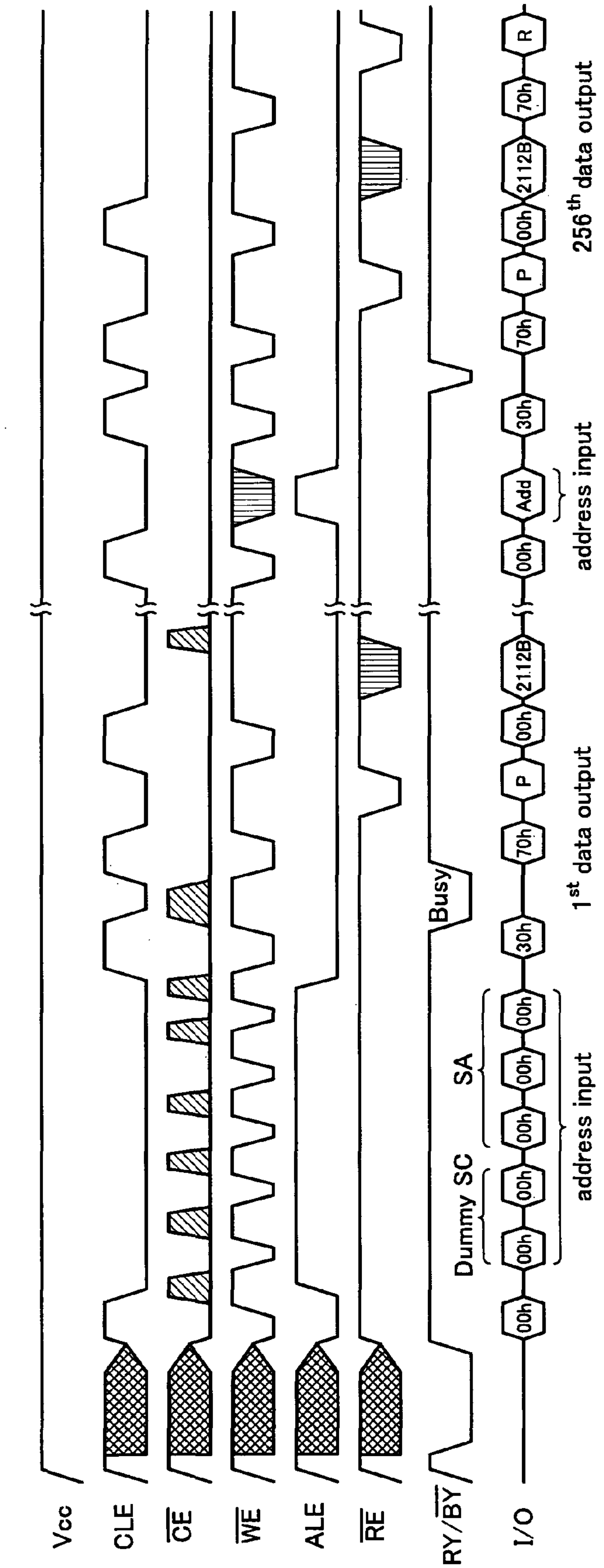
FIG. 25 is a timing diagram in the PNR mode with error check (1-1).

FIGS. 25-28 are timing diagrams of the PNR mode that is a read operation at power-on in the PNR area, showing the cases with error check. Among those, FIG. 25 shows non-error data transfer.

As described above, with the command input and the dummy address input, read is started after a certain busy time. When the status is pass ("P"), the same read operation is repeated similarly up to the 256th sector.

Figure 26:
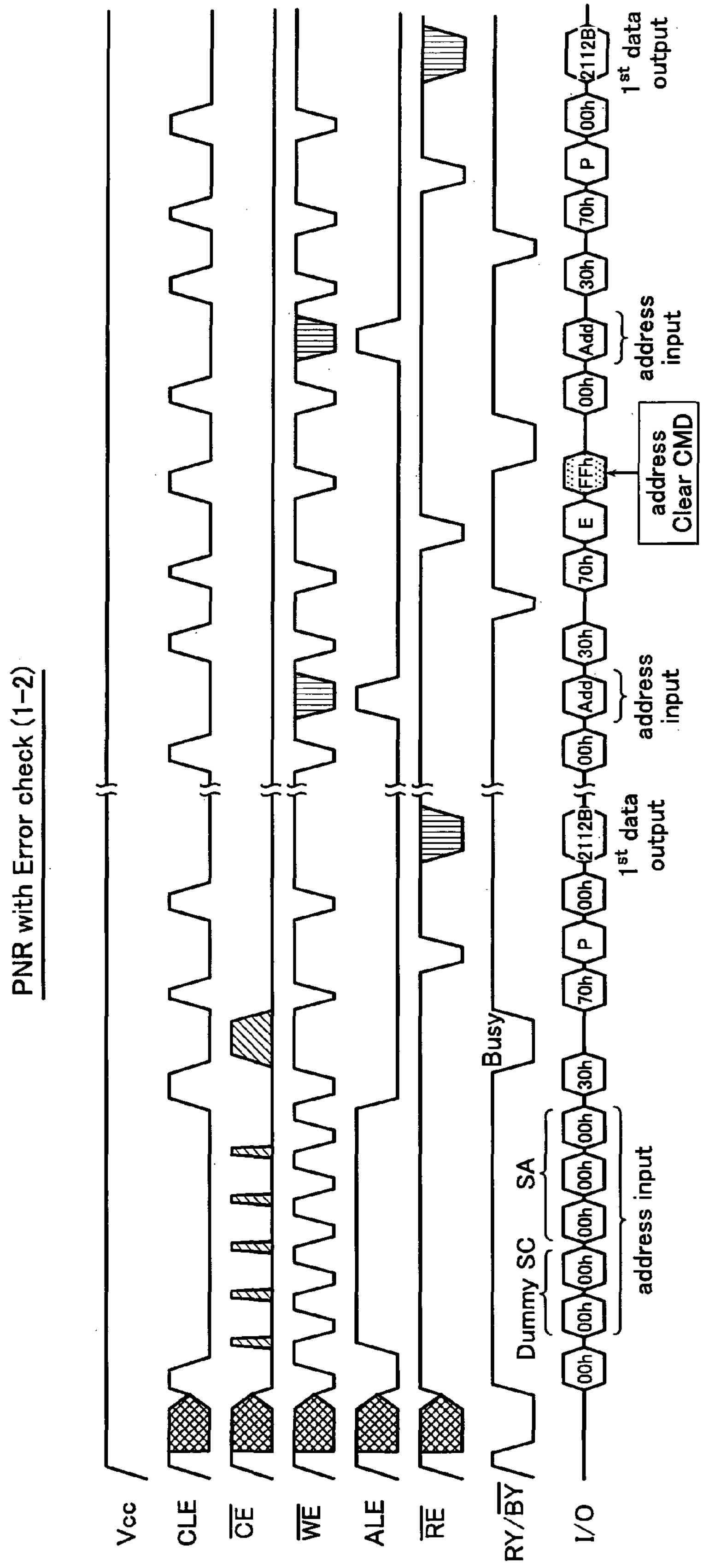
FIG. 26 is a timing diagram in the PNR mode with error check (1-2).

FIG. 26 shows one handling method for the case where the status indicative of an error "E" is obtained. On receipt of the error "E", an address clear command "FFh" is input to execute read again from the first address.

Figure 27:
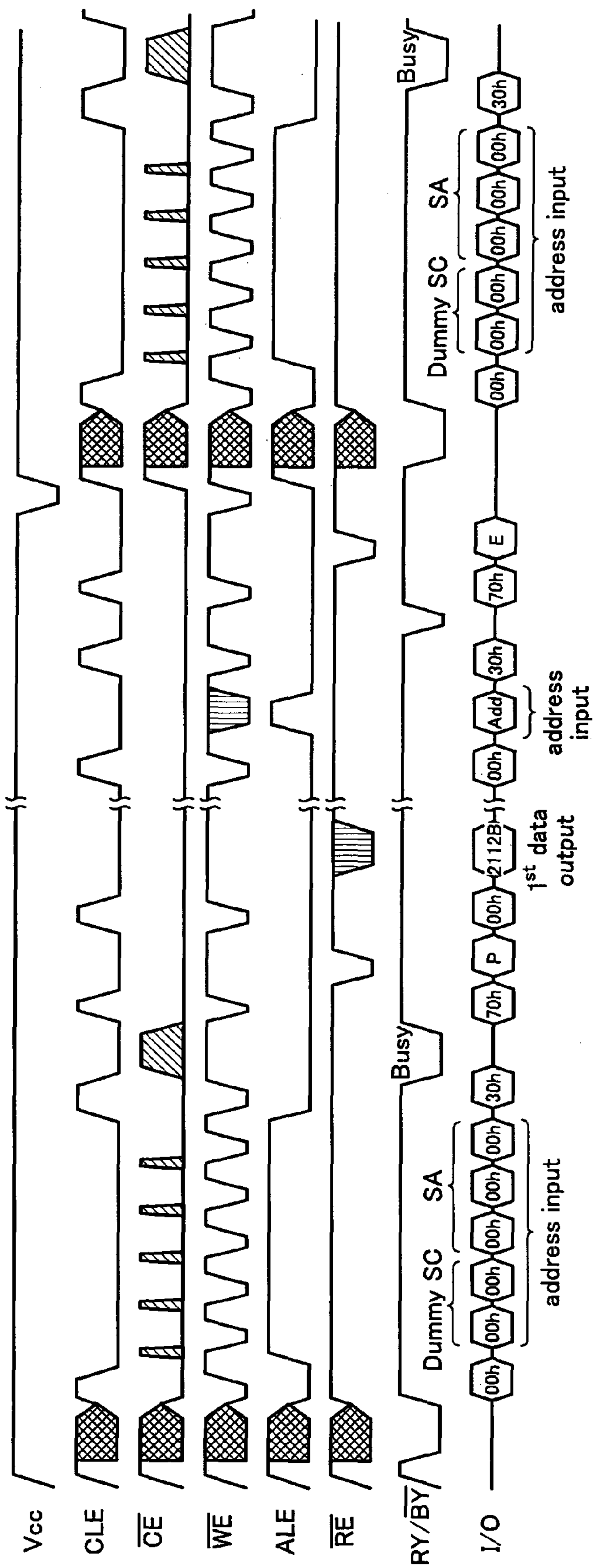
FIG. 27 is a timing diagram in the PNR mode with error check (1-3).

FIG. 27 shows an example to force power-off, reboot, and read again when the status indicative of the error "E" is obtained similarly.

Figure 28:
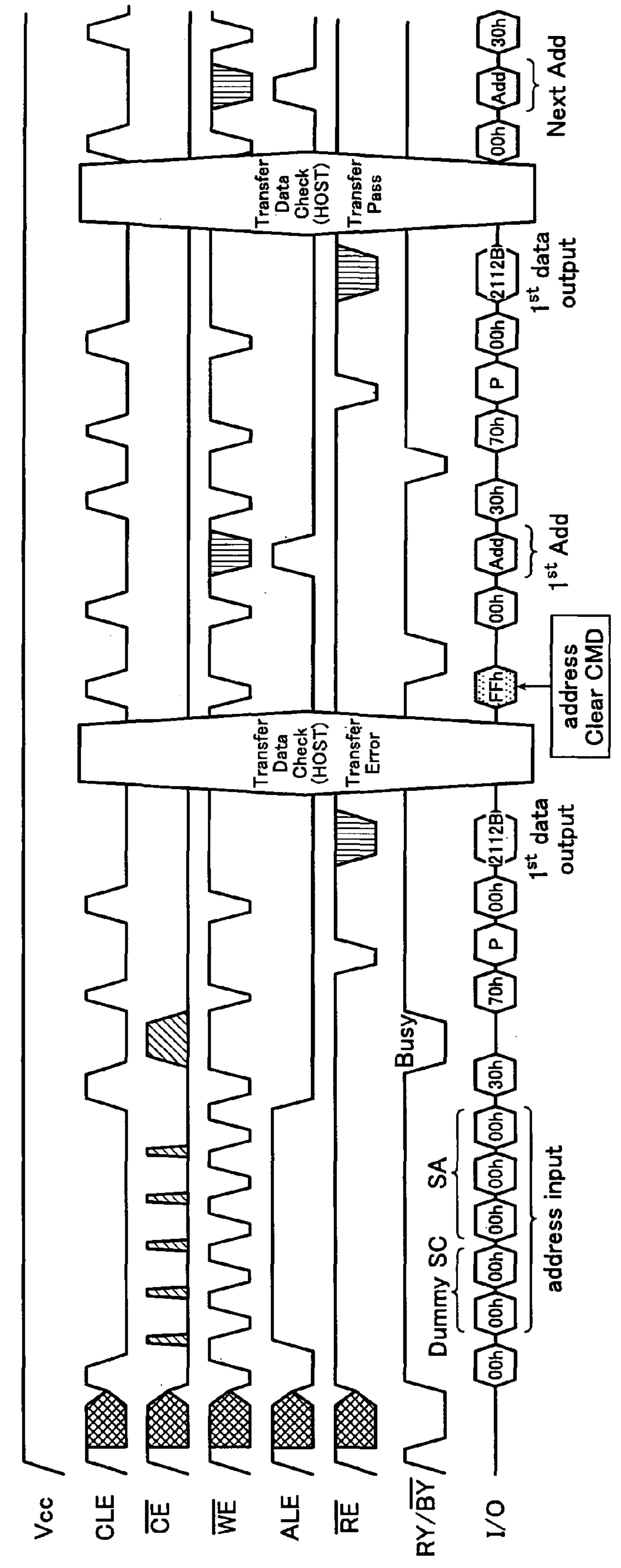
FIG. 28 is a timing diagram in the PNR mode with error check (1-4).

FIG. 28 shows a handling method for the case where the host executes data check and detects a data transfer error. In this case, the host, on receipt of error detection, inputs an address clear command "FFh" to execute read once again from the first address.

Figure 29:
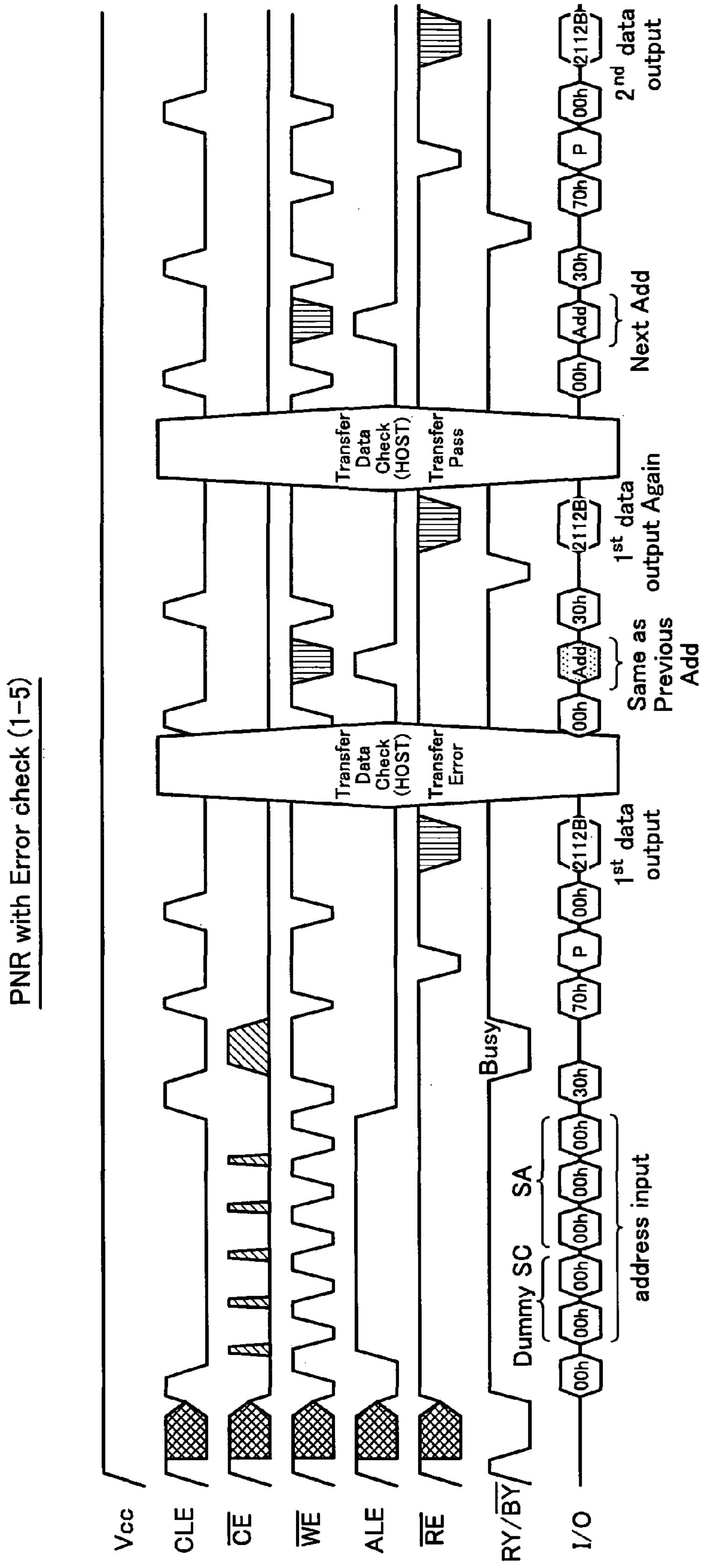
FIG. 29 is a timing diagram in the PNR mode with error check (1-5).

FIG. 29 shows an example of the case where the host detects a data transfer error and then enters the same sector address of the data to read the same data again.

Figure 30:
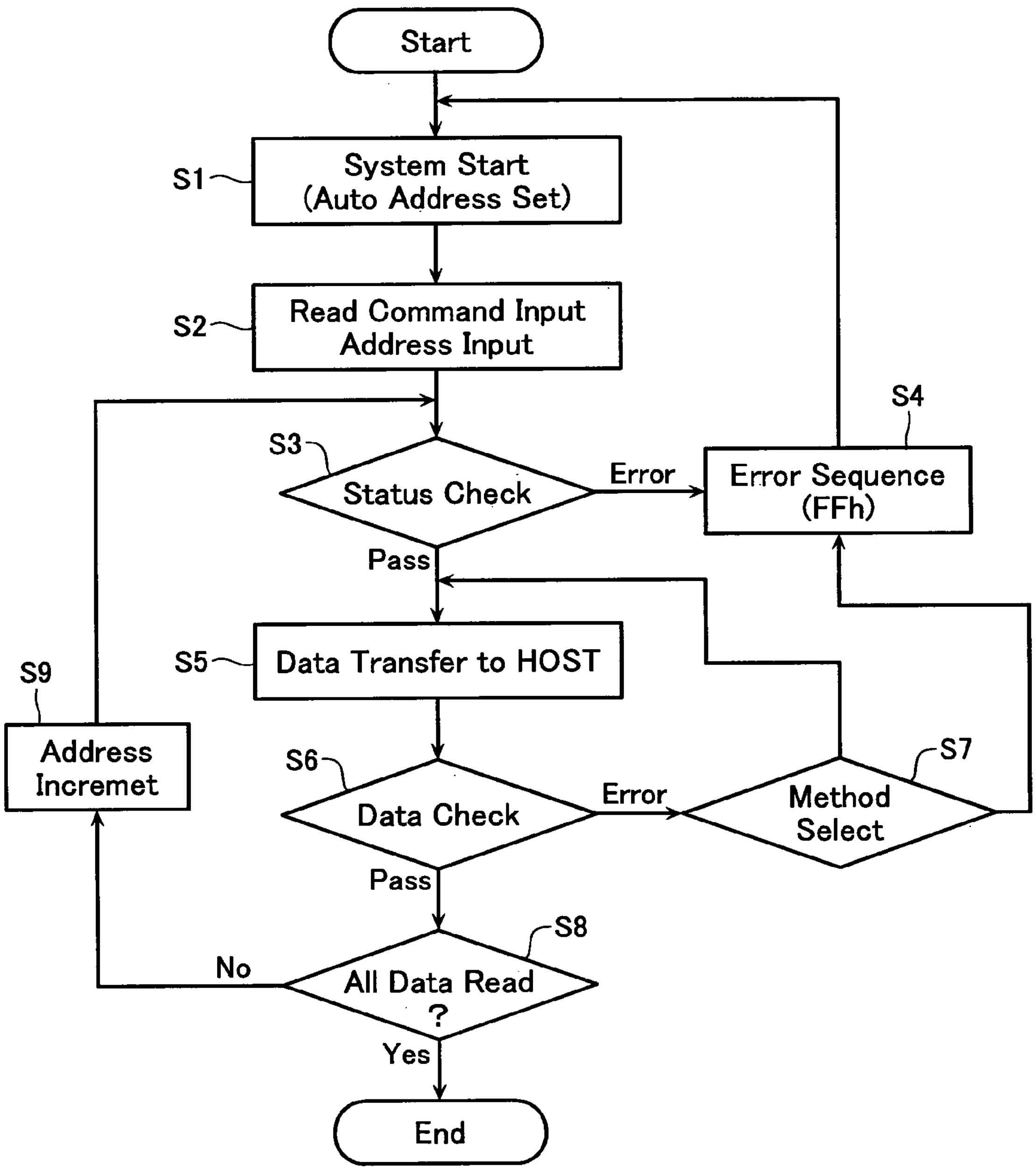
FIG. 30 is a flowchart of the PNR mode.

FIG. 30 shows the PNR mode operations described in FIGS. 25-28 summarized as a series of flows. The system is started (step S1), and a command and an address are input (step S2) to start a read operation.

If an error is detected with status check (step S3), an error sequence is executed (step S4). In this case, an address clear command "FFh" is input to clear the address to restart the read operation from the beginning. Alternatively, power is turned off to restart the read operation from the beginning.

If an error is detected with transfer data check at the host (step S6), a handing method is selected (step S7) to execute the error sequence (step S4) or resend data at the same address (step S5).

If there is no error in data transfer of one transfer unit, it is determined whether or not all data is readout (step S8). If NO, the same read operation is repeated with an address increment (step S9) until all data is read out.

[MDA Access Mode . . . for Read]

The following description is given to various access timings in the MDA access mode.

Figure 31:
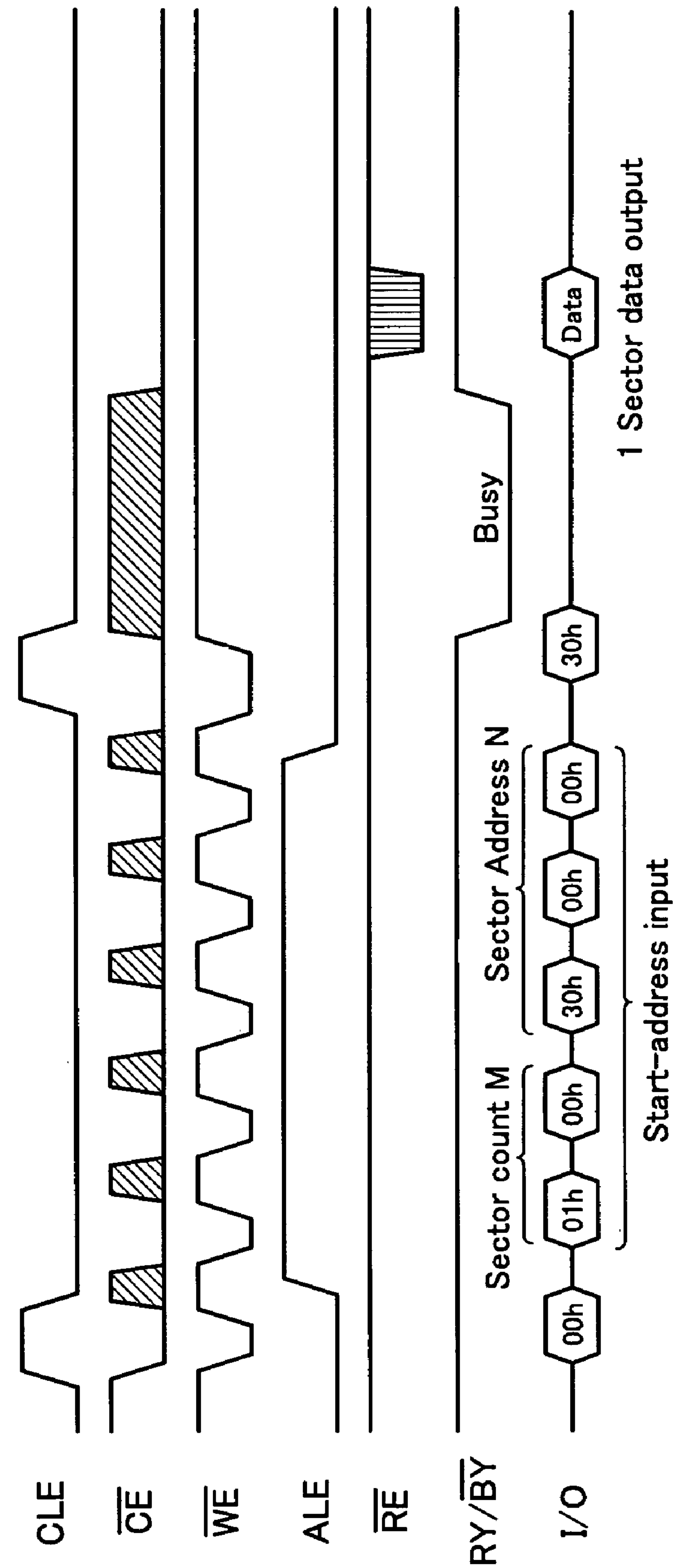
FIG. 31 is a timing diagram of read access in a MDA mode of a default type (in the case of 1 sector).

FIG. 31 is a timing diagram of the case where one sector is read out of the MDA area. As described above, together with a command, a sector count M and a sector address (start address LBA) N are input. Then, after certain busy, data can be read out in synchronization with the read enable /RE.

Figure 32:
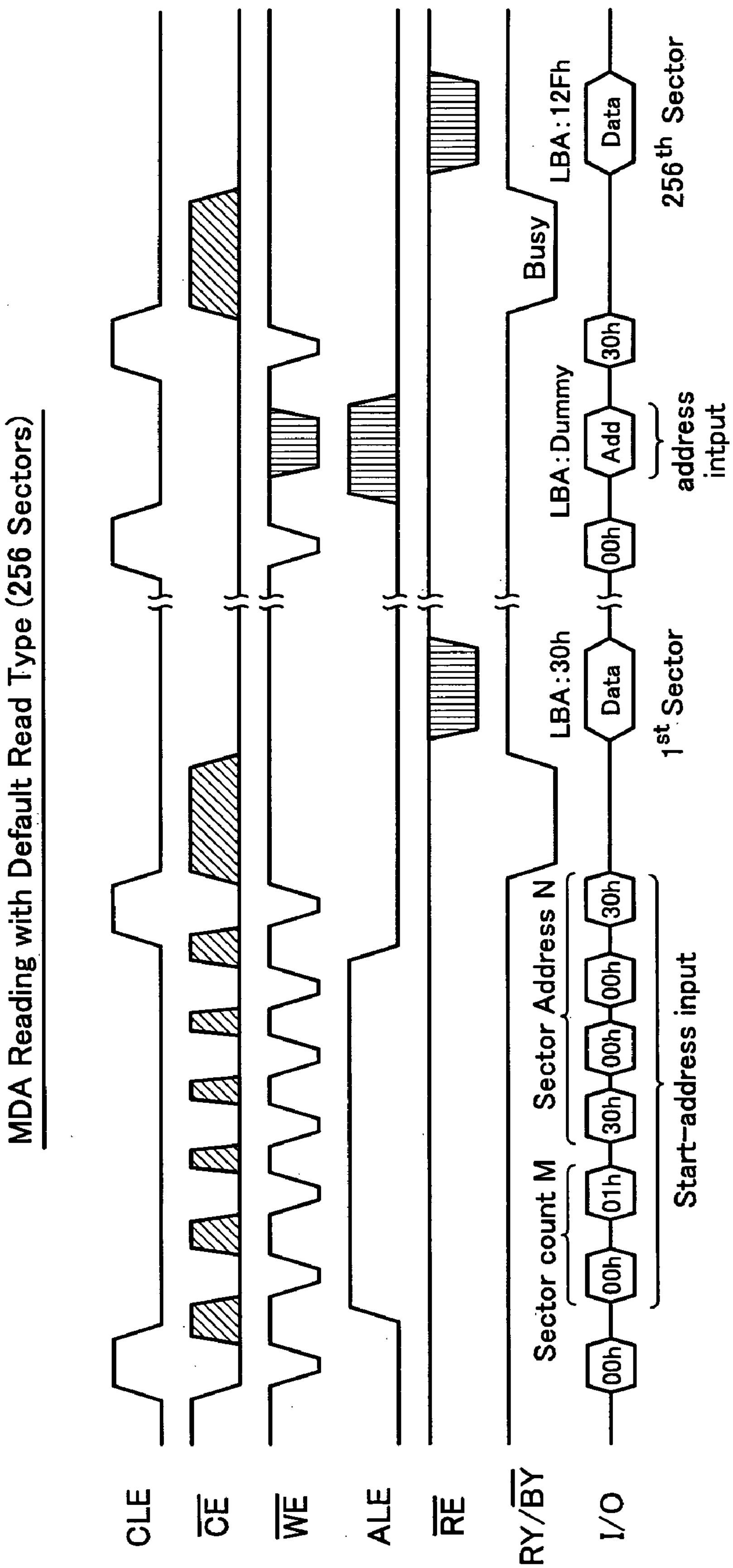
FIG. 32 is a timing diagram of read access in a MDA mode of a default type (in the case of 256 sectors).

FIG. 32 is a timing diagram of read, successively from the first sector (LBA=30h) to the 256th sector (LBA=12Fh) in the same manner. After each sector read, a command and an address are input but this is a dummy address. The actual address is internally incremented sequentially in accordance with the initially input sector address (initial value) and sector count.

Figure 33:
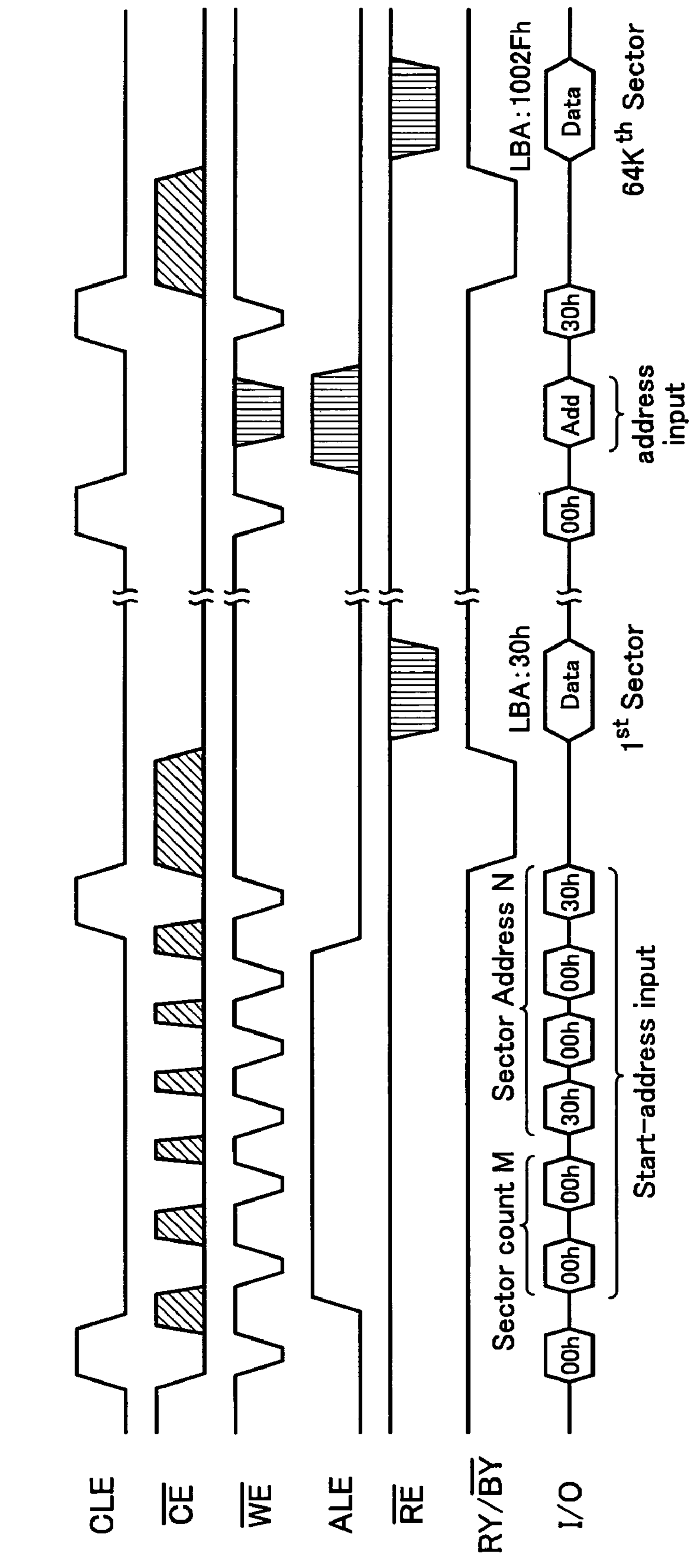
FIG. 33 is a timing diagram of read access in a MDA mode of a default type (in the case of 64K sectors).

FIG. 33 is a timing diagram of read, successively from the first sector (LBA=30h) to the 64Kth sector (LBA=1002Fh) in the same manner.

Figure 34:
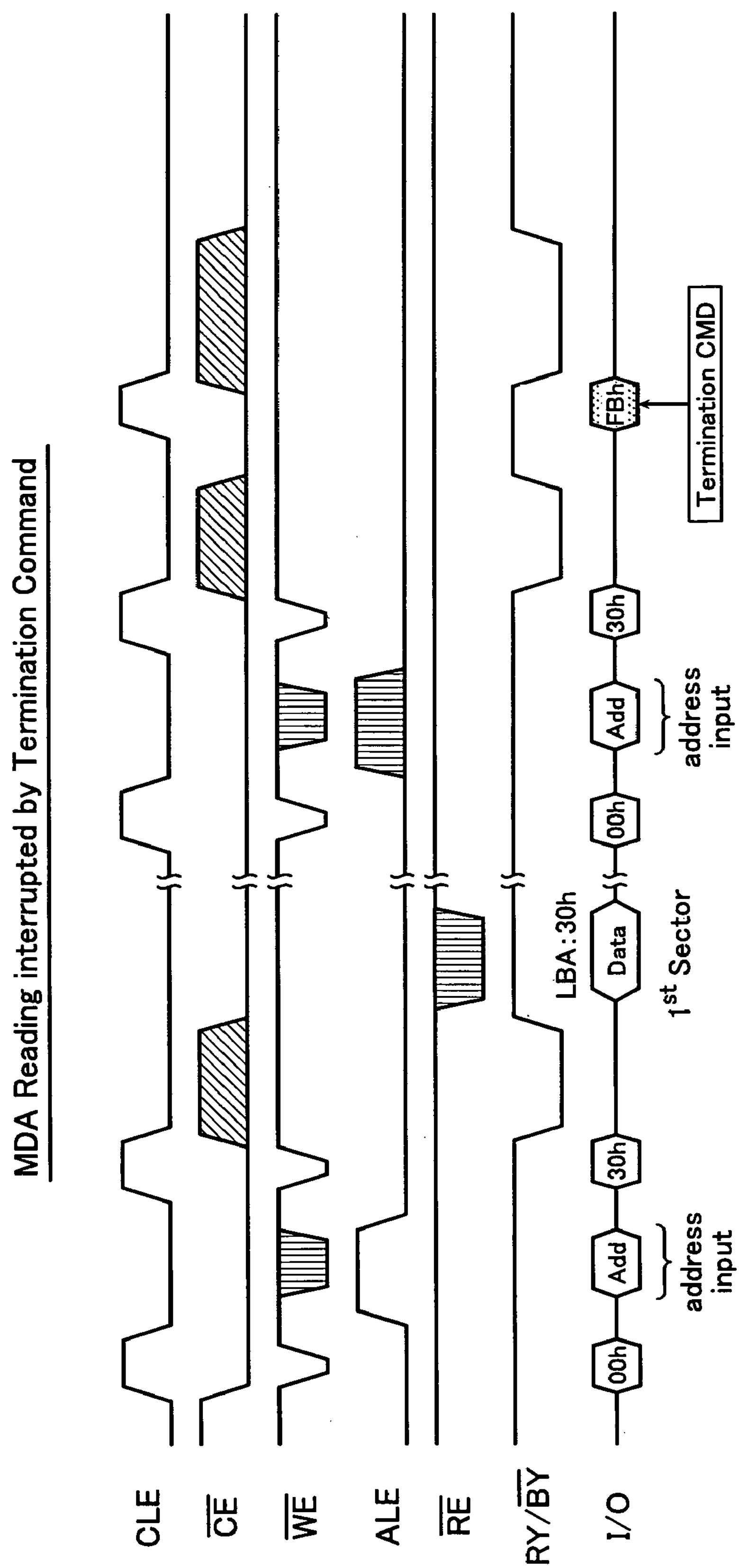
FIG. 34 is a timing diagram of read in a MDA mode to be interrupted using a termination command.

FIG. 34 shows a read operation interrupted using a termination command <FBh> during standby (Ready) of the host in the read sequence.

Figure 35:
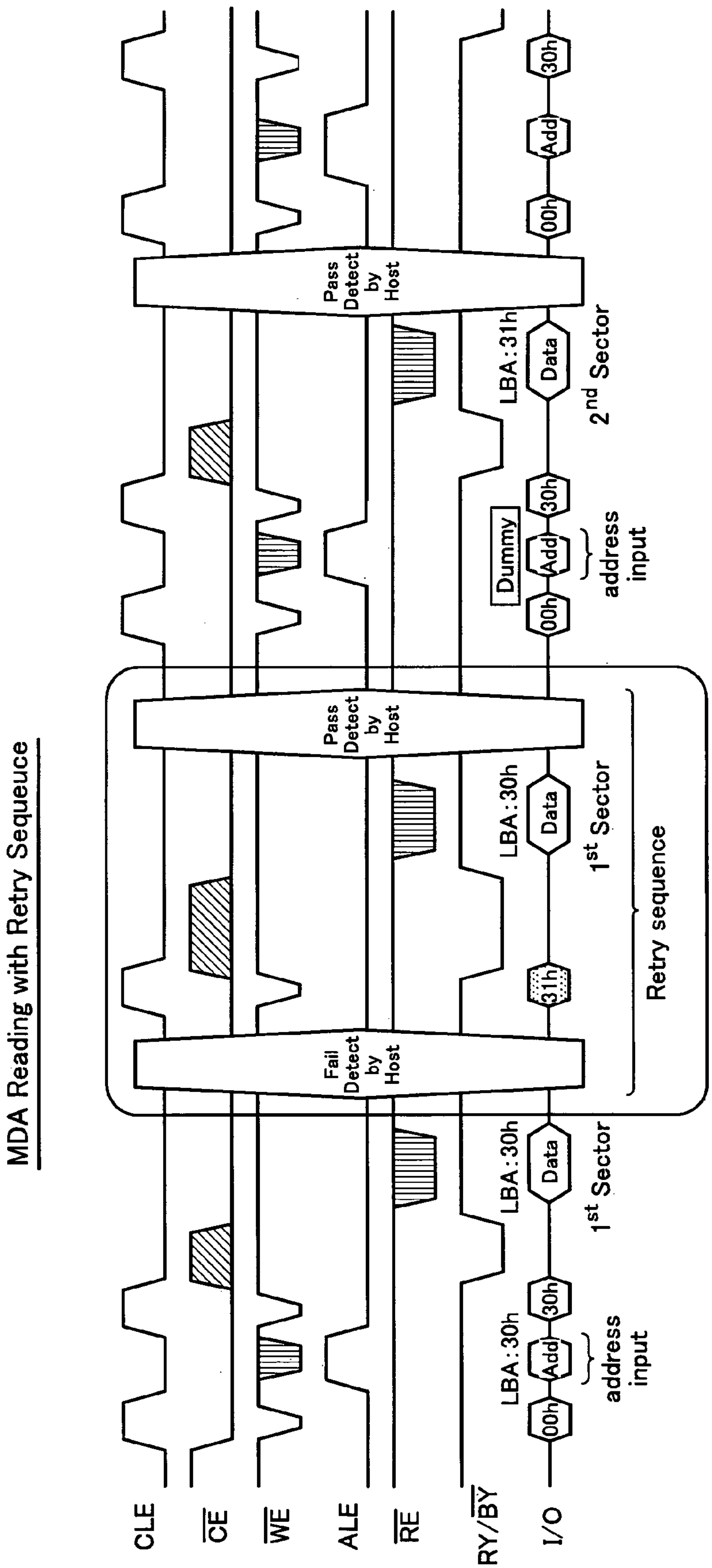
FIG. 35 is a timing diagram of read in a MDA mode with a retransfer request.

FIG. 35 is a processing diagram of the case where a data transfer error occurs during multi-sector read. When the host detects the data transfer error, it issues a retry command <31h> to request the LBA-NAND for retransfer. This enables the same data to be reread.

Figure 36:
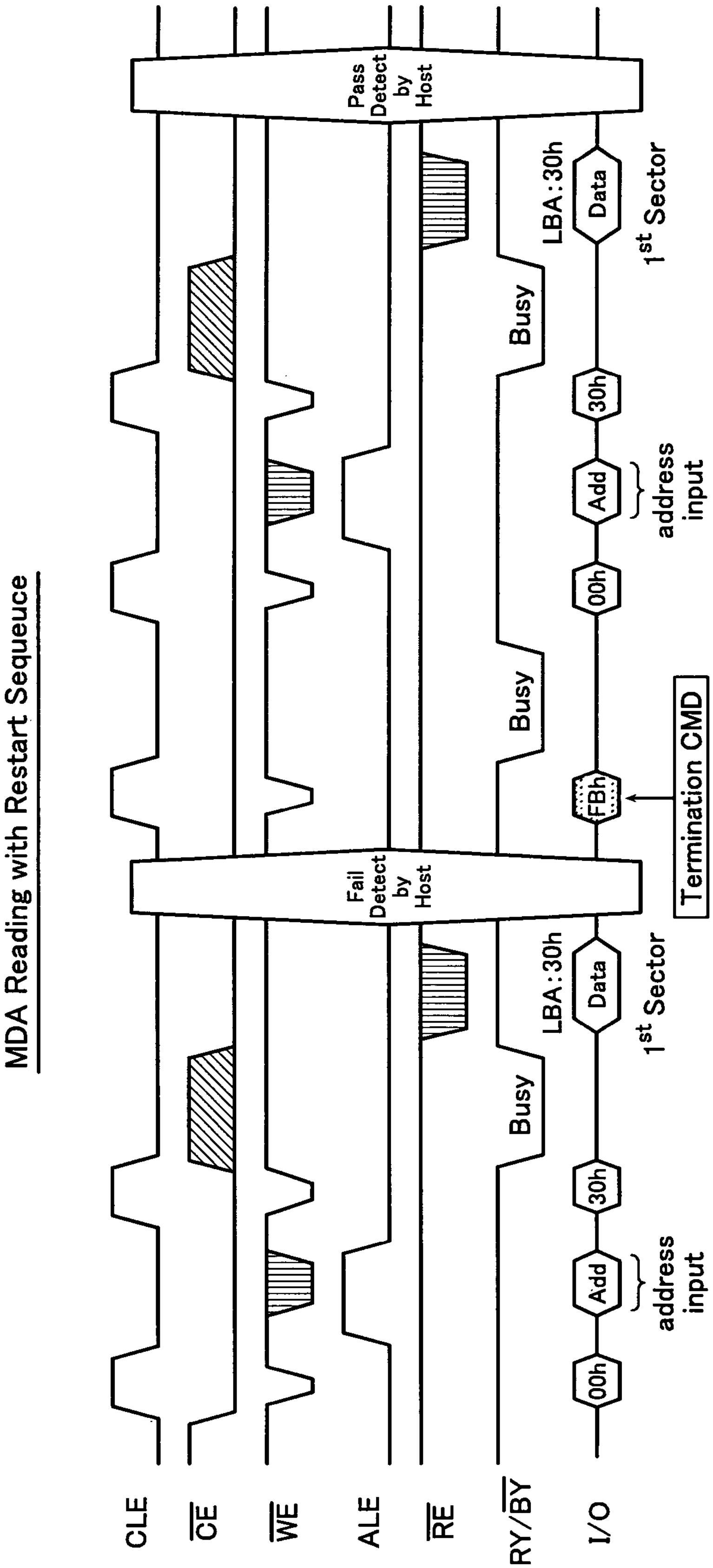
FIG. 36 is a timing diagram when a new sequence is restarted after the input of a termination command.

FIG. 36 is another processing diagram of the case where a data transfer error occurs in the same manner. In this case, the host detects the transfer error and issues a termination command <FBh>. This makes it possible to terminate the read operation once and then read out with read command and address inputs again.

FIGS. 37-40 are timing diagrams of read of optional read types B.

Figure 37:
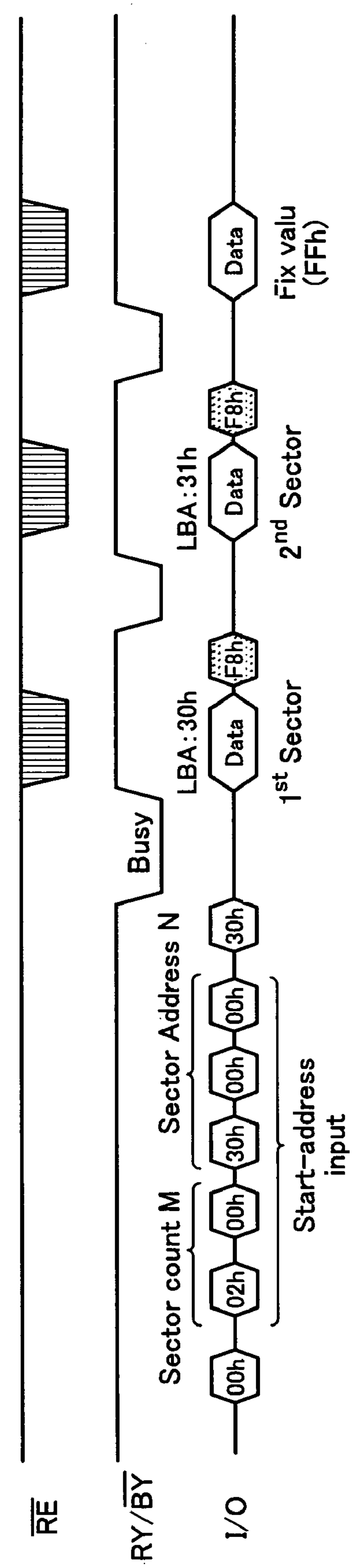
FIG. 37 is a timing diagram of read access in a MDA mode of an optional read type B(1).

FIG. 37 is a timing diagram of the case where a transfer protocol setting command is used to set an optional read type B, that is, when a continuation command <F8h> is input after each sector data read to continue the read operation. If continuation command clocks are input over the number of output requests (sector count), a fixed value <FFh> is output. In a word, the LBA-NAND outputs the fixed value and becomes standby to wait for a termination command sent from the host.

Figure 38:
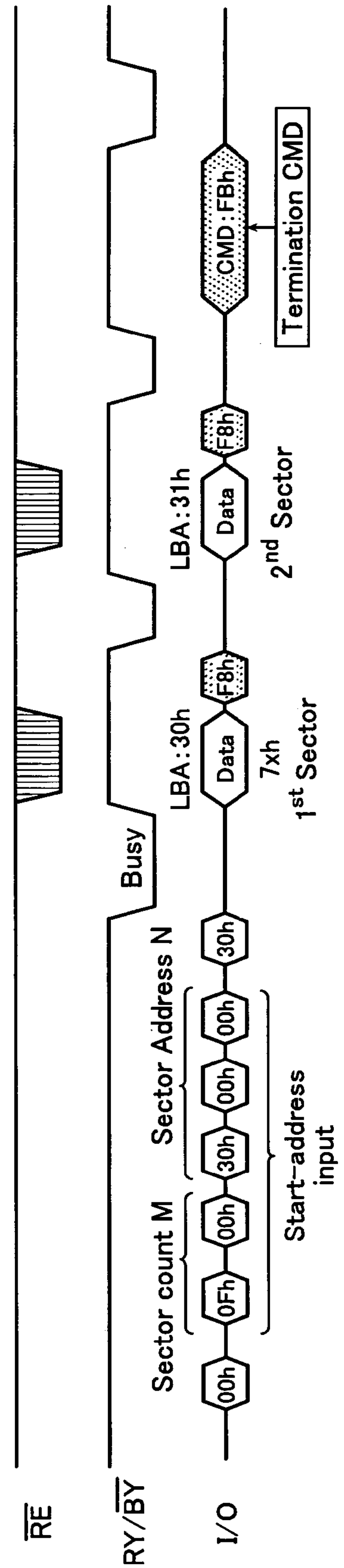
FIG. 38 is a timing diagram of read access in a MDA mode of an optional read type B(2).

FIG. 38 is a timing diagram of the case where a continuation command <F8h> is used to continue the read operation and a termination command <FBh> to terminate the continued read operation.

Figure 39:
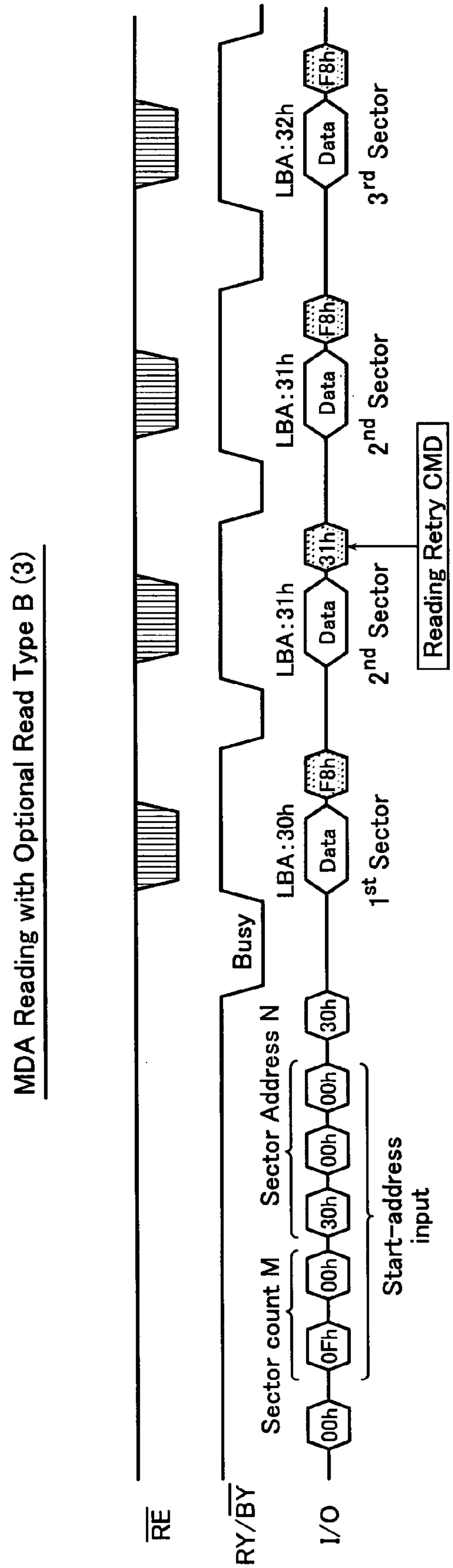
FIG. 39 is a timing diagram of read access in a MDA mode of an optional read type B(3).

FIG. 39 is a timing diagram of the case where a continuation command <F8h> is used to continue the read operation similarly and a retry command <31h> to retransfer the same sector data as that in immediately preceding read.

Figure 40:
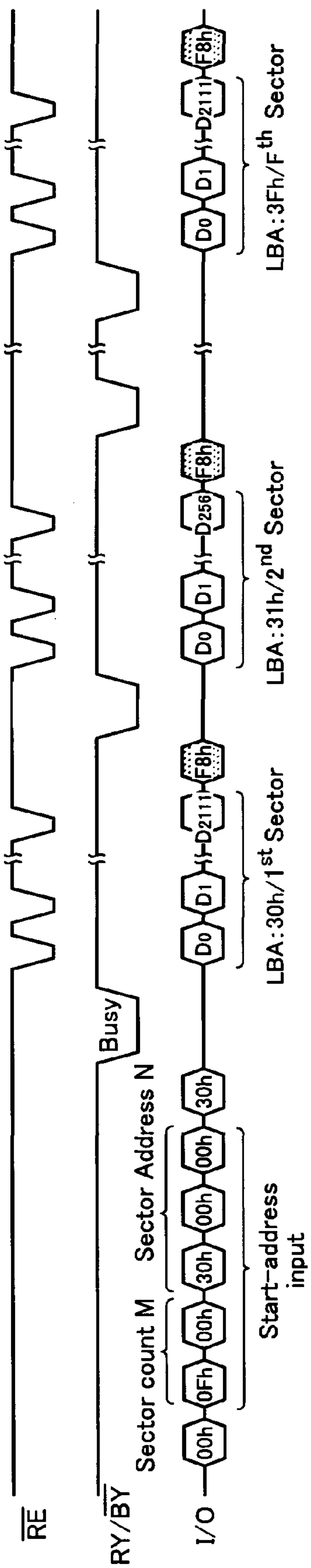
FIG. 40 is a timing diagram of read access in a MDA mode of an optional read type B(4).

FIG. 40 is a timing diagram of the case where a continuation command <F8h> is used to continue the read operation similarly and the same continuation command <F8h> to execute an interruption to skip the data read operation. In this example, one sector includes data D0-D2112 of 2112 Bytes. During the second sector read, a continuation command <F8h> is input just when data D0-D256 is read out, thereby skipping the data read operation.

Read accesses using optional read styles C in the MDA access mode are described next with reference to FIGS. 41-44.

Figure 41:
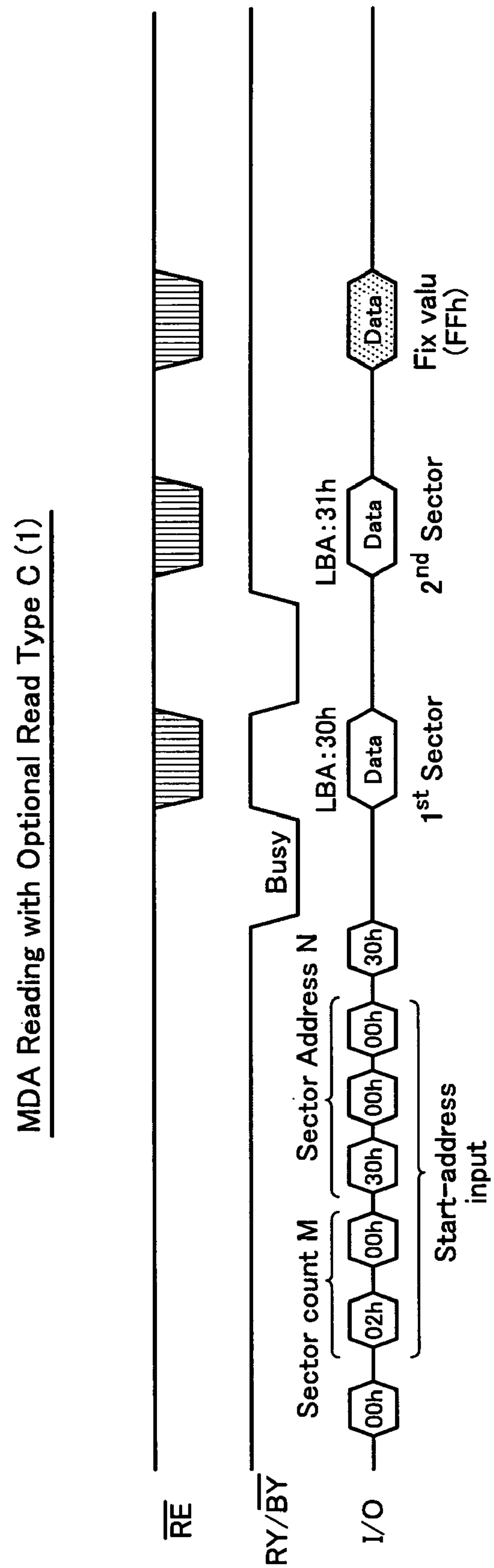
FIG. 41 is a timing diagram of read access in a MDA mode of an optional read type C(1).

FIGS. 41-44 are timing diagrams of the case where a read operation is continued without locating a command cycle per read operation on a sector basis. FIG. 41 shows an example to successively execute data read only with the read enable /RE and output a fixed value <FFh> when the /RE input exceeds the number of output requests. The LBA-NAND memory outputs the fixed value and waits for a termination command sent from the host.

Figure 42:
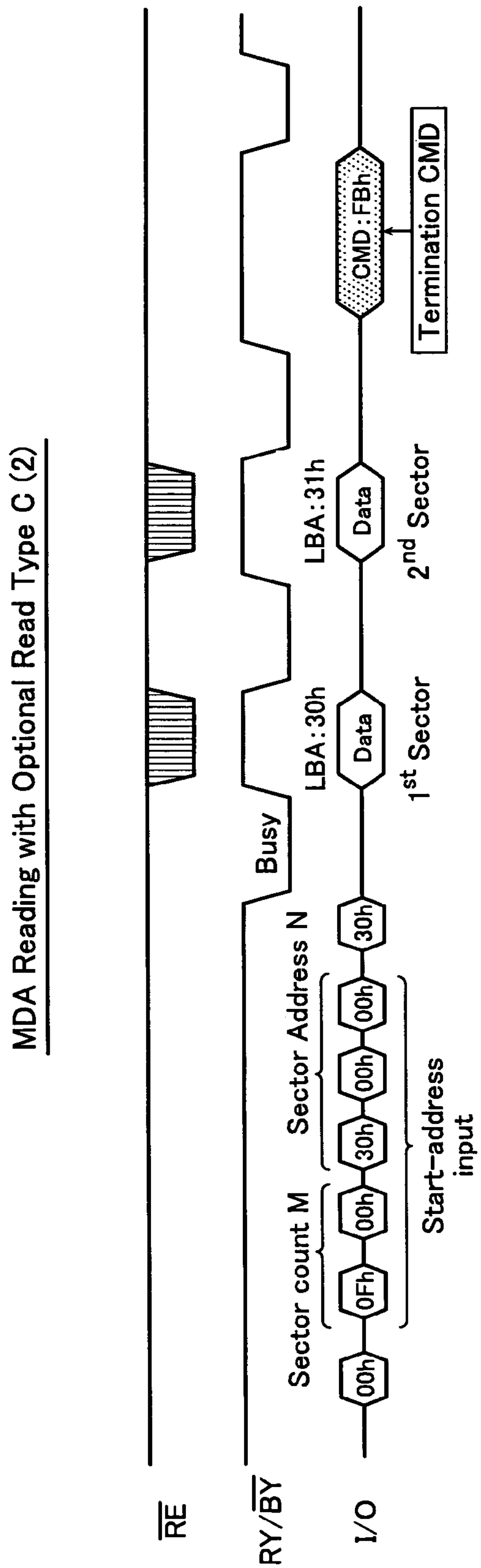
FIG. 42 is a timing diagram of read access in a MDA mode of an optional read type C(2).

FIG. 42 is a timing diagram of the case where a termination command <FBh> is applied to terminate the read operation in the same read operation as in FIG. 41.

Figure 43:
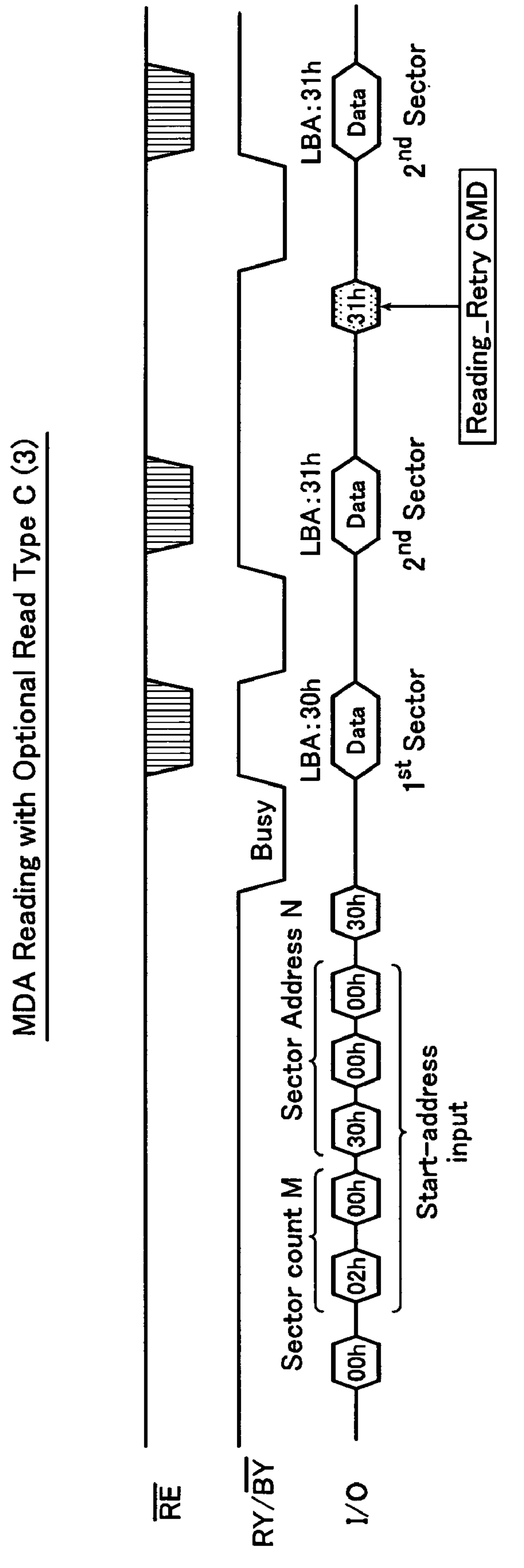
FIG. 43 is a timing diagram of read access in a MDA mode of an optional read type C(3).

FIG. 43 is a timing diagram of the case where the host detects a data transfer error, then issues a data transfer retry command <31h>, and resends the same data, for example, in the same read operation as in FIG. 41.

Figure 44:
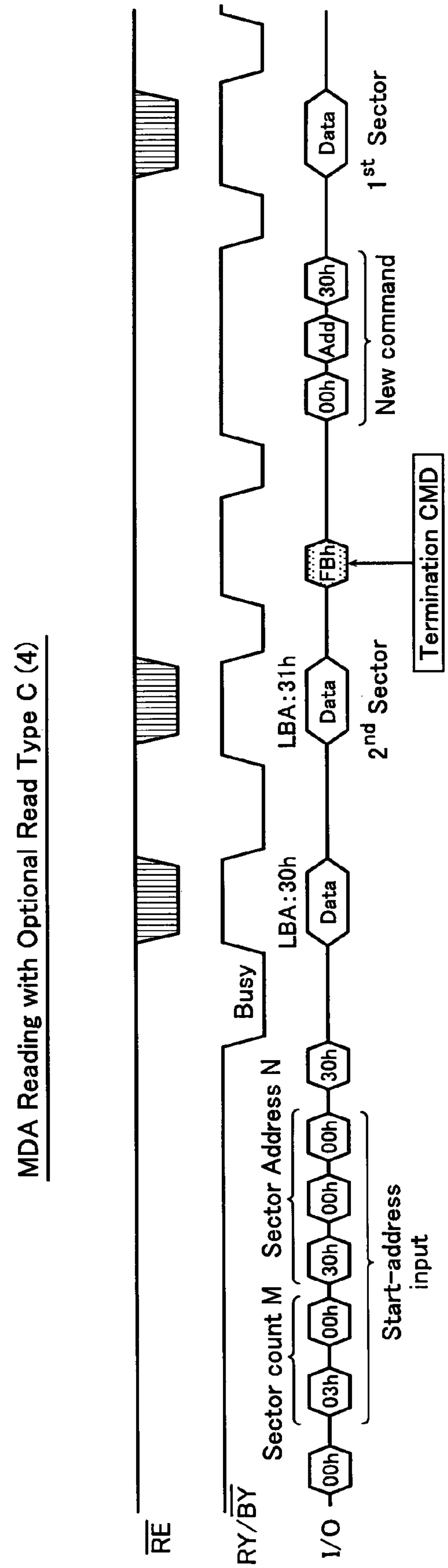
FIG. 44 is a timing diagram of read access in a MDA mode of an optional read type C(4).

FIG. 44 is a timing diagram of the case where a termination command <FBh> is applied to terminate the read operation once and a new command is issued to execute the read operation again in the same read operation as in FIG. 41.

Figure 45:
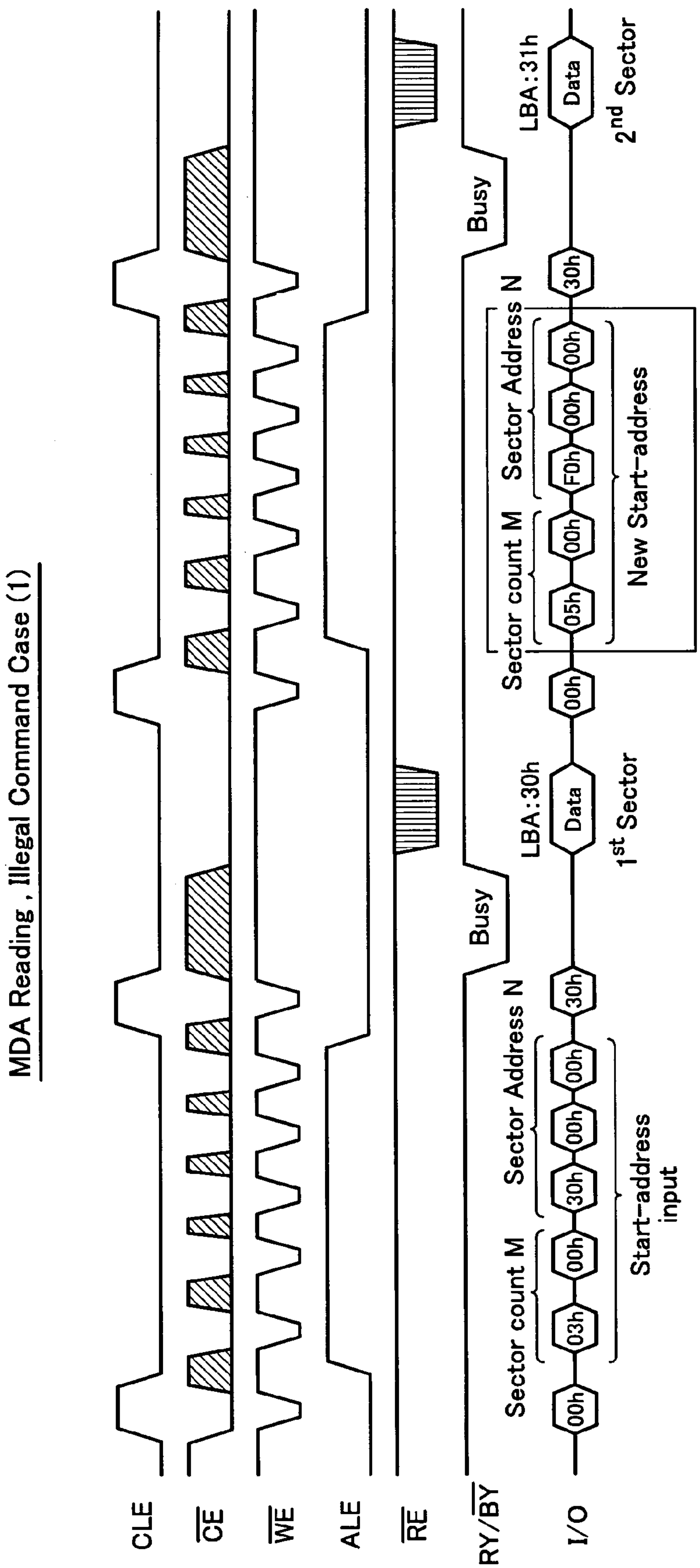
FIG. 45 is a timing diagram of read in a MDA mode when an illegal access occurs (Case 1).
Figure 46:
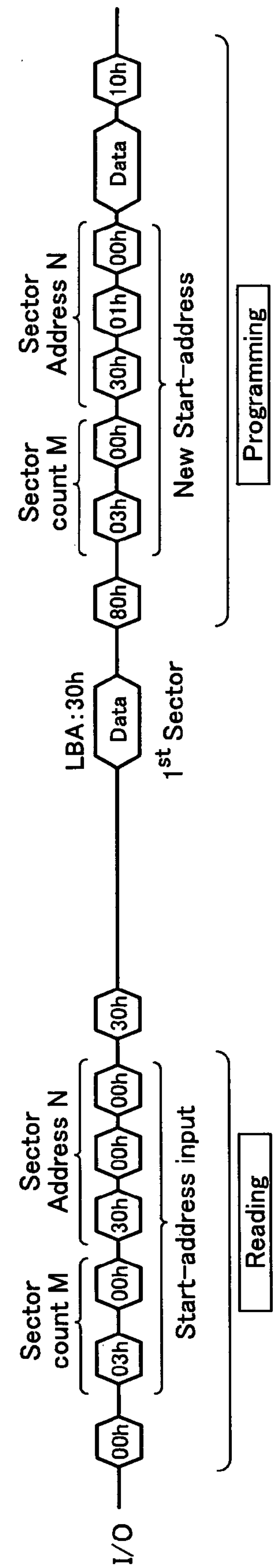
FIG. 46 is a timing diagram of read in a MDA mode when an illegal access occurs (Case 2).

FIGS. 45 and 46 are timing diagrams of read in the MDA access mode when an illegal access occurs during the read operation. The VFA access mode and the PNA access mode have same provisions for this illegal access.

FIG. 45 is related to the case where a new command is input during execution of the read command without terminating the command. In this example, after the sector data at LBA=30h is read, a new command and a new address are input. In this case, the new address is treated as a dummy and read is continuously executed in accordance with the previously input address.

FIG. 46 is related to the case where a new write command is input during execution of the read command without terminating the command. In this example, the previous read command is terminated automatically to validate the write command.

In the case of a sector multiple of SM=4 or 8, to terminate read and make a shift to the next at the stage less than the sector count, it is required to issue a termination command.

[MDA Access Mode . . . for Write]

Examples of the write timing in the MDA access mode are described next.

Figure 47:
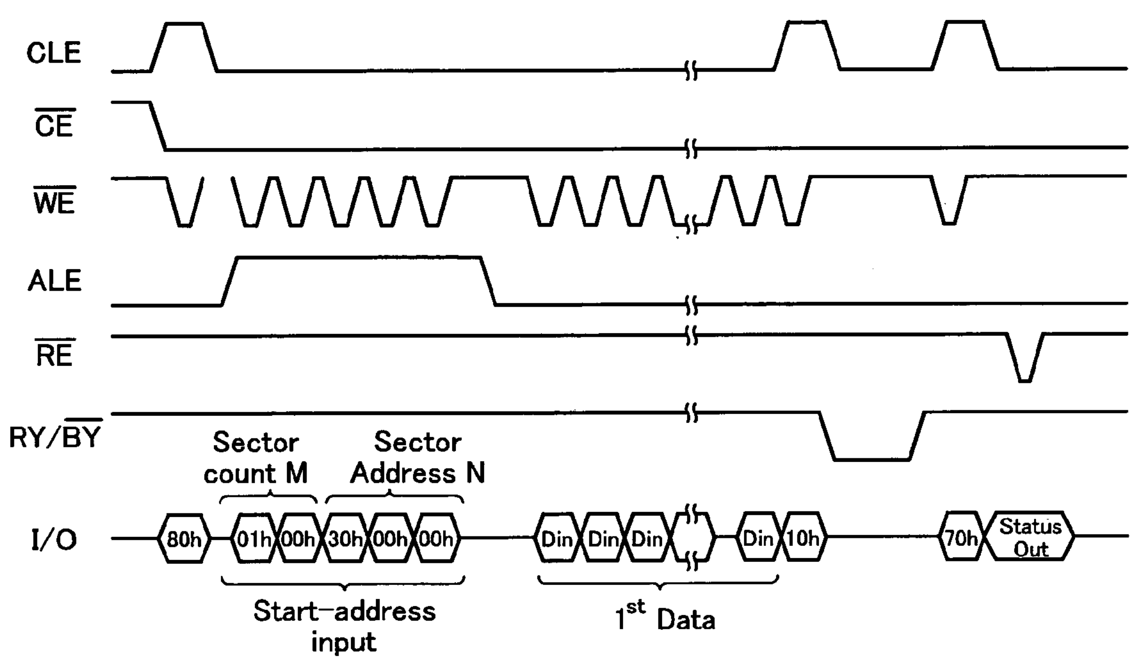
FIG. 47 is a timing diagram of write access in a MDA mode (in the case of 1 sector).

FIG. 47 is a timing diagram of one sector write in the MDA access mode. A write command and a write address (that is, a sector count=1 and a sector address) are input, and write data of one sector is input and written into the NAND flash memory. During write, Busy is output to the host.

After completion of write, the input of a status read command <70h> allows status data to be read out.

Figure 48:
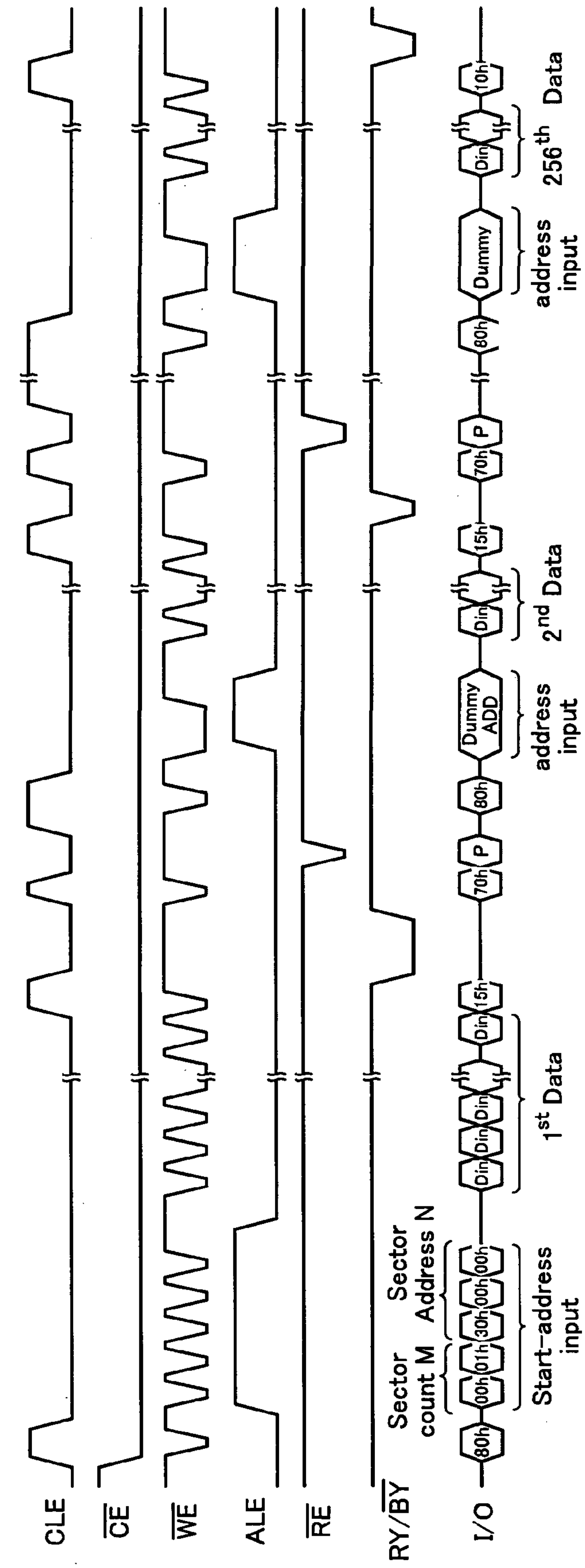
FIG. 48 is a timing diagram of write access in a MDA mode (in the case of 256 sectors).

FIG. 48 is a timing diagram of the case where the same start logical address LBA=30h is used to successively write 256 sectors that are set using the sector count. After the pass of each sector write is confirmed from status data (“P”), dummy address and write data inputs are repeated for successive write to the 256th sector.

Figure 49:
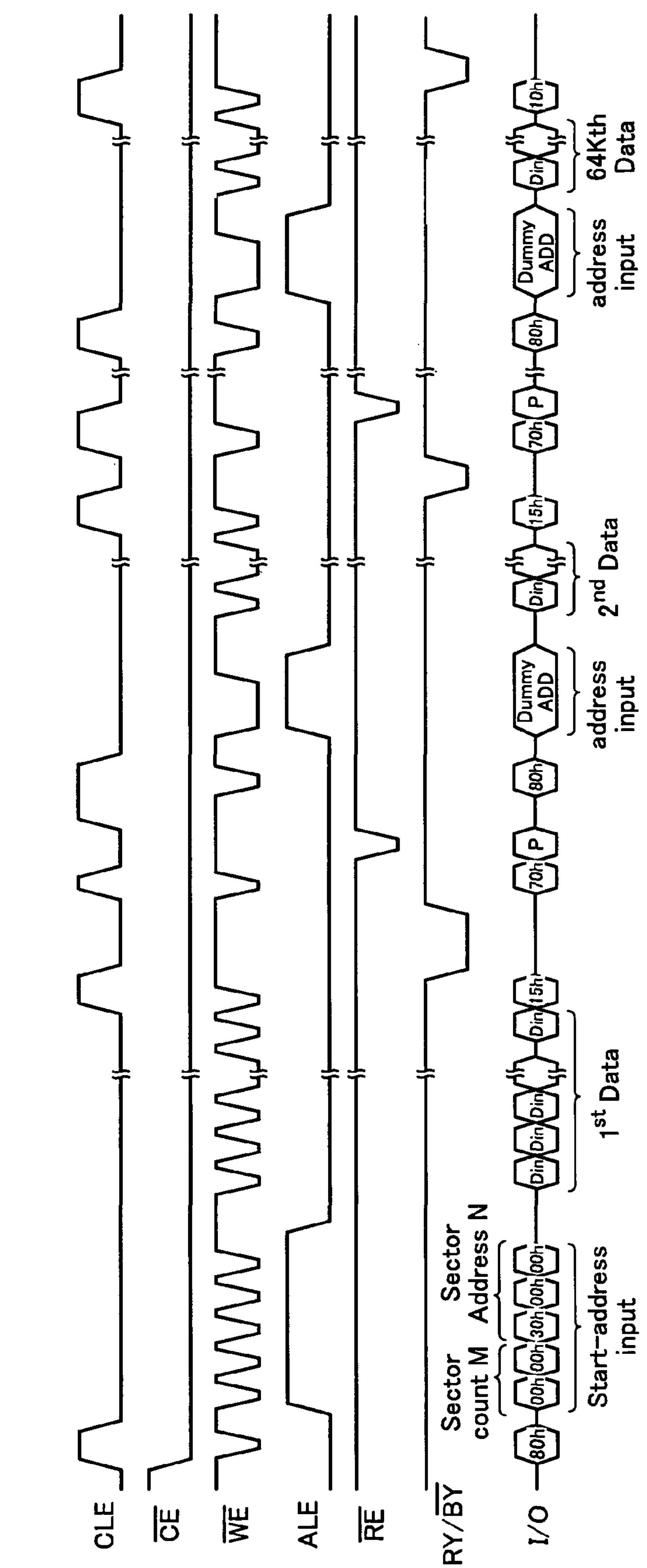
FIG. 49 is a timing diagram of write access in a MDA mode (in the case of 64K sectors).

FIG. 49 is a timing diagram of similar successive write to the 64K sector with dummy address inputs.

Figure 50:
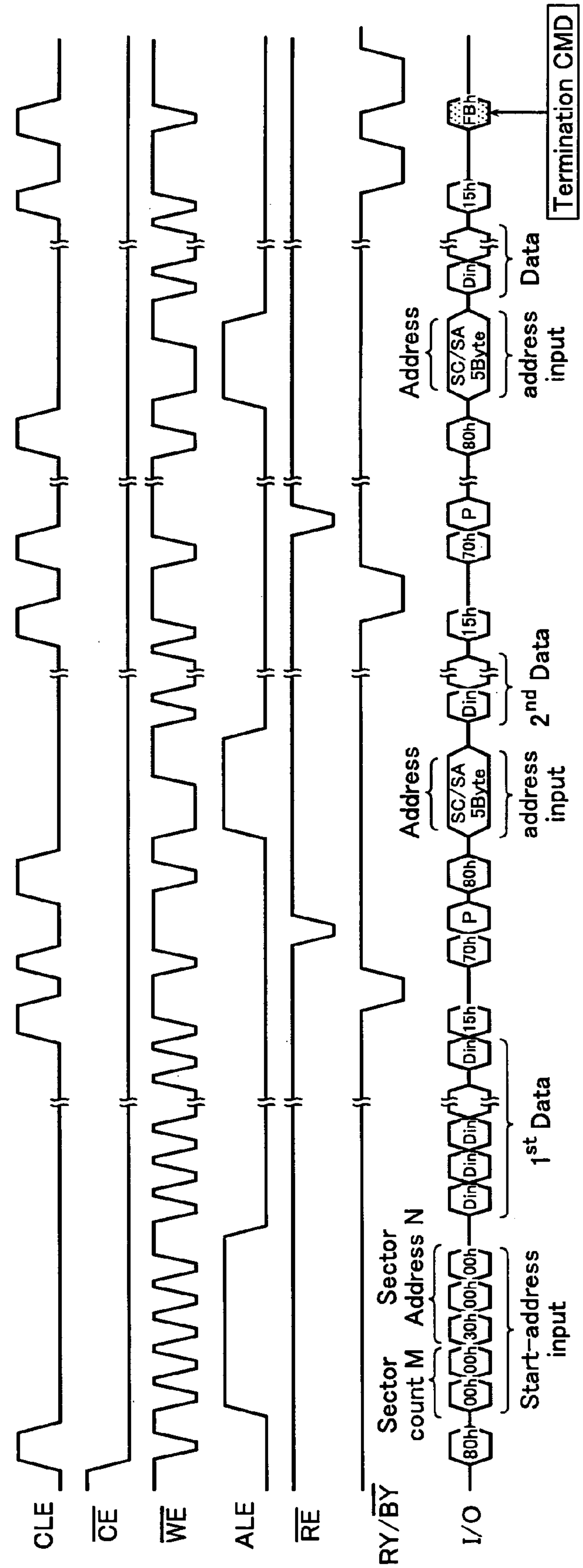
FIG. 50 is a timing diagram of write access in a MDA mode to be interrupted using a termination command.

FIG. 50 is related to the case where a termination command <FBh> is input at the ready state (Ready) during a write sequence that is started from the start address LBA=30h, thereby forcing termination of the write sequence.

Figure 51:
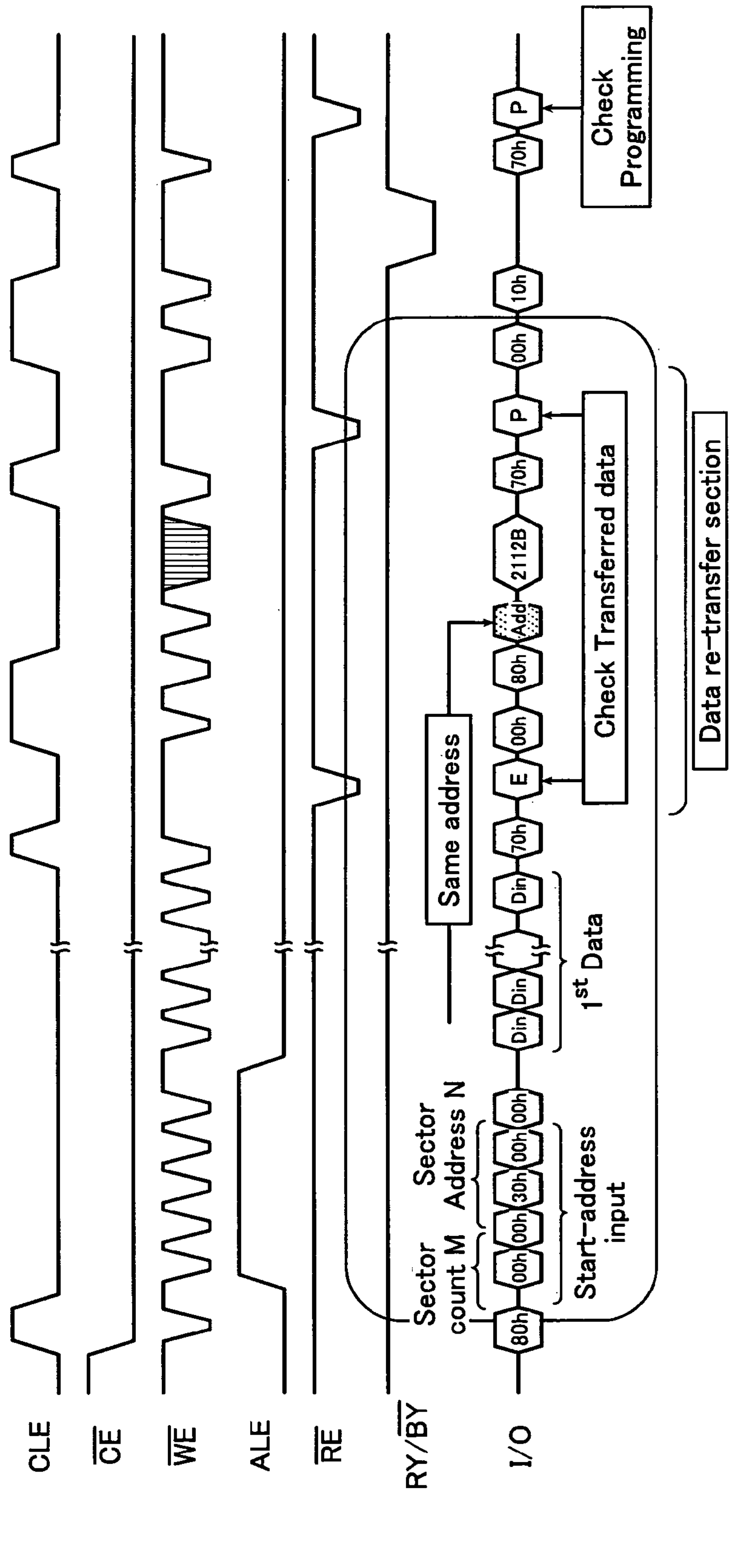
FIG. 51 is a timing diagram of write access in a MDA mode with data retransfer.

FIG. 51 is a timing diagram of recommended processing when the status of the write command indicates a write error (“E”). If the write error is an ECC-uncorrectable one, the same address is input again as shown to execute retransfer.

As shown in FIG. 52, pieces of write status information are assigned to I/O ports and classified as four cases of Pass, ECC-correctable transfer error, ECC-uncorrectable transfer error, and write-failed. Therefore, determination of this makes it possible to select execution of data rewrite or termination of the write sequence.

Figure 53:
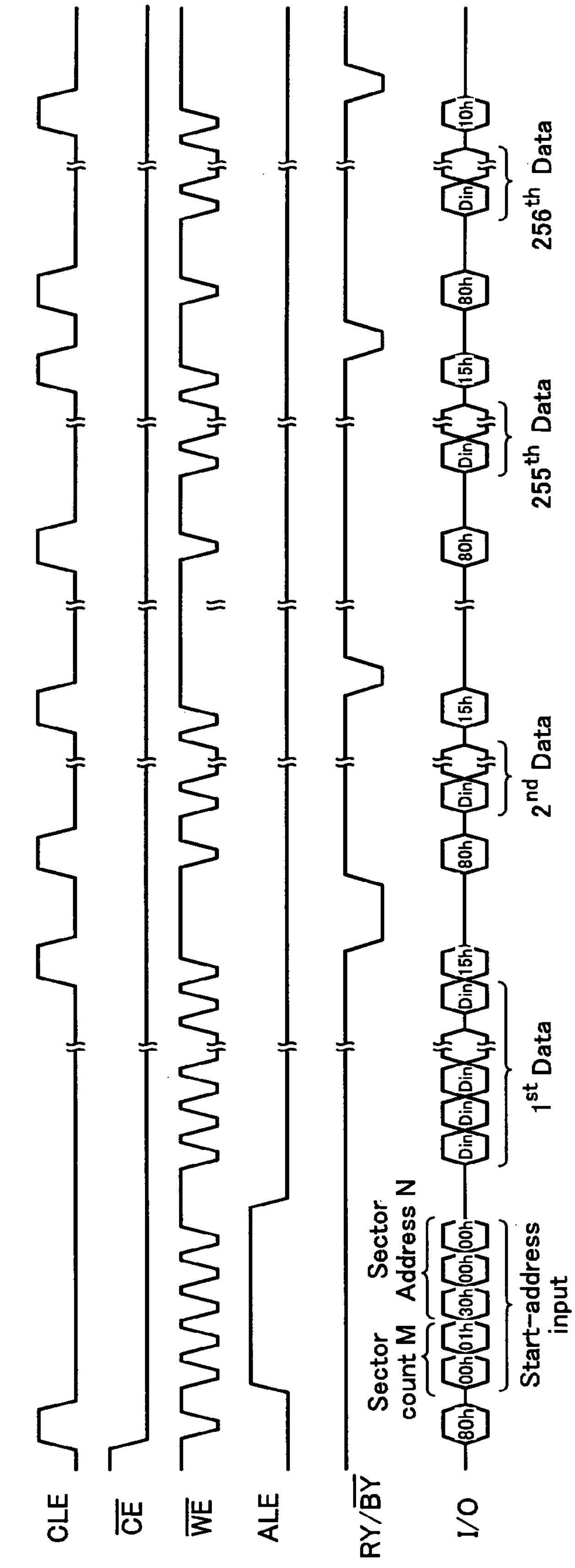
FIG. 53 is a timing diagram of MDA mode write of an optional write type.

FIG. 53 is a timing diagram of an optional write style that enables write to be continued with command <80h> and data inputs and without a dummy address input.

Figure 54:
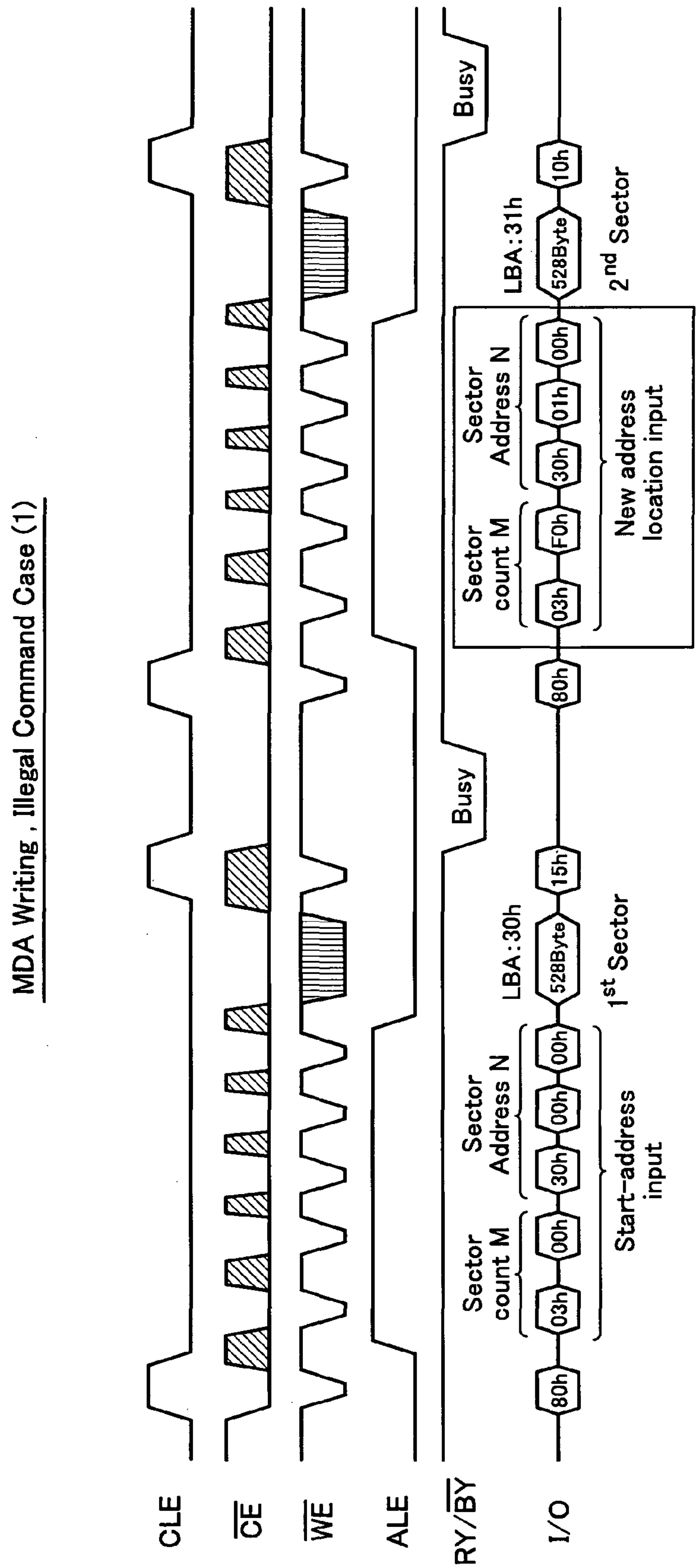
FIG. 54 is a timing diagram of MDA mode write when an illegal access occurs (Case 1).
Figure 55:
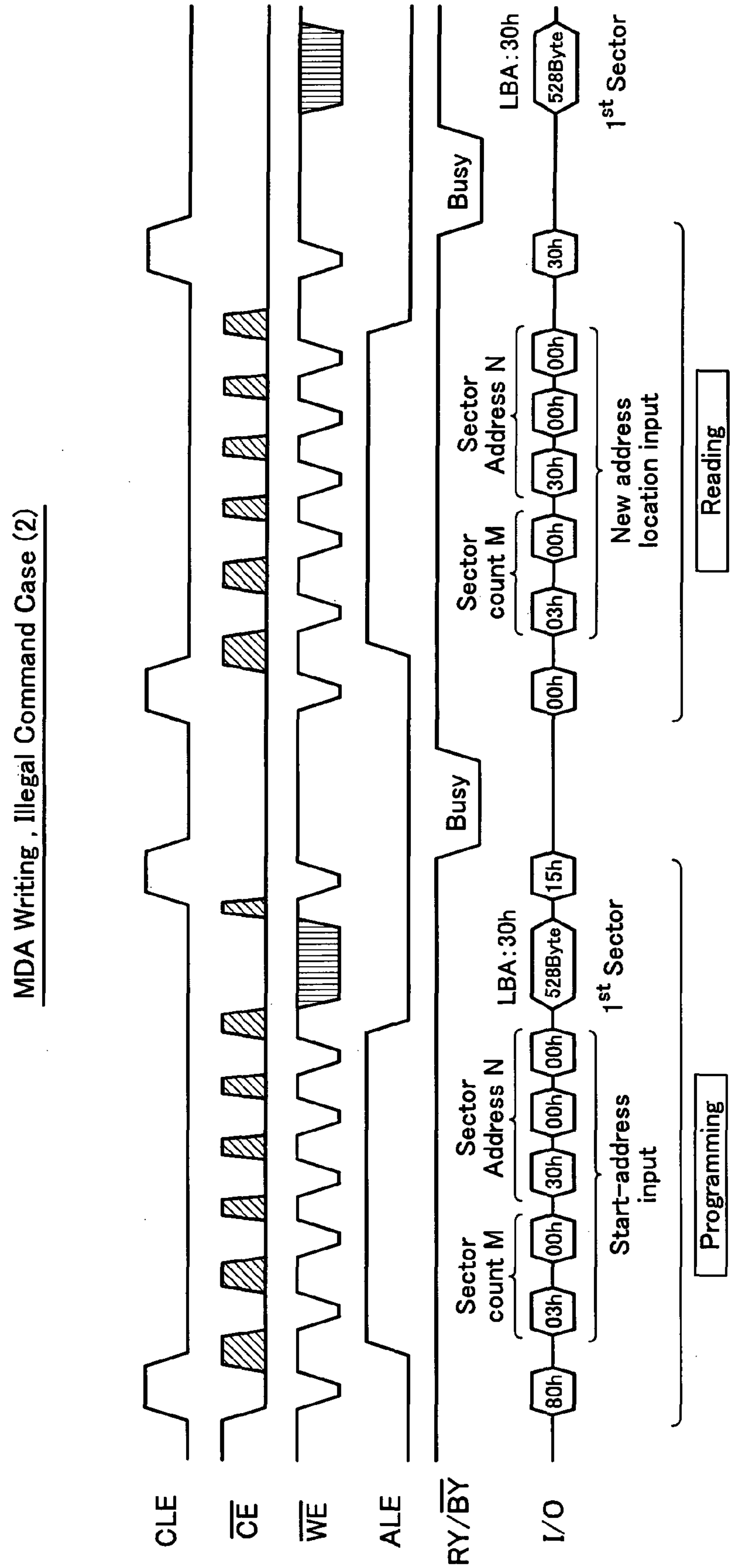
FIG. 55 is a timing diagram of MDA mode write when an illegal access occurs (Case 2).

FIGS. 54 and 55 show the cases where an illegal access occurs. The handling method for this illegal access is similarly applicable to the PNA access mode and the VFA access mode.

FIG. 54 is related to the case where, during execution of a write command, without terminating this command, a new write command and an address are input. In this case, the new input address is handled as a dummy address and accordingly the address content is neglected. Thus, write is executed to the next sector that is determined from the initially input sector count and address initial value.

FIG. 55 is related to the case where, during execution of a write command, a read command is input. In this case, the LBA-NAND memory terminates write and executes the read command.

[PNA Access Mode . . . for Read]

Of the modes for making accesses to the PNA area, or the PNA modes, a read access is described first. In the PNA access mode, the access unit has a sector length of 2 KB (=2112 Bytes), the maximum sector count of 256 sectors, and the maximum capacity of 512 KB (=540,672 Bytes).

Figure 56:
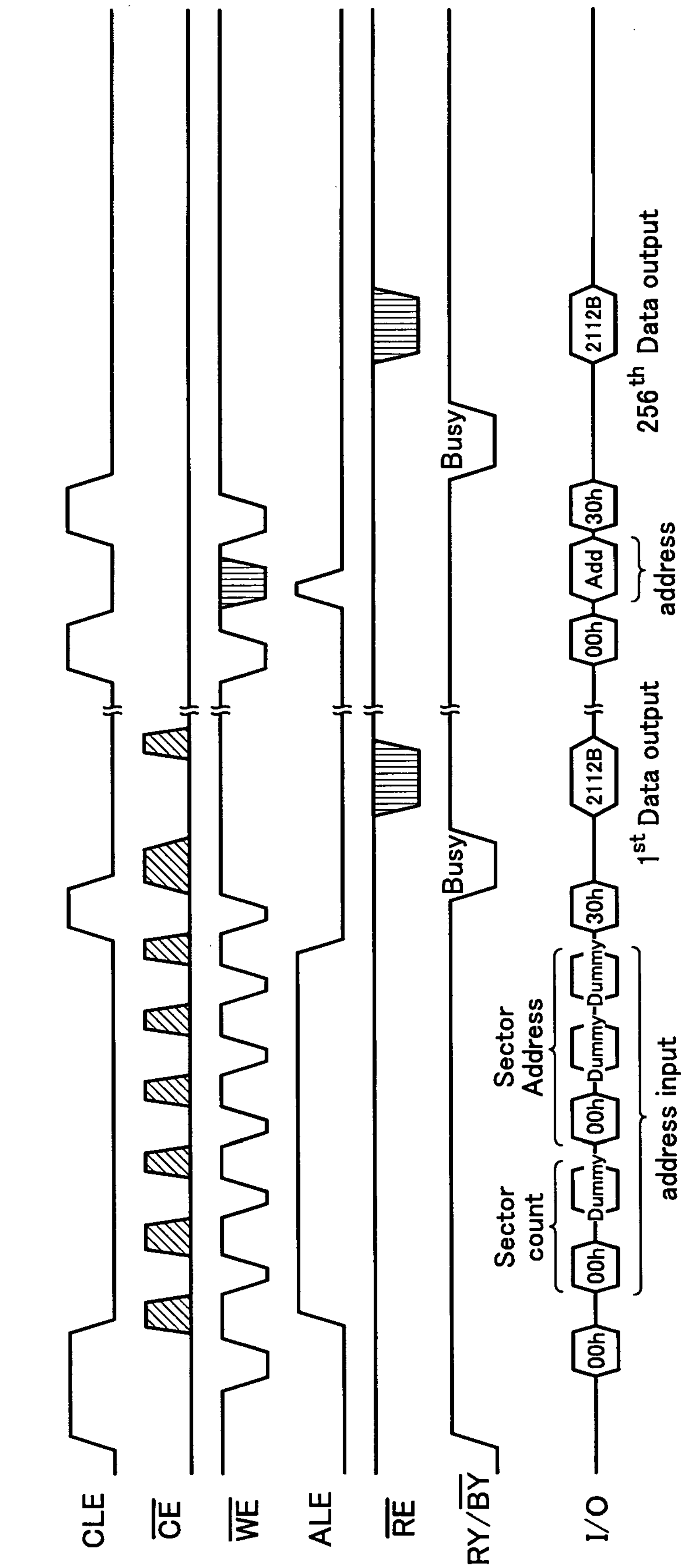
FIG. 56 is a timing diagram of read access in a PNA mode of a default type.

FIG. 56 is a timing diagram of the case where the leading address LBA=00h is input to read out 256 sectors (that is, the whole PNA area). In a sector count of 2 Bytes and a sector address of 3 bytes, only the respective first one Byte <00h> is effective and others are dummies.

Figure 57:
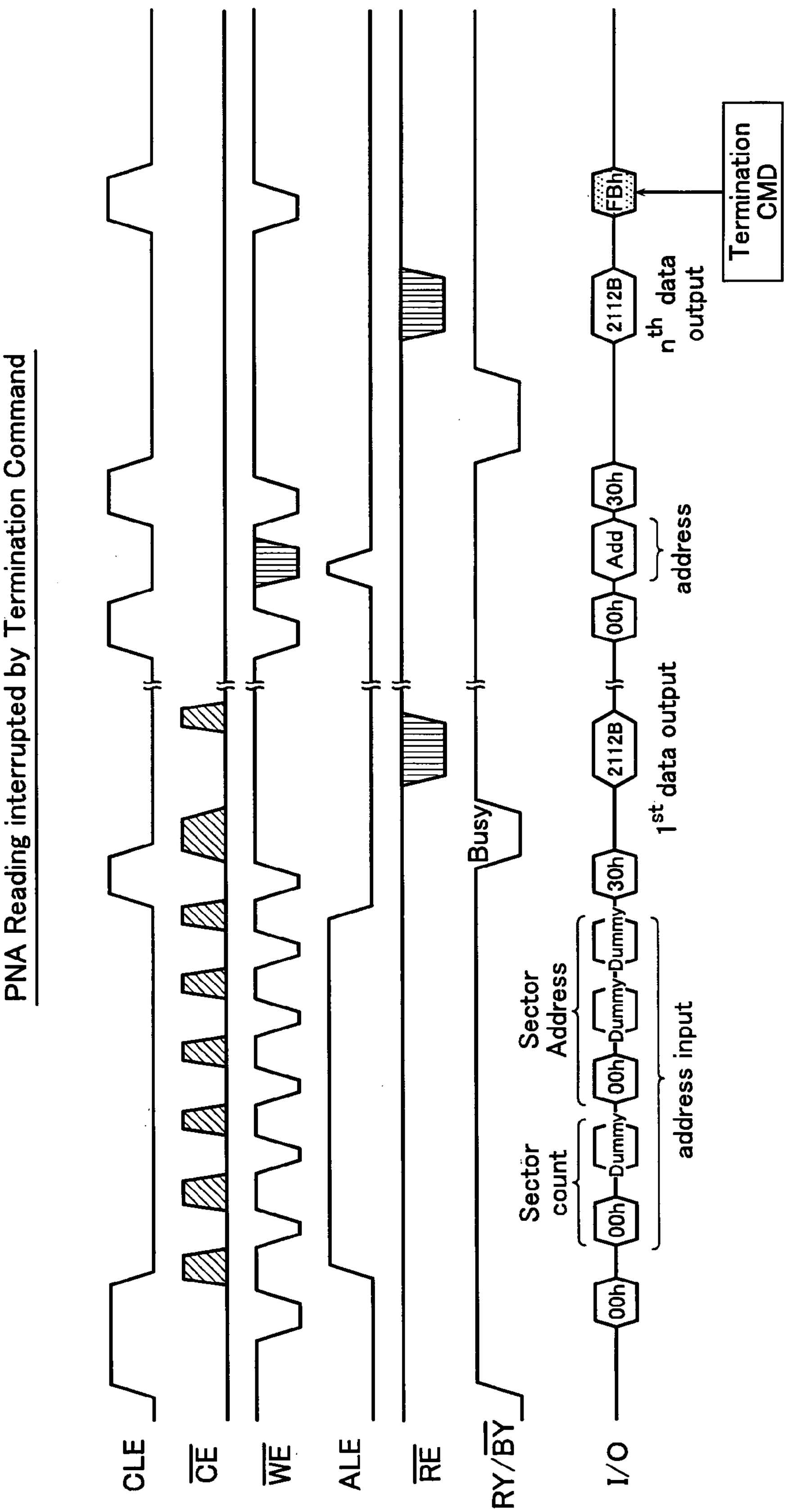
FIG. 57 is a timing diagram of read access in a PNA mode to be interrupted using a termination command.

FIG. 57 is related to the case where a termination command <FBh> is input at the state of Ready to forcibly terminate the read operation.

Figure 58:
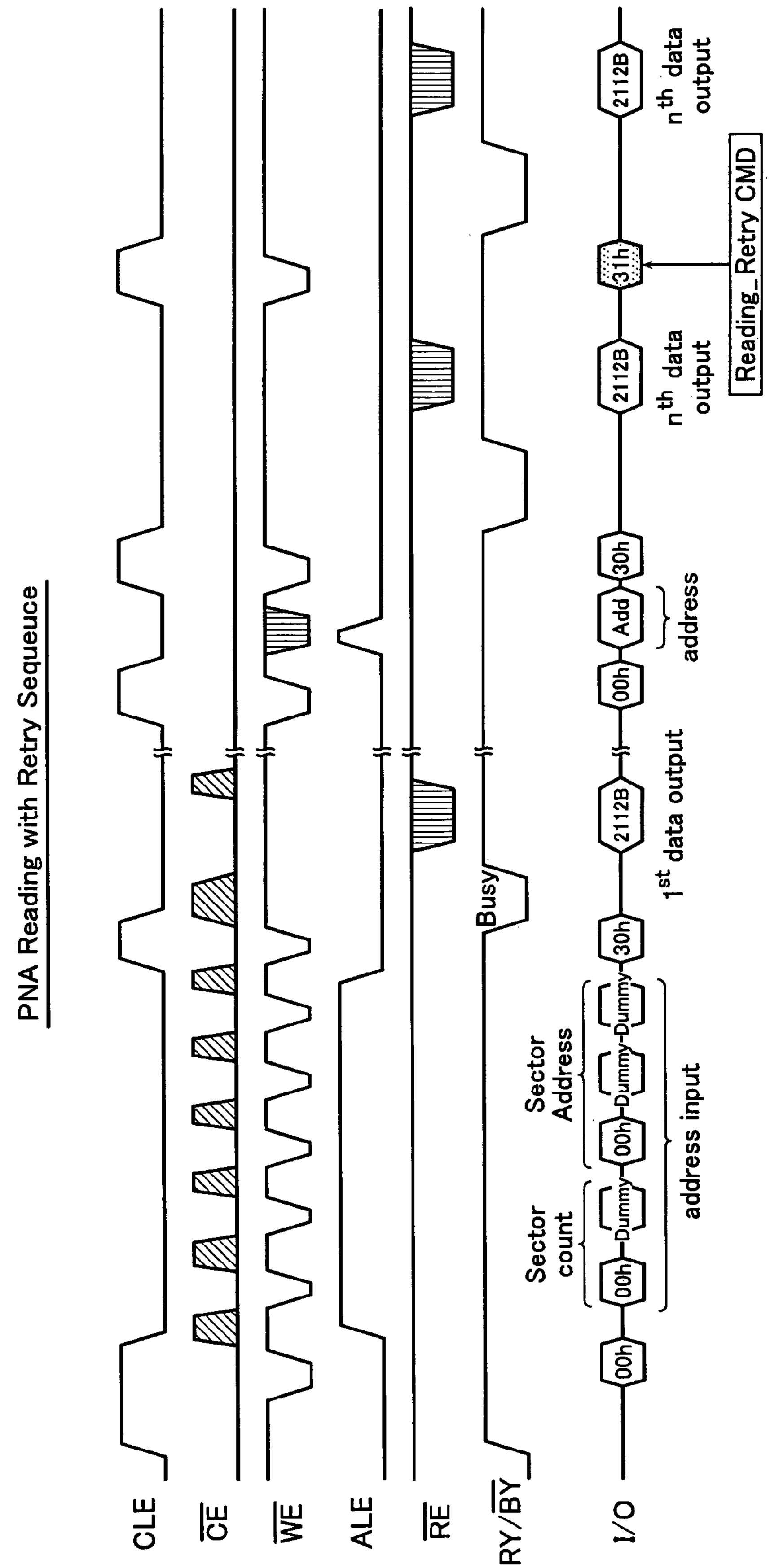
FIG. 58 is a timing diagram of read access in a PNA mode with reread.

FIG. 58 is related to the case where a read retry command <31h> is input at the state of Ready to output the immediately preceding read data once again.

FIGS. 59-65 show optional read styles in the PNA access mode. Among those, FIGS. 59-62 are related to the case where a transfer protocol setting command is applied to set a read type B, that is, a continuation command <F8h> is used to continue the read operation.

Figure 59:
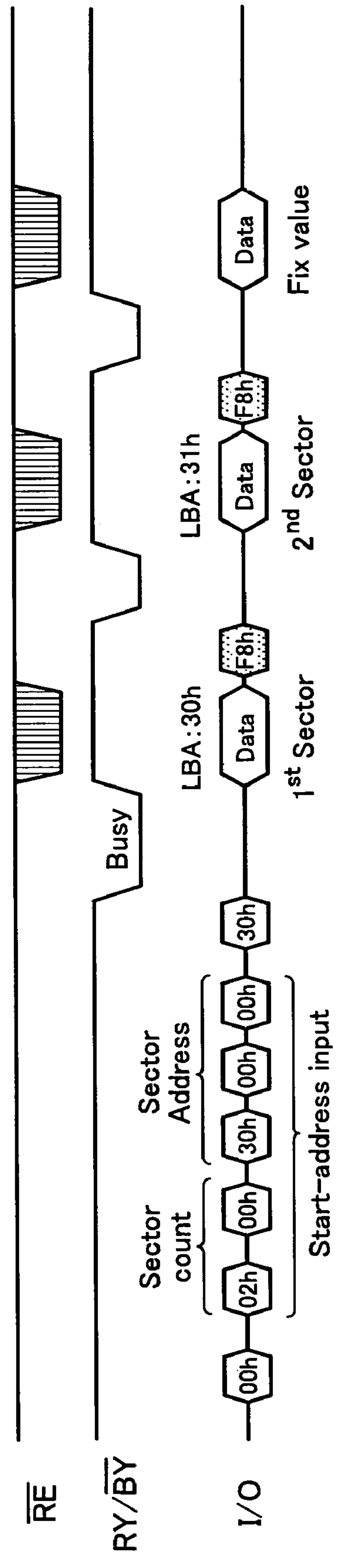
FIG. 59 is a timing diagram of read access in a PNA mode of an optional read type B(1).

In FIG. 59, a continuation command <F8h> is input after each sector data read to continue the read operation. If continuation command clocks are input over the number of output requests (sector count), a fixed value <FFh> is output. If the LBA-NAND memory outputs the fixed value, the host sends a termination command to terminate the command.

Figure 60:
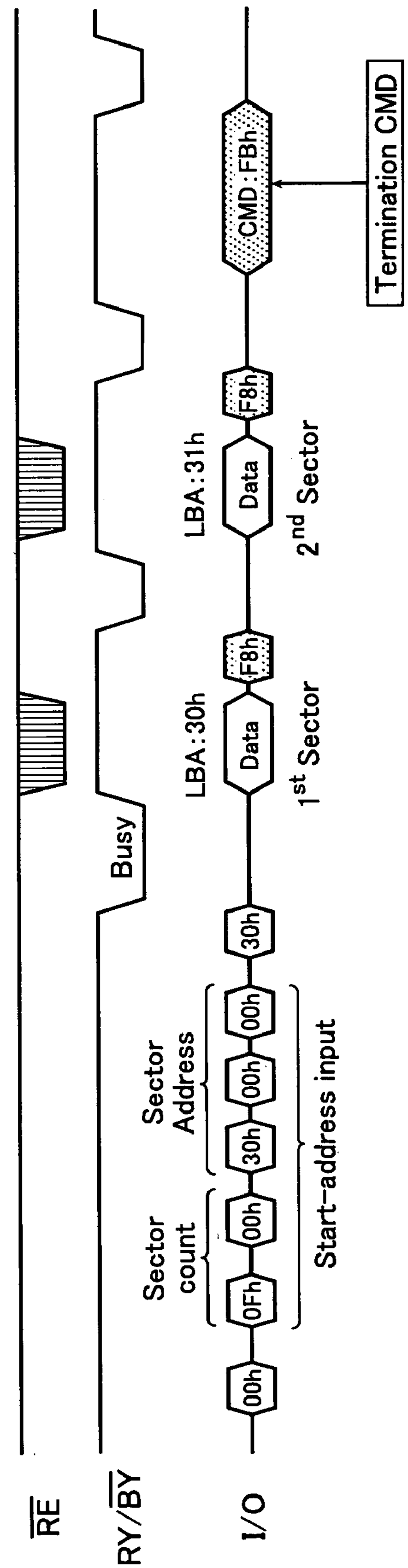
FIG. 60 is a timing diagram of read access in a PNA mode of an optional read type B(2).

FIG. 60 is a timing diagram of the case where a continuation command <F8h> is used to continue the read operation similarly and a termination command <FBh> to terminate the continued read operation.

Figure 61:
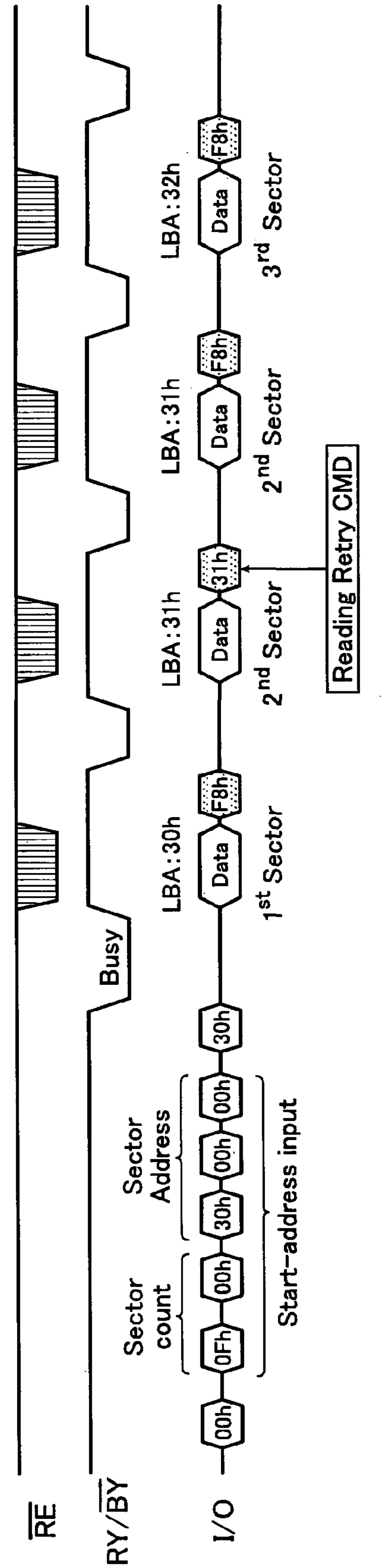
FIG. 61 is a timing diagram of read access in a PNA mode of an optional read type B(3).

FIG. 61 is a timing diagram of the case where a continuation command <F8h> is used to continue the read operation similarly and a retry command <31h> is input to retransfer the same sector data as that in immediately preceding read.

Figure 62:
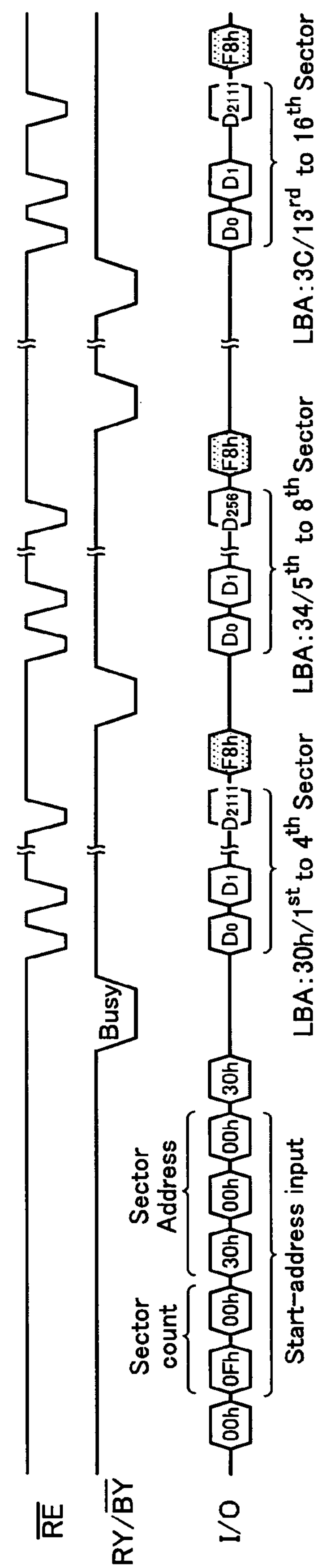
FIG. 62 is a timing diagram of read access in a PNA mode of an optional read type B(4).

FIG. 62 is a timing diagram of the case where a continuation command <F8h> is used to continue the read operation similarly and the same continuation command <F8h> to execute an interruption to skip the data read operation. In this example, one sector includes data D0-D2112 of 2112 Bytes. During the second sector read, a continuation command <F8h> is input just when data D0-D256 has been read out, thereby skipping the data read operation.

Figure 63:
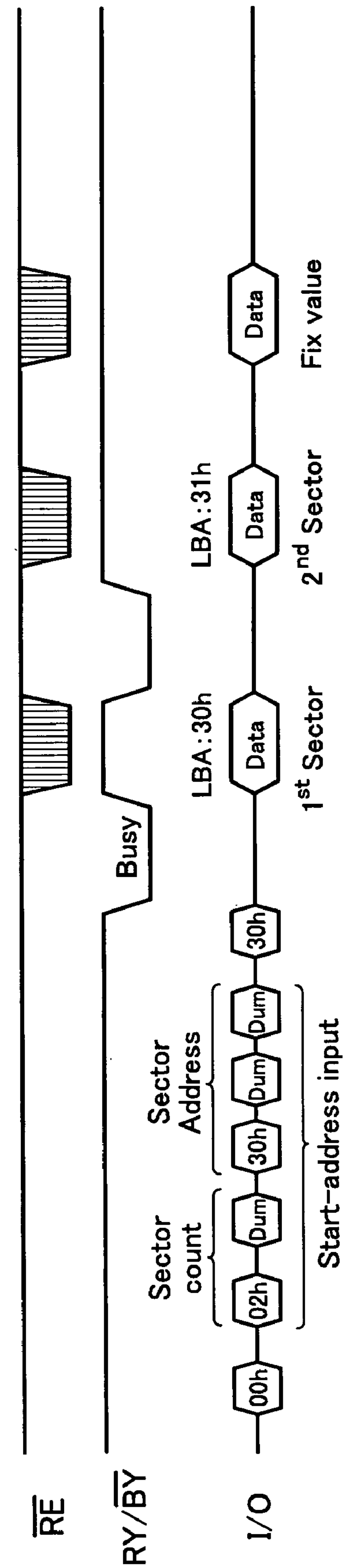
FIG. 63 is a timing diagram of read access in a PNA mode of an optional read type C(1).
Figure 64:
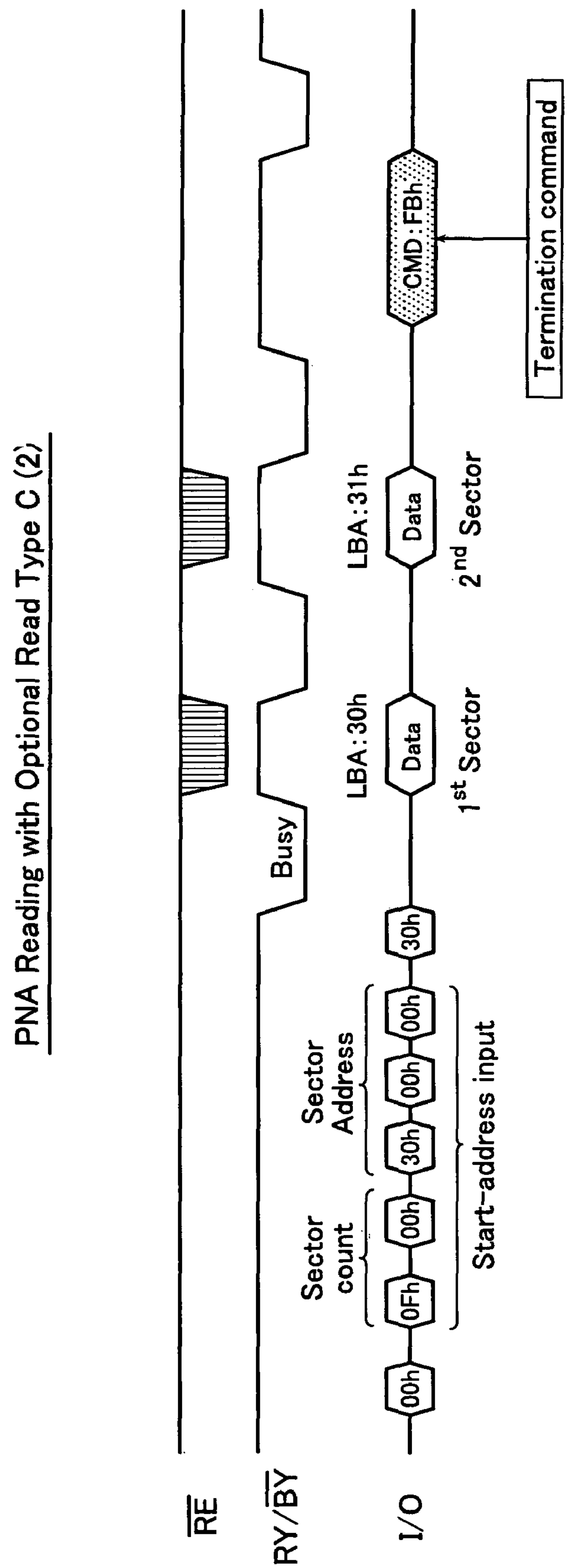
FIG. 64 is a timing diagram of read access in a PNA mode of an optional read type C(2).
Figure 65:
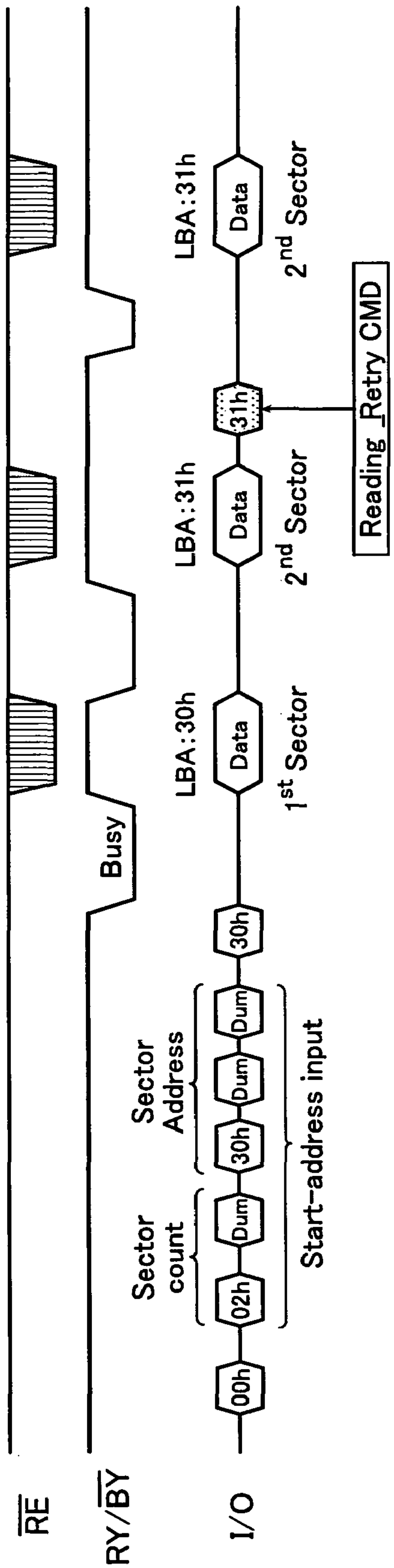
FIG. 65 is a timing diagram of read access in a PNA mode of an optional read type C(3).

FIGS. 63-65 are related to the case where a transfer protocol setting command is applied to set a read type C, that is, the read operation is continued without the use of a continuation command <F8h>.

In FIG. 63, sector data read is successively repeated, sandwiching a busy state signal therebetween. In the case of over the sector count, a fixed value <FFh> is output. In this case, the LBA-NAND memory outputs the fixed value, and the host sends a termination command to terminate the command.

FIG. 64 is a timing diagram of the case where the similar read type C is applied to continue the read operation and a termination command <FBh> is used to terminate the continued read operation.

FIG. 65 is a timing diagram of the case where the similar read type C is applied to continue the read operation and a retry command <31h> is input to retransfer the same sector data as that in immediately preceding read.

[PNA Access Mode . . . for Write]

Write timings of the PNA access mode are described next.

Figure 66:
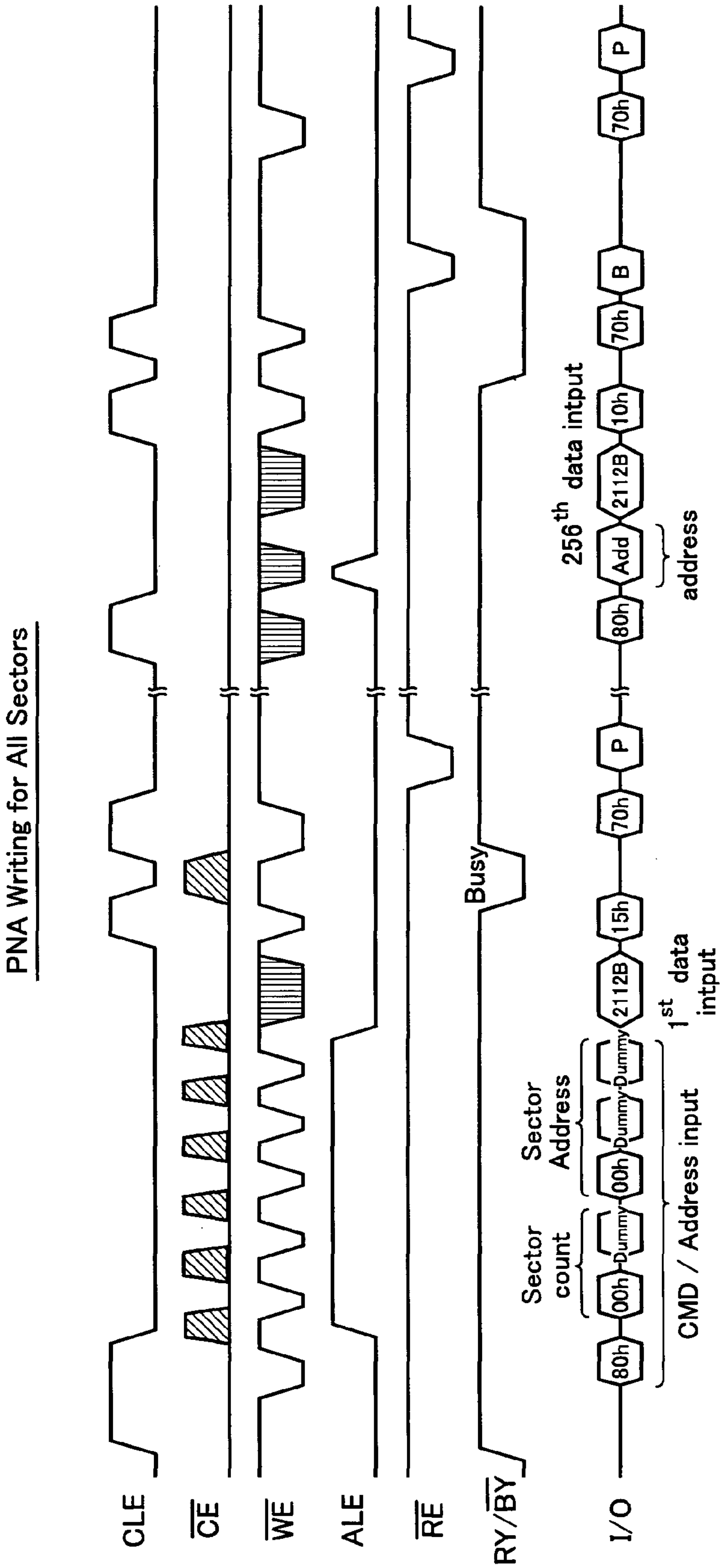
FIG. 66 is a timing diagram of read access in a PNA mode.

FIG. 66 is a timing diagram of the case where the leading address LBA=00h is input to execute write to all sectors (256 sectors) in the PNA area. After identification of write verify pass ("P"), dummy addresses are input together with write data to execute successive write.

Figure 67:
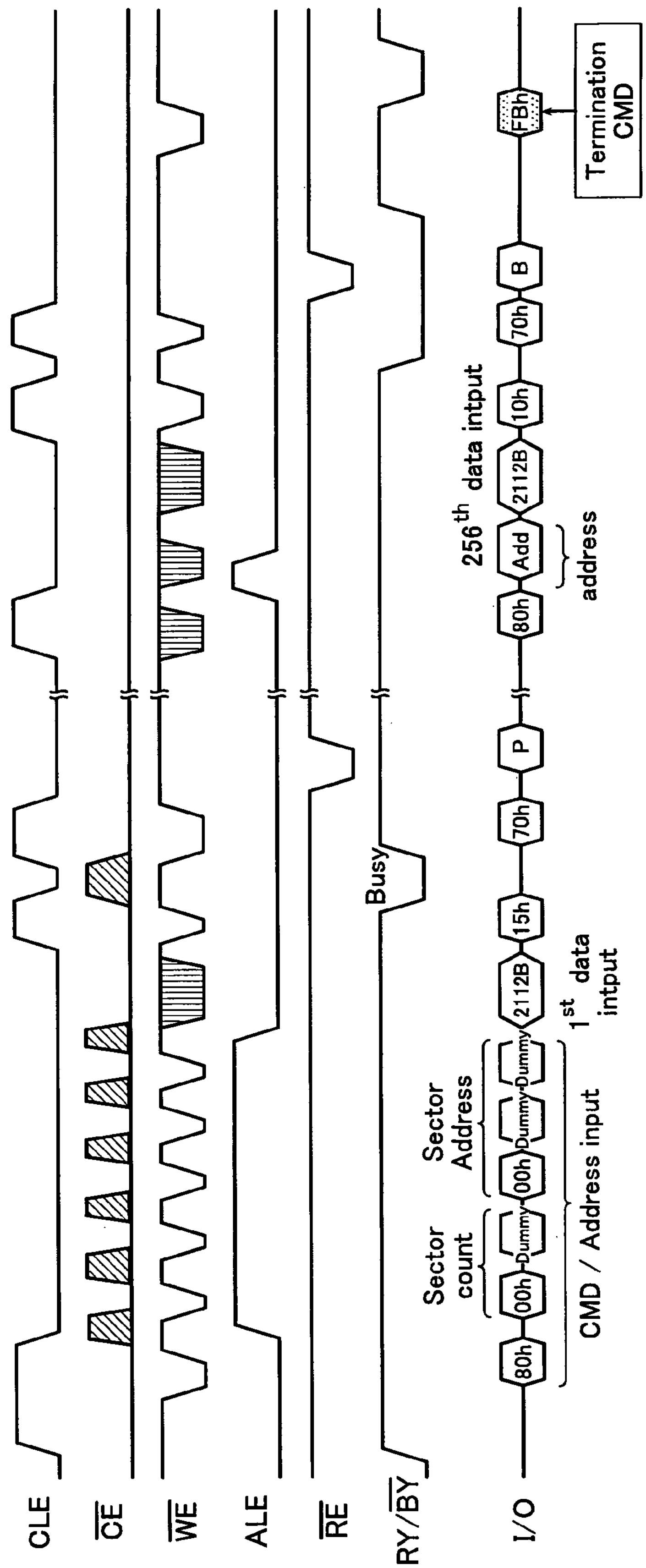
FIG. 67 is a timing diagram of write access in a PNA mode to be interrupted using a termination command.

FIG. 67 is a timing diagram of the case where a termination command <FBh> is input to forcibly terminate write.

Figure 68:
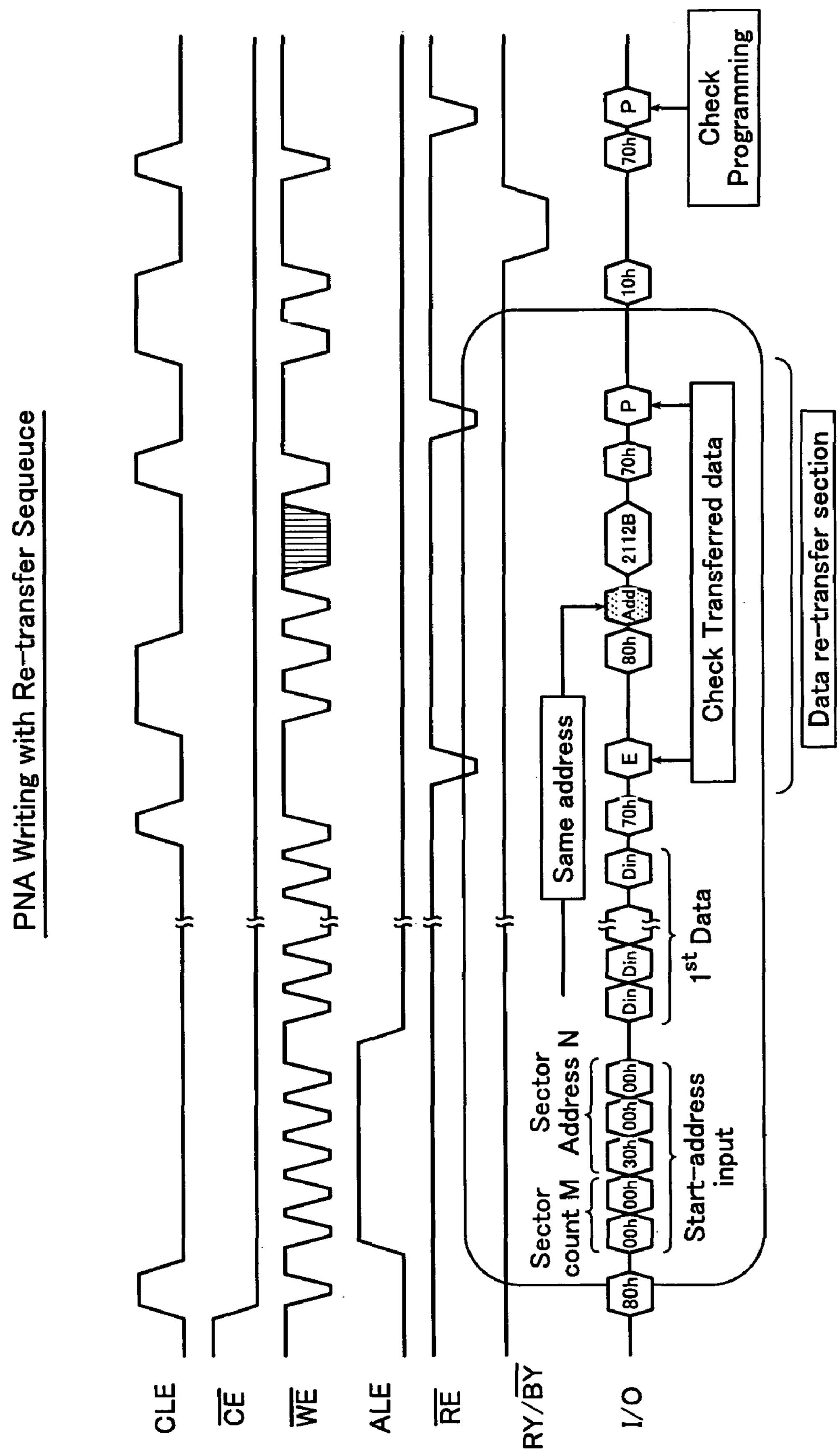
FIG. 68 is a timing diagram of write access in a PNA mode on data retransfer associated with a transfer error.

FIG. 68 shows an example of retransfer of the same address and data for write when the host detects a write error "E".

Figure 69:
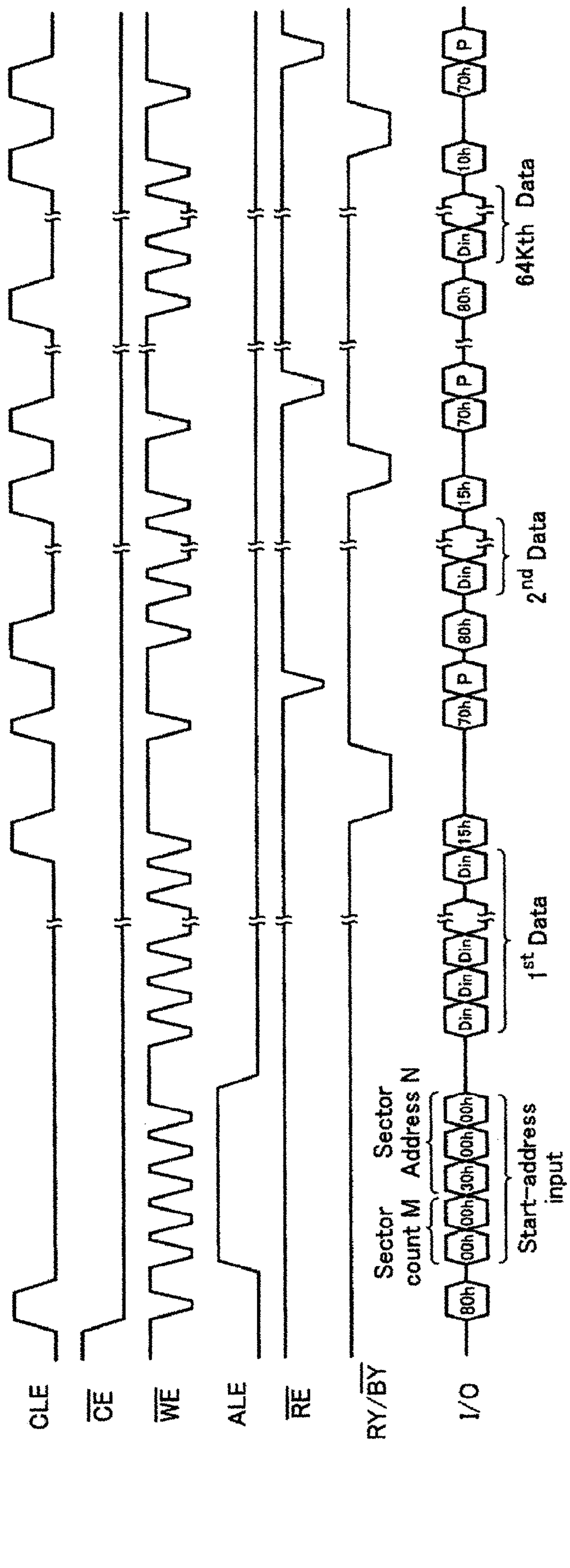
FIG. 69 is a timing diagram of write access in a PNA mode of an optional write type.

FIG. 69 is a timing diagram of write with the use of an optional write style that is set using a transfer protocol setting command. In this case, without the input of a dummy address, write data is successively input such that write data is sandwiched between busy signals to execute write to 64K sectors.

[VFA Access Mode . . . for Read]

Read timings in the VFA access mode are described next. The VFA area has a default data length of 512 Bytes (or 528 Bytes). This can be changed to 2 KB (=2112 B: Multiple=4) or 4 KB (=4224 B: Multiple=8) using a transfer protocol change command. In this case, it is possible to decide the propriety of the addition of expanded 16 Bytes, and the propriety of the adoption of an ECC function for identifying a data transfer system on the addition of the 16 Bytes.

The capacity of the VFA area can be resized using a VFA resize command.

Figure 70:
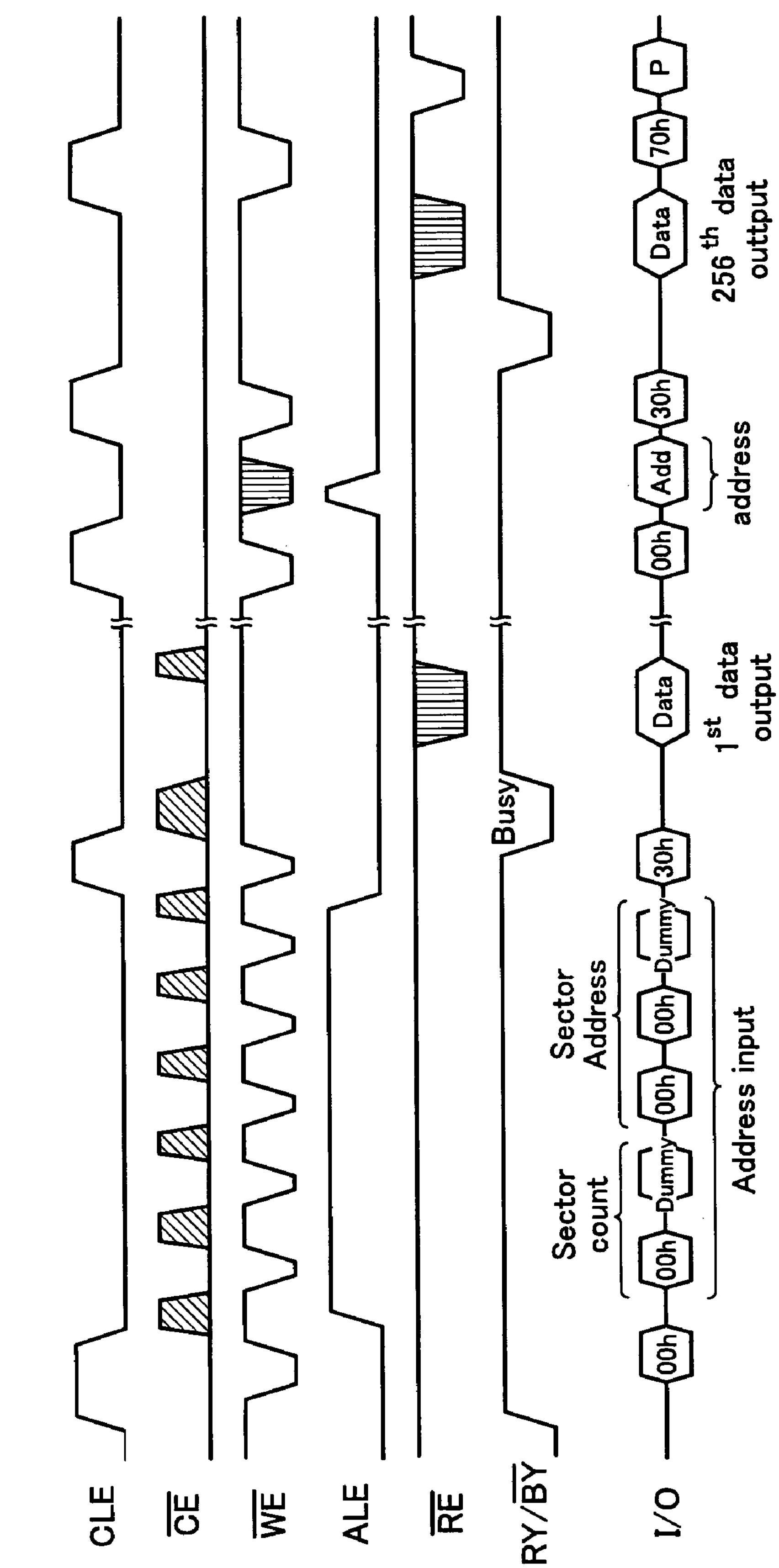
FIG. 70 is a timing diagram of write access in a VFA mode of a default write type.

FIG. 70 is a timing diagram of the case where the start address LBA=00h is input to execute read of a default read type to 256 sectors of VFA.

Figure 71:
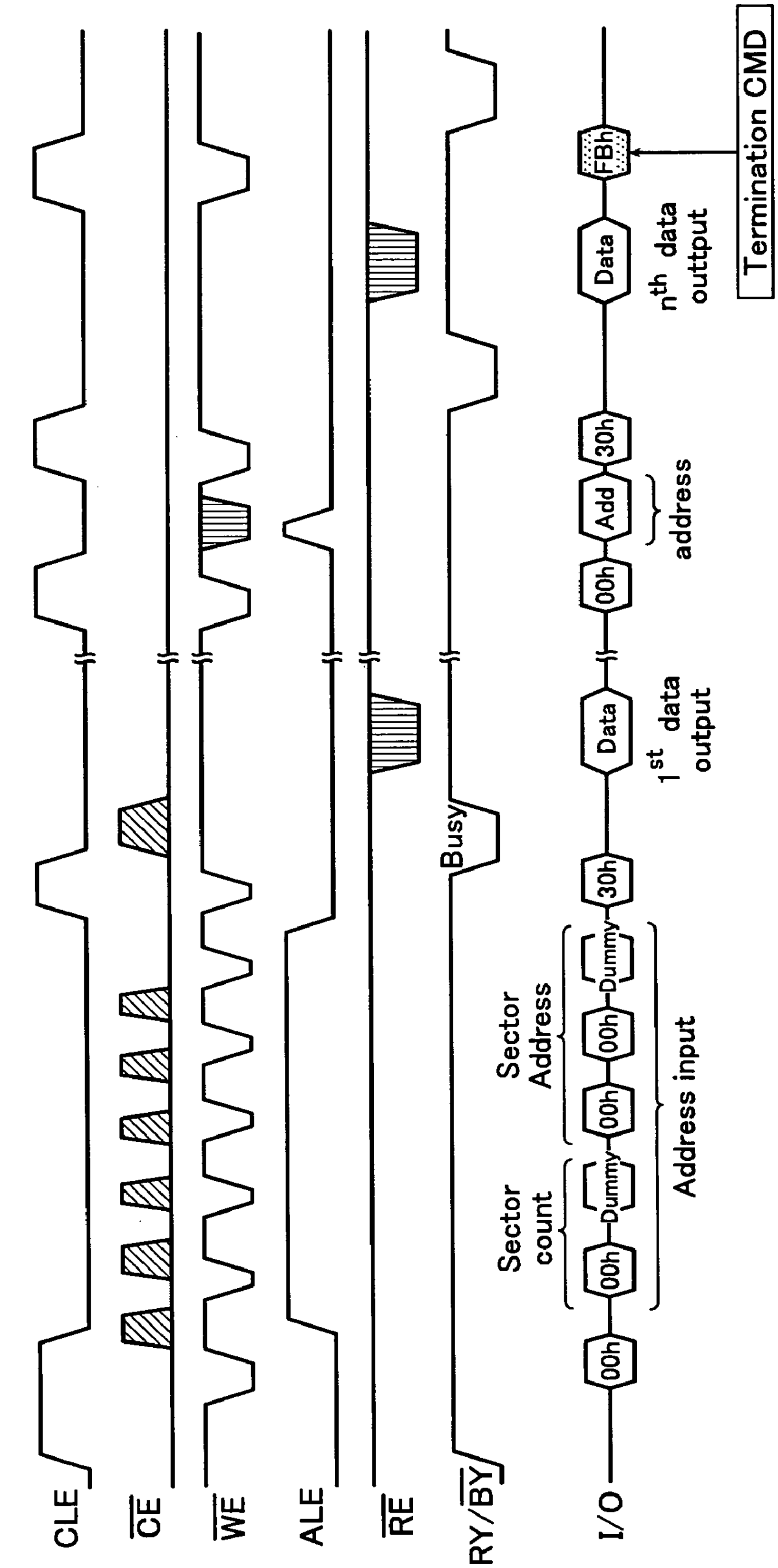
FIG. 71 is a timing diagram of read in a VFA mode to be interrupted using a termination command.

FIG. 71 is related to the case where a termination command <FBh> is input at the state of Ready to forcibly terminate the read operation.

Figure 72:
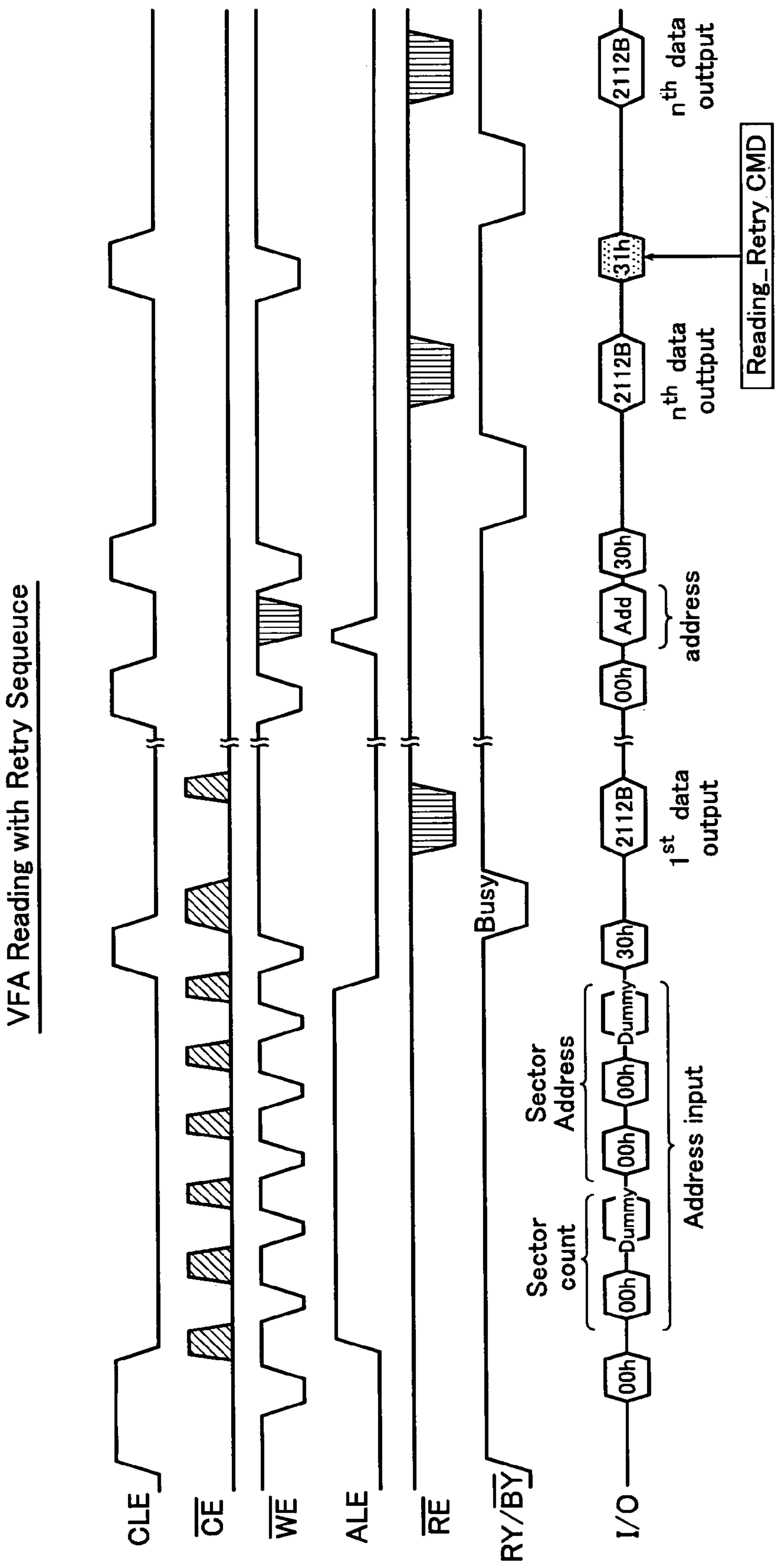
FIG. 72 is a timing diagram of read access in a VFA mode for reread.

FIG. 72 is related to the case where a retry command <31h> is input at the state of Ready to output the immediately preceding read data once again.

FIGS. 73-79 show optional read styles in the VFA access mode. Among those, FIGS. 73-76 are related to the case where a transfer protocol setting command is applied to set a read type B, that is, a continuation command <F8h> is used to continue the read operation.

Figure 73:
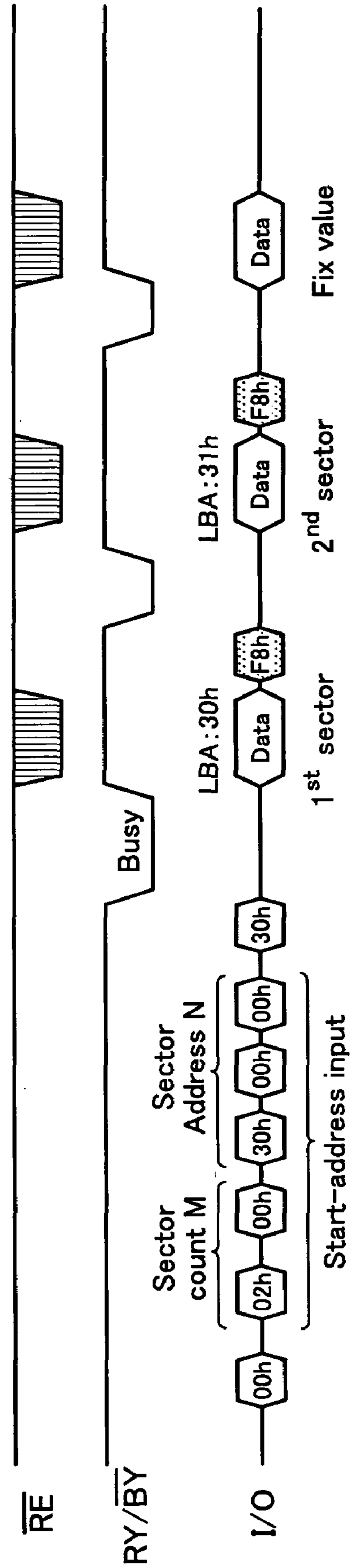
FIG. 73 is a timing diagram of read access in a VFA mode of an optional read type B(1).

In FIG. 73, a continuation command <F8h> is input after each sector data read to continue the read operation. If continuation command clocks are input over the number of output requests (sector count), a fixed value <FFh> is output. The LBA-NAND memory outputs the fixed value, and the host sends a termination command to terminate the command.

Figure 74:
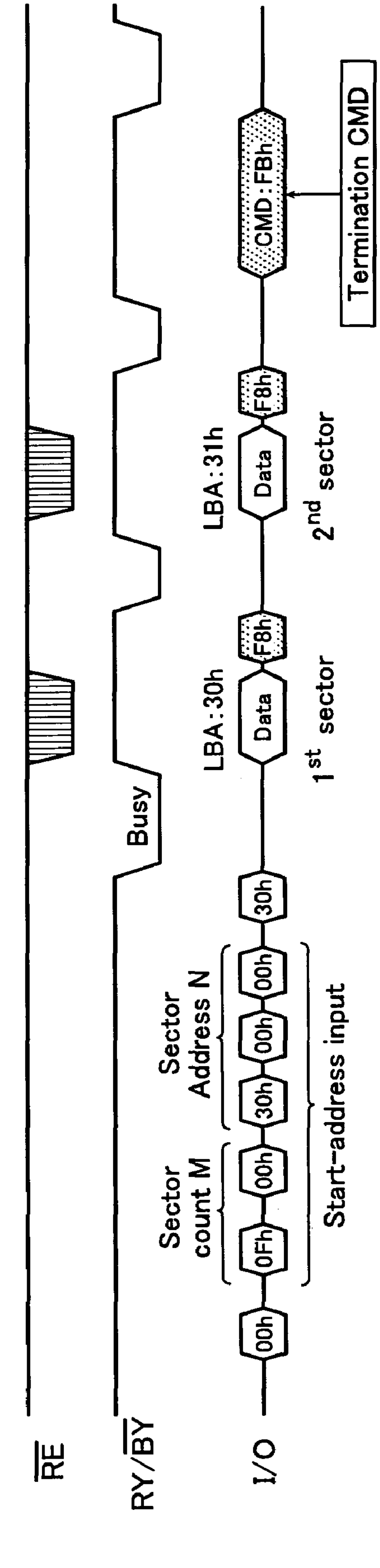
FIG. 74 is a timing diagram of read access in a VFA mode of an optional read type B(2).

FIG. 74 is a timing diagram of the case where a continuation command <F8h> is used to continue the read operation similarly and a termination command <FBh> to terminate the continued read operation.

Figure 75:
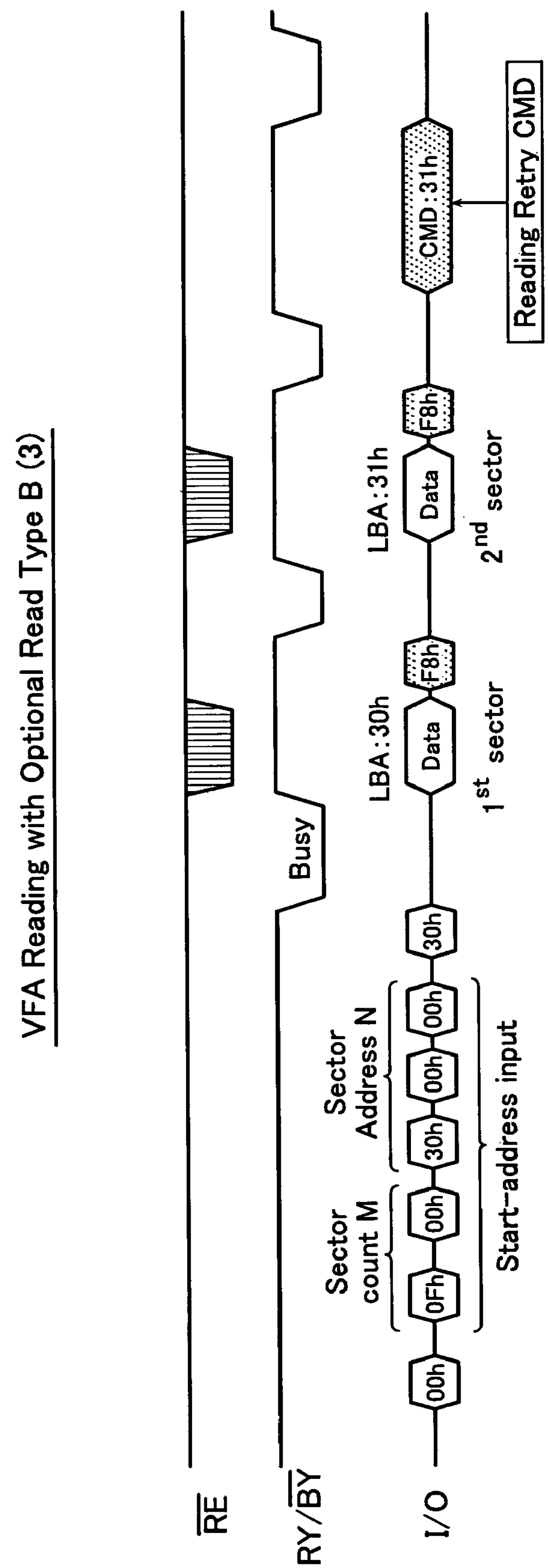
FIG. 75 is a timing diagram of read access in a VFA mode of an optional read type B(3).

FIG. 75 is a timing diagram of the case where a continuation command <F8h> is used to continue the read operation similarly and a retry command <31h> is input to retransfer the same sector data as that in immediately preceding read.

Figure 76:
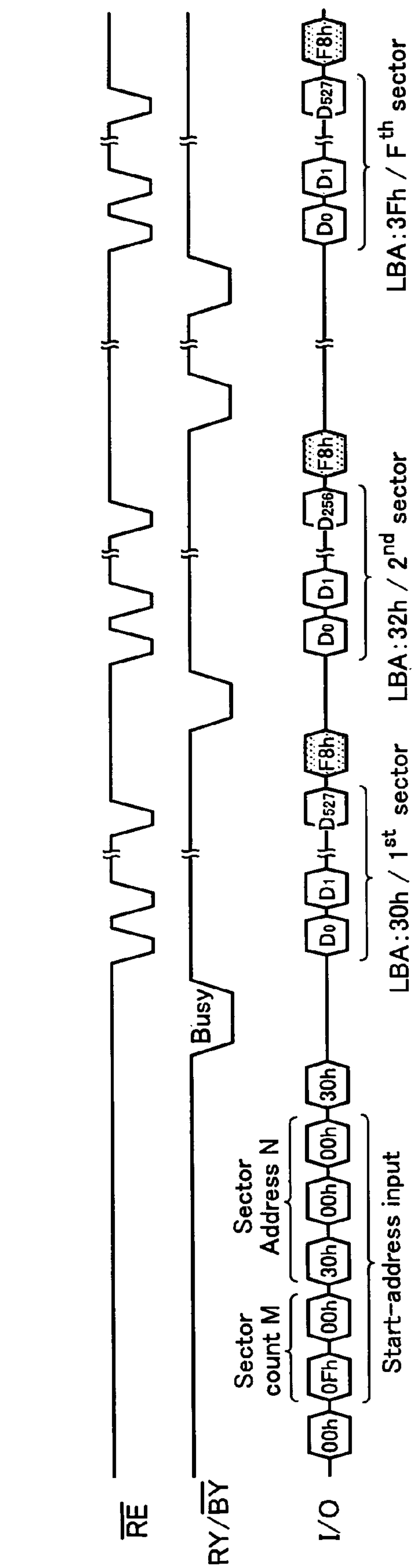
FIG. 76 is a timing diagram of read access in a VFA mode of an optional read type B(4).

FIG. 76 is a timing diagram of the case where a continuation command <F8h> is used to continue the read operation similarly and the same continuation command <F8h> to execute an interruption to skip the data read operation. In this example, one sector includes data D0-D527 of 528 Bytes. During the second sector read, a continuation command <F8h> is input just when data D0-D256 is read out, thereby skipping the data read operation.

Figure 77:
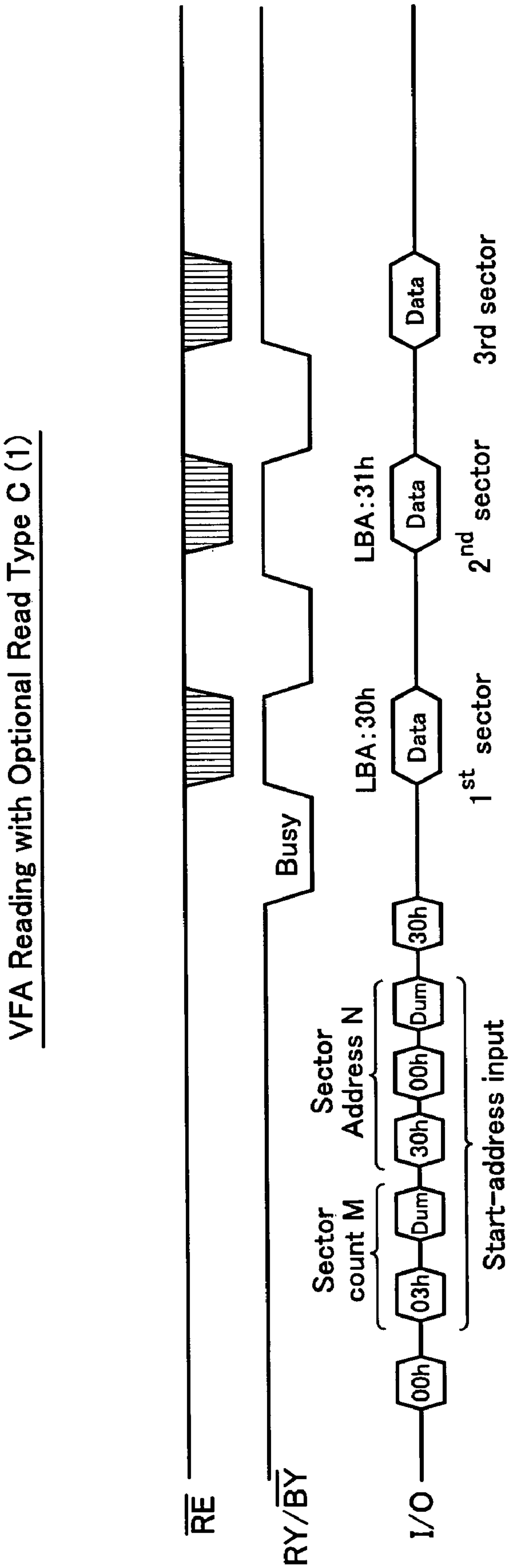
FIG. 77 is a timing diagram of read access in a VFA mode of an optional read type C(1).
Figure 78:
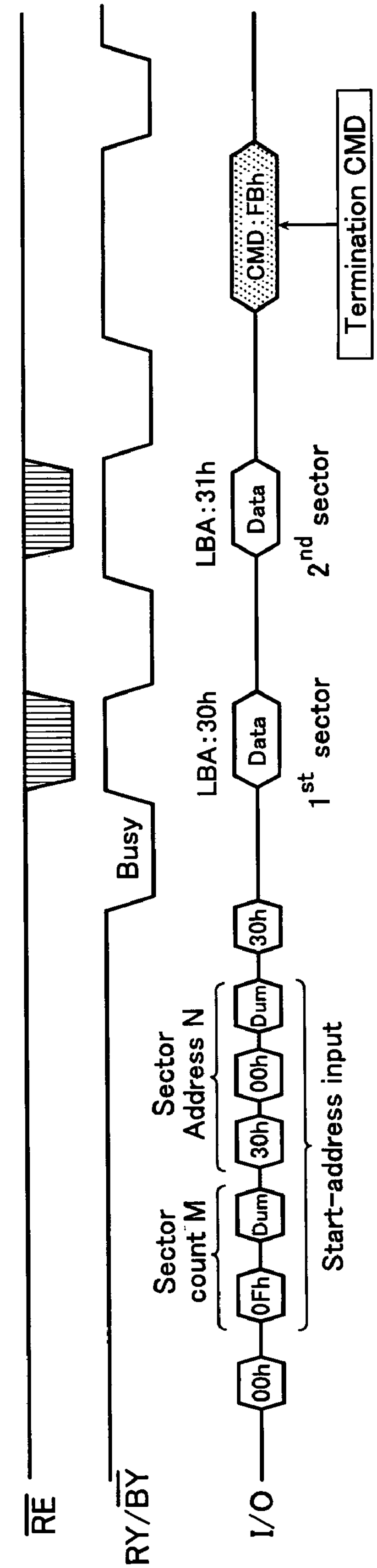
FIG. 78 is a timing diagram of read access in a VFA mode of an optional read type C(2).
Figure 79:
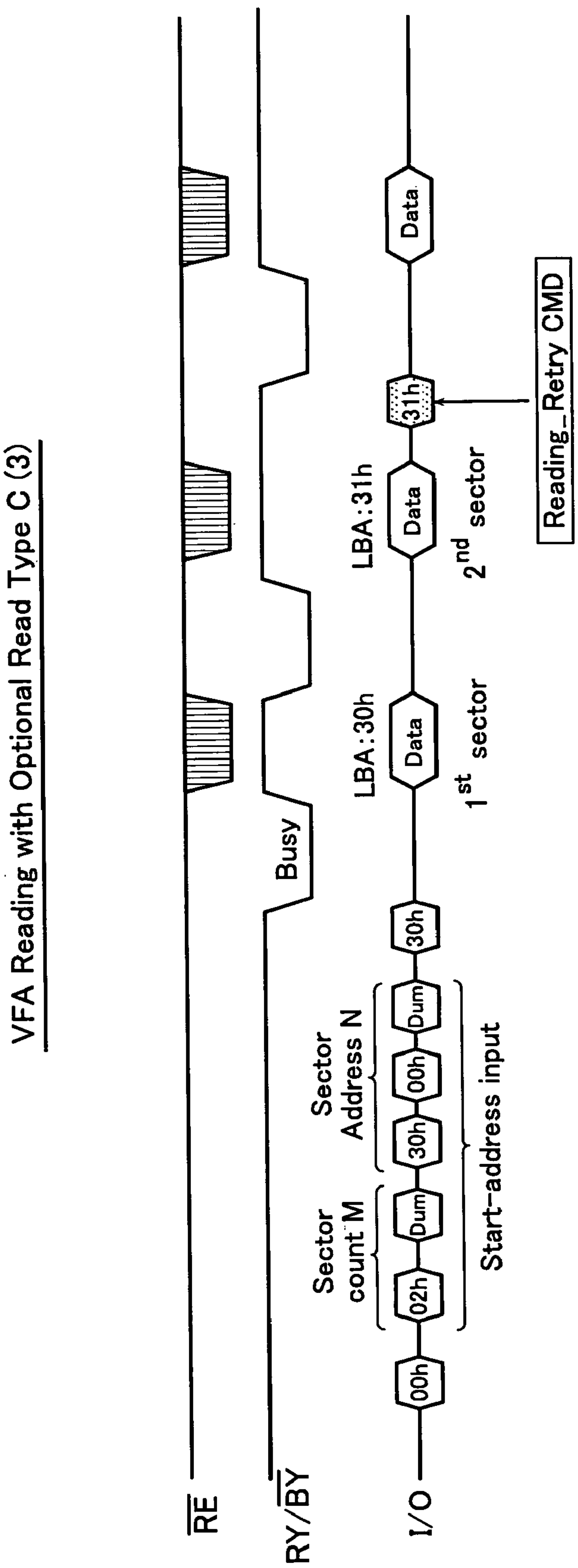
FIG. 79 is a timing diagram of read access in a VFA mode of an optional read type C(3).

FIGS. 77-79 are related to the case where a transfer protocol setting command is applied to set a read type C, that is, the read operation is continued without the use of a continuation command <F8h>.

FIG. 77 is related to the case where sector date read is successively repeated, sandwiching a busy state signal therebetween.

FIG. 78 is a timing diagram of the case where a termination command <FBh> is applied to terminate the continued read operation of the similar read type C.

FIG. 79 is a timing diagram of the case where the similar read type C is applied to continue the read operation and a retry command <31h> is input to retransfer the same sector data as that in immediately preceding read.

[VFA Access Mode . . . for Write]

Figure 80:
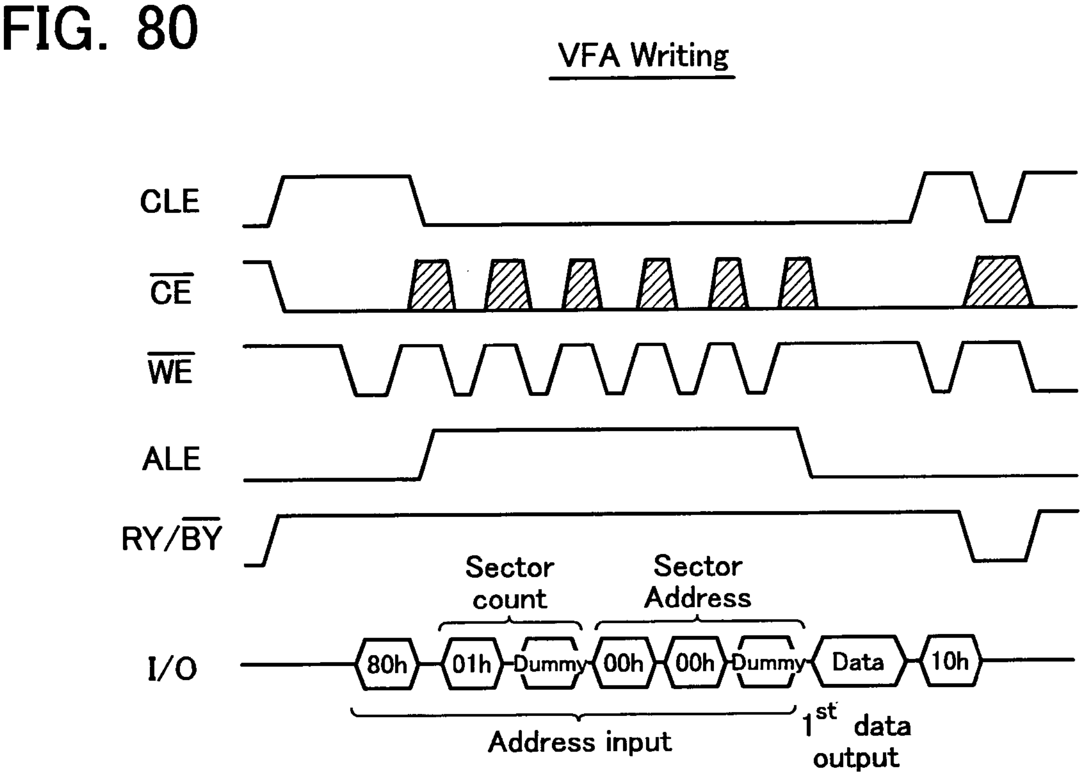
FIG. 80 is a timing diagram of write access in a VFA mode (1 sector).
Figure 81:
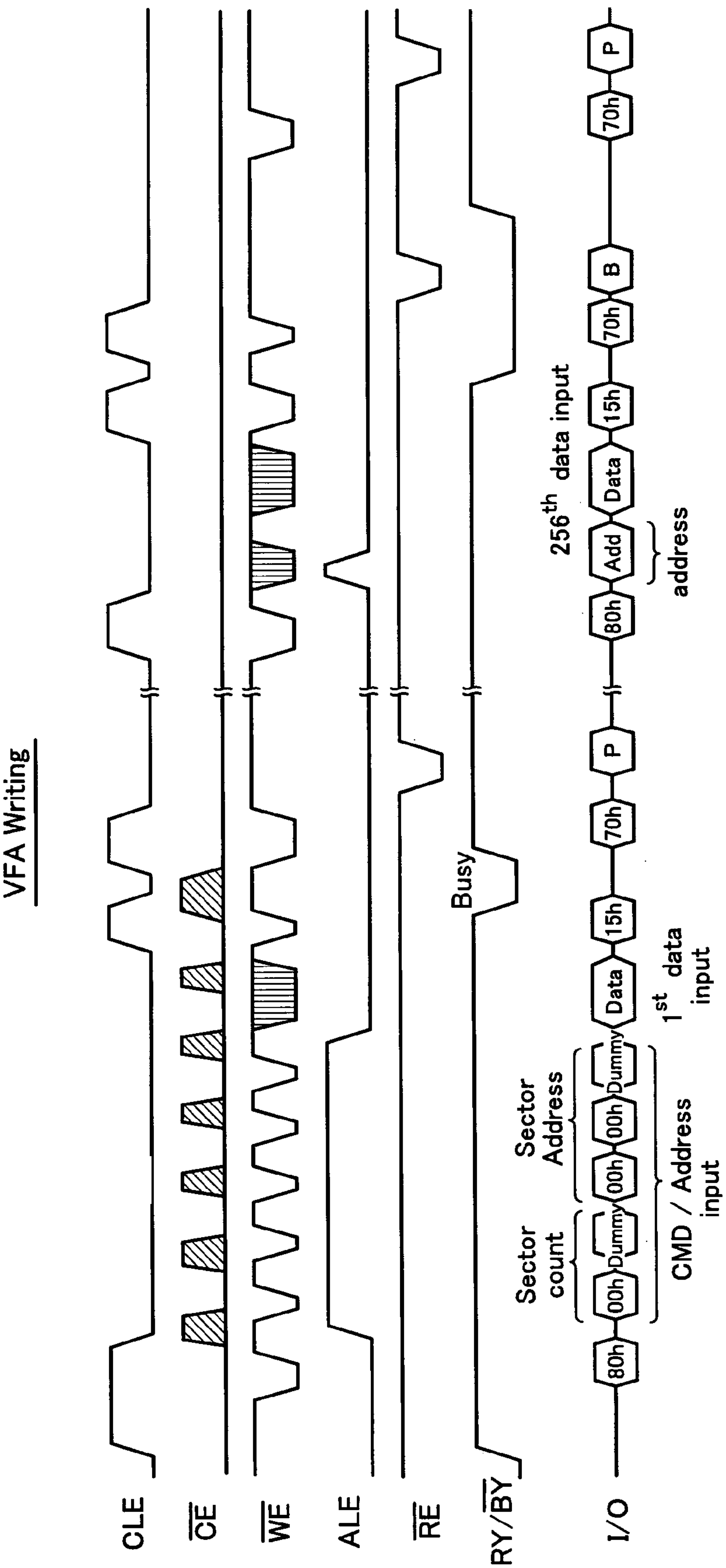
FIG. 81 is a timing diagram of write access in a VFA mode (256 sectors).

FIG. 80 is related to the case where the start address LBA=00h is input to execute write to 256 sectors, showing command, address and one sector write data inputs. FIG. 81 shows write data input up to 256 sectors on receipt of write verify pass ("P").

Figure 82:
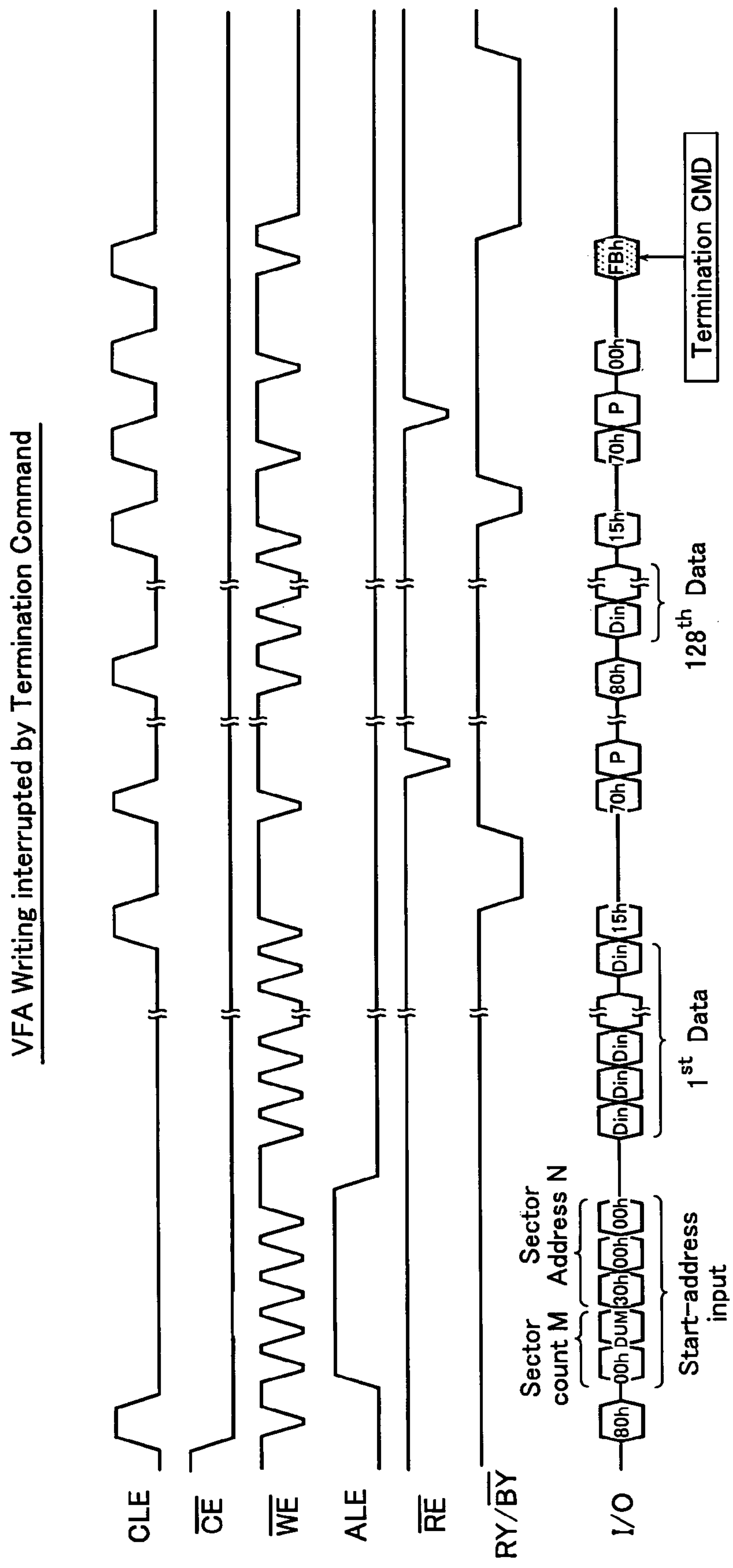
FIG. 82 is a timing diagram of write access in a VFA mode to be interrupted using a termination command.

FIG. 82 is related to the case where a termination command <FBh> is input at the state of write ready (Ready) during a write sequence started from the start address LBA=30h, thereby terminating the write sequence.

Figure 83:
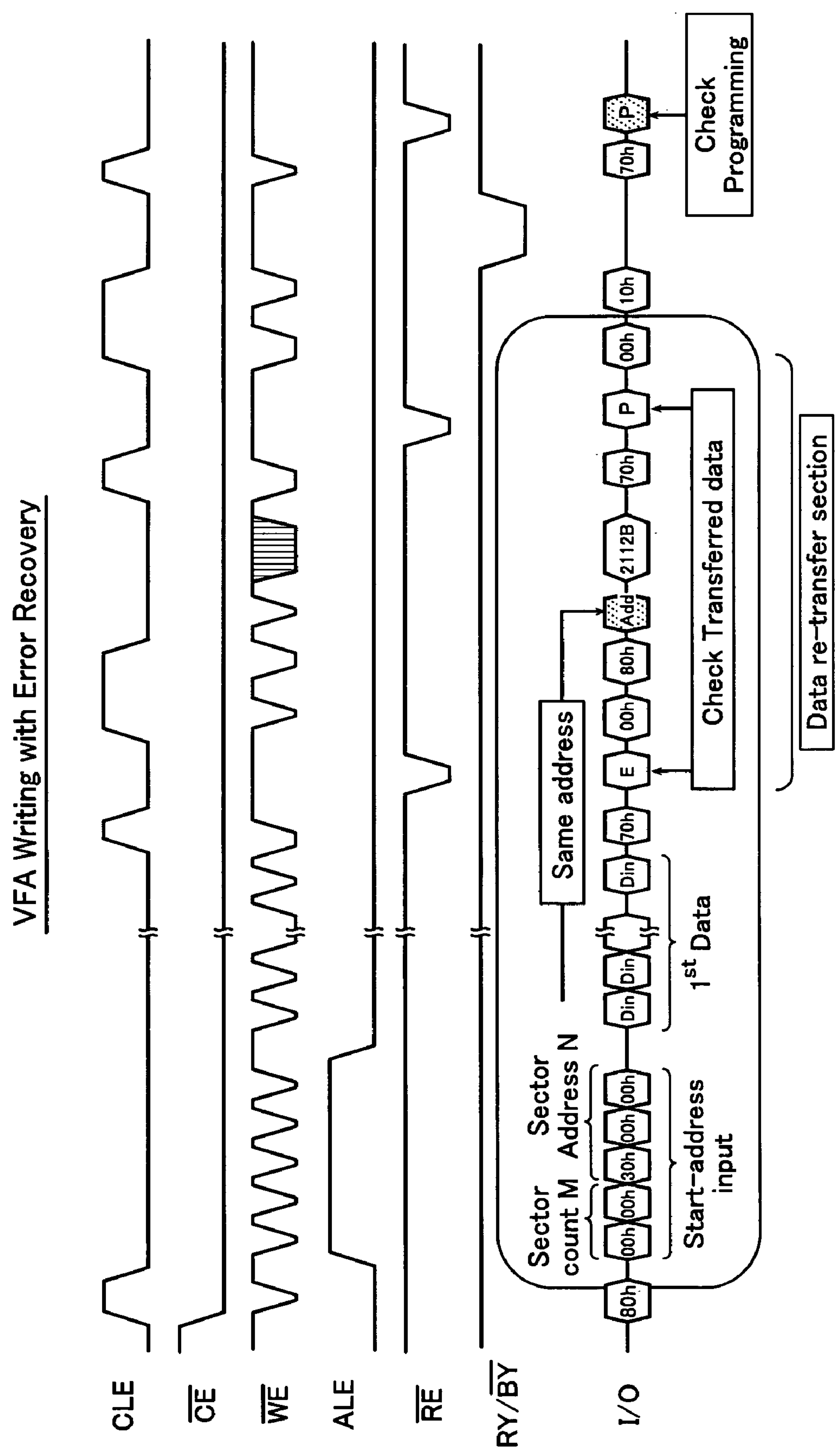
FIG. 83 is a timing diagram of write access in a VFA mode with error recovery.

FIG. 83 is a timing diagram of recommended processing when the status of the write command indicates a write error ("E"). If the write error is an uncorrectable one, the same address is input again as shown to execute retransfer.

Figure 84:
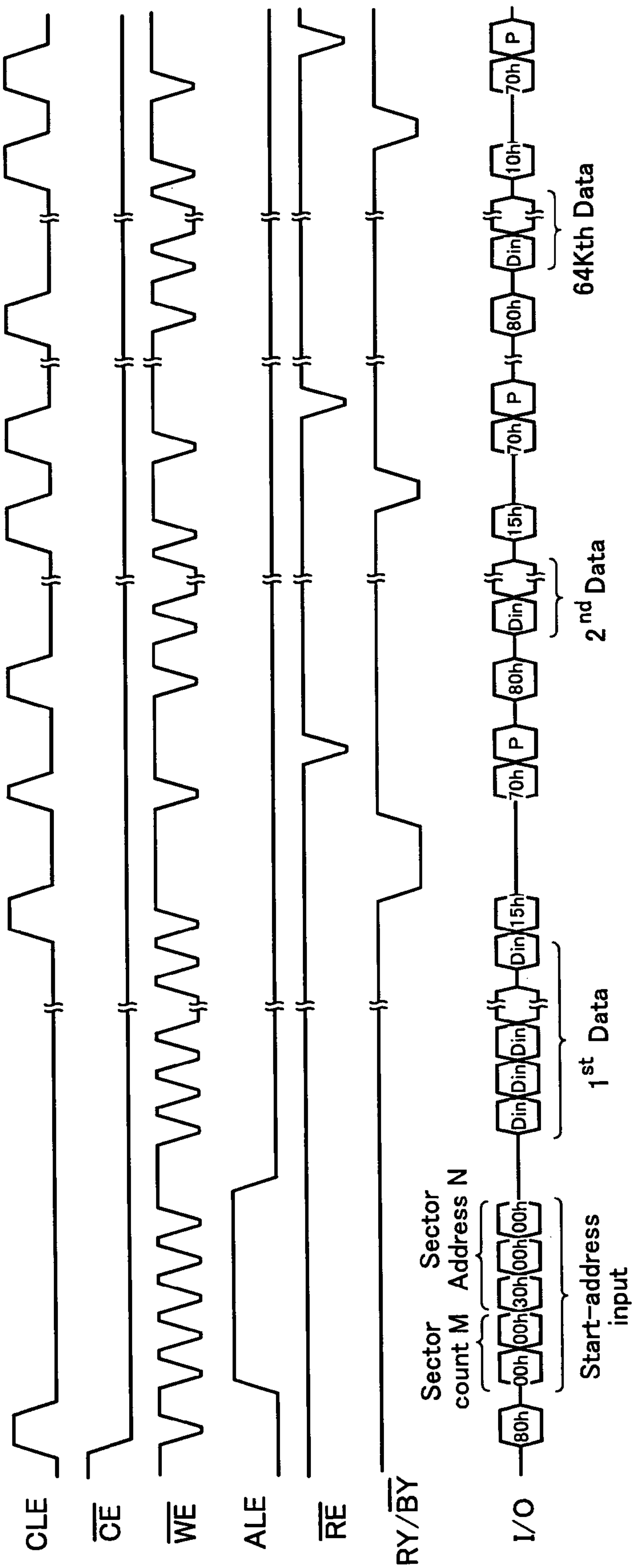
FIG. 84 is a timing diagram of write access in a VFA mode of an optional write type.

FIG. 84 is a timing diagram of an optional write style in which write data for each sector is input without the input of a dummy address.

[Command Diagram Overview]

Figure 85:
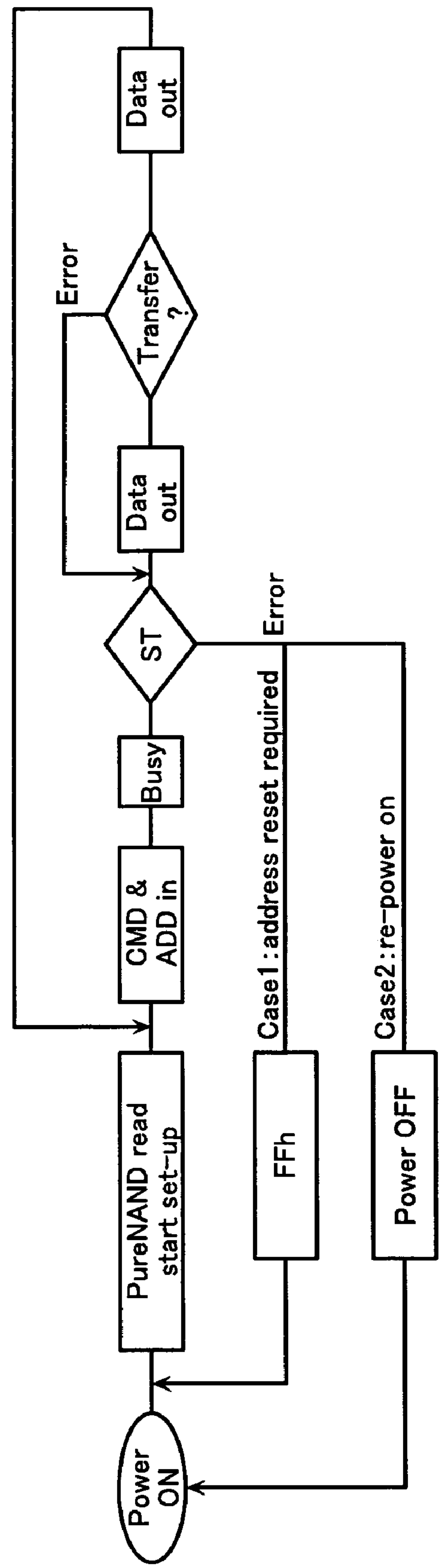
FIG. 85 is a diagram illustrative of a flow in a PNR mode including error processing.
Figure 86:
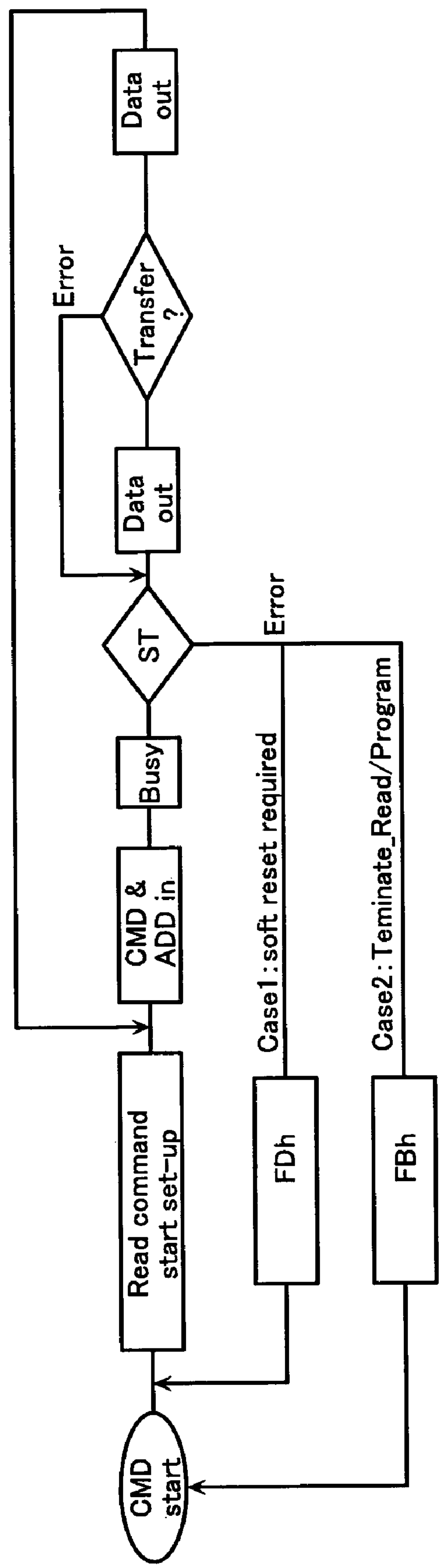
FIG. 86 is a diagram illustrative of a flow in PNR, VFA, MDA modes including error processing at the time of read access.
Figure 87:
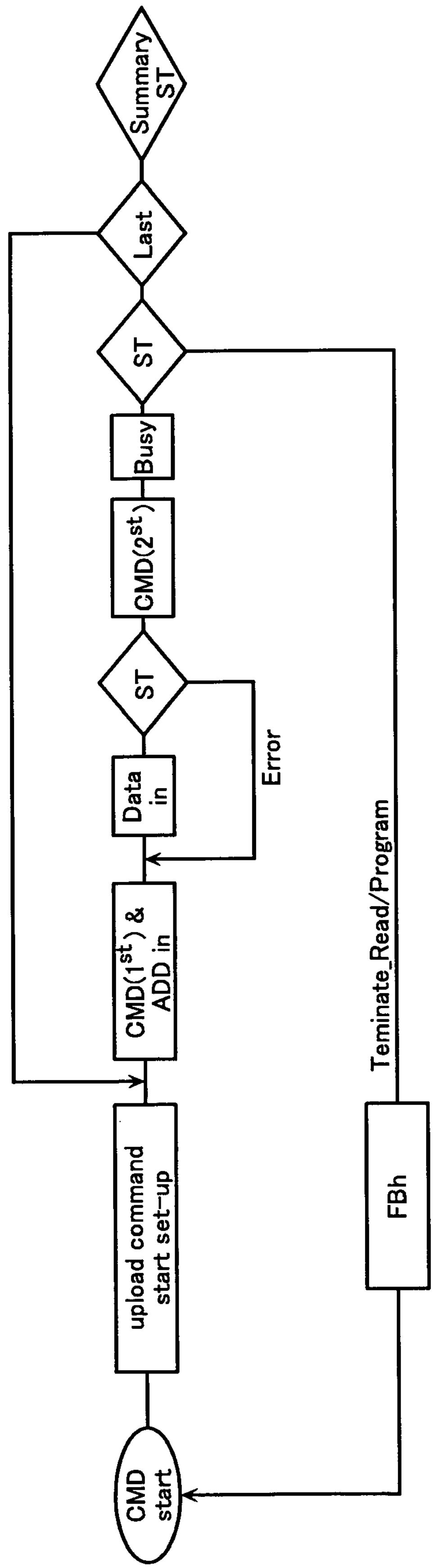
FIG. 87 is a diagram illustrative of a flow in PNR, VFA, MDA modes including error processing at the time of write access.

FIGS. 85-87 show command diagram overviews of the above-described read/write access.

FIG. 85 is related to the case where the PNR mode is set at power-on. After the PNR mode is setup, then a command "CMD" and an address "ADD" are input, and a certain busy time elapses, the status "ST" is checked.

Two handling methods are provided for a status error. One is a method of returning to the initial PNR mode setup using a command <FFh> to retry setup without turning power off (address reset). Another is a method of turning power off and then starting from power-on again.

Read data is subjected to transfer check. When a transfer error is detected, the same data is transferred once again.

FIG. 86 is related to read accesses in the PNA, VFA, MDA access modes. After start setup using the initial command, a command and an address are input. Then, after certain busy, the status "ST" is checked.

Two handling methods are provided for a status error. One is a method of returning to the initial setup using a command <FDh> to retry setup (soft reset). Another is a method of issuing a termination command <FBh> and turning to the initial command.

Read data is subjected to transfer check. When a transfer error is detected, the same data is transferred once again.

FIG. 87 is related to write accesses in the PNA, VFA, MDA access modes. After start setup using the initial command, a command, an address and write data are input. If a data transfer error is detected through the check of the status "ST", the write data is input again.

A termination command <FBh> may be issued during the write sequence to terminate the write operation and retry it from the beginning.

[Other Command Sequences]

Figure 88:
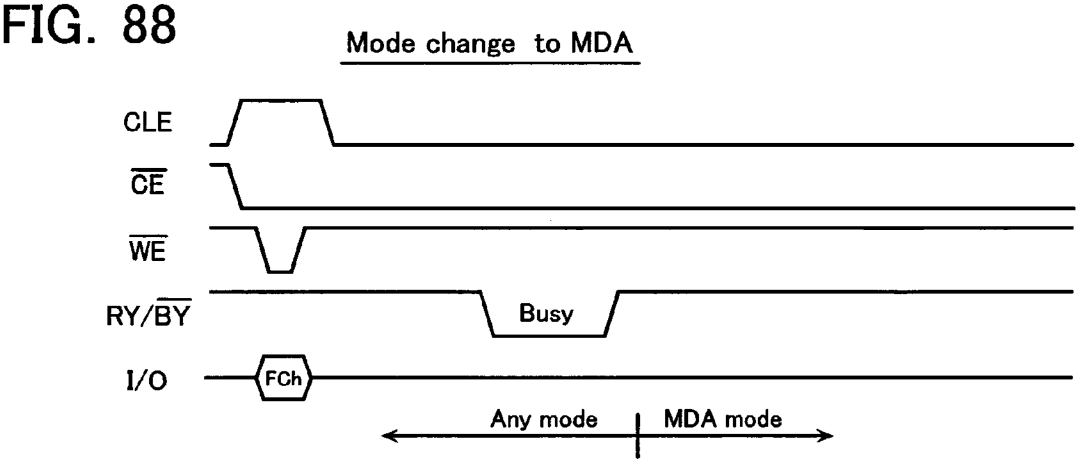
FIG. 88 is a timing diagram of execution of a change command for changing a certain mode to the MDA mode.
Figure 89:
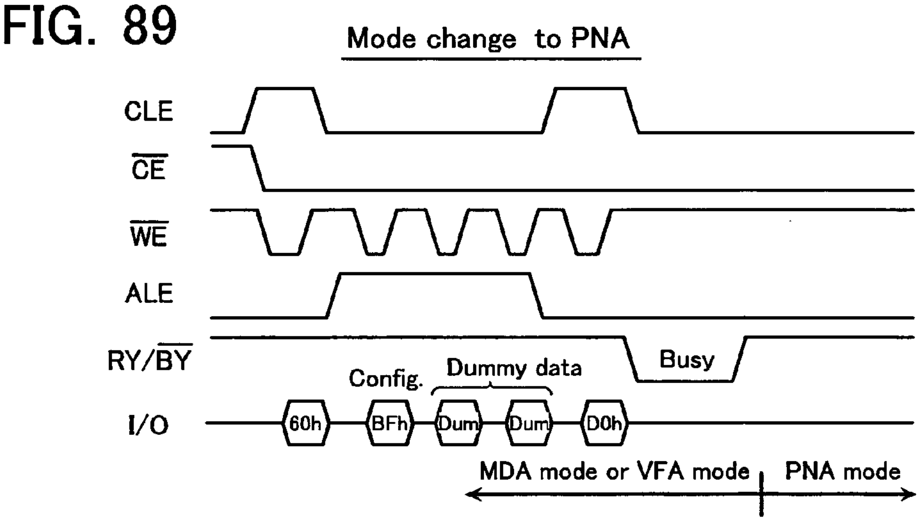
FIG. 89 is a timing diagram of execution of a change command for changing a certain mode to the PNA mode.
Figure 90:
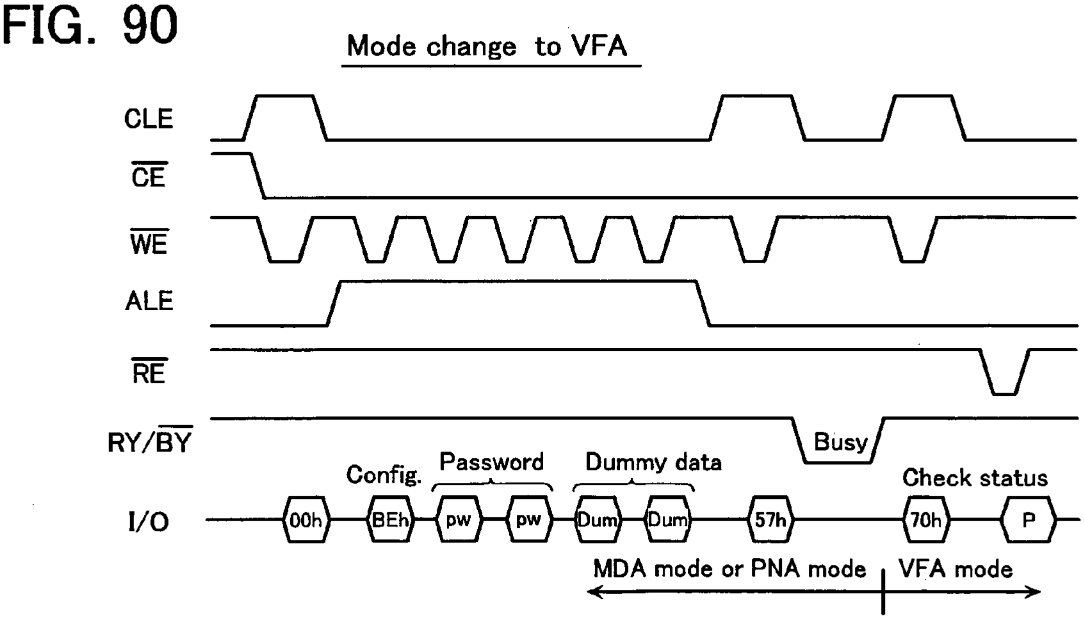
FIG. 90 is a timing diagram of execution of a change command for changing a certain mode to the VFA mode.

The following description is given to specific timing diagrams of other command sequences. FIGS. 88-90 show command sequences for mode change.

FIG. 88 shows an input timing of a change command <FCh> for making a change to the MDA access mode. After elapse of a certain busy period, the mode is changed. This can be also used in (a) a change from the PNA access mode or the VFA access mode to the MDA access mode; and (b) Exit from the PNR access mode or the Serial-EEP mode. It is possible to return to the original mode in the case of (a). It is not possible to return to the original in the case of (b), however, because the original mode is a read mode that can be set only at power-on.

FIG. 89 shows a command sequence for a change from the MDA or VFA access mode to the PNA access mode while FIG. 90 shows that from the MDA or PNA access mode to the VFA access mode.

Figure 91:
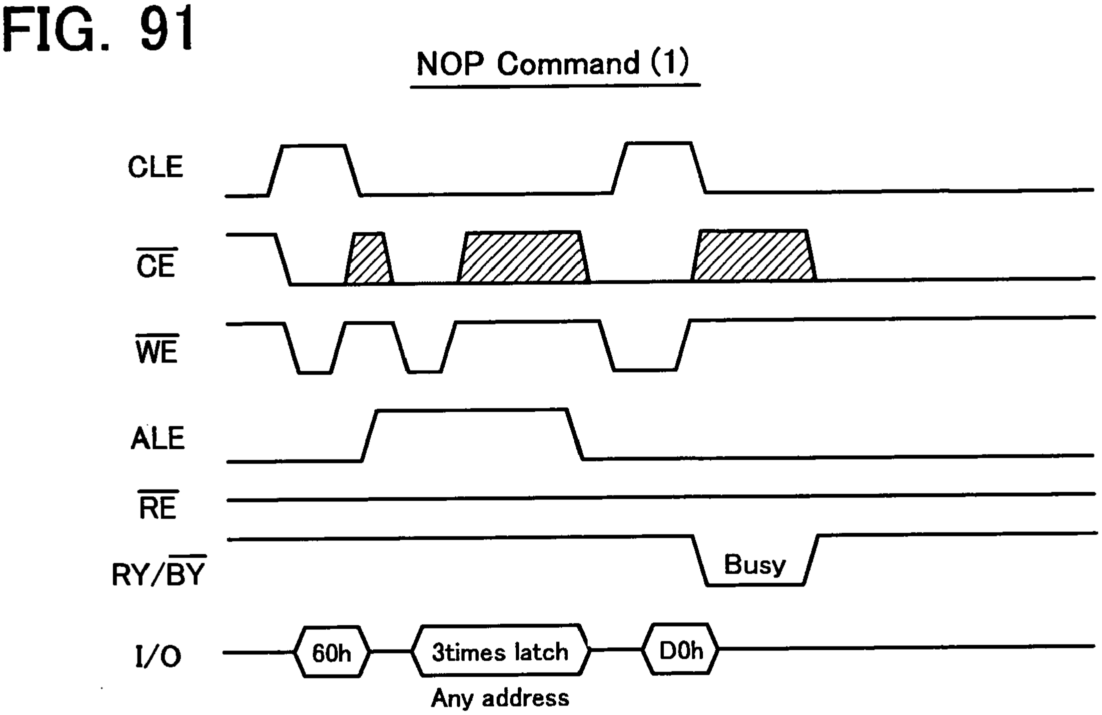
FIG. 91 is a timing diagram of registration of a NAP command.
Figure 92:
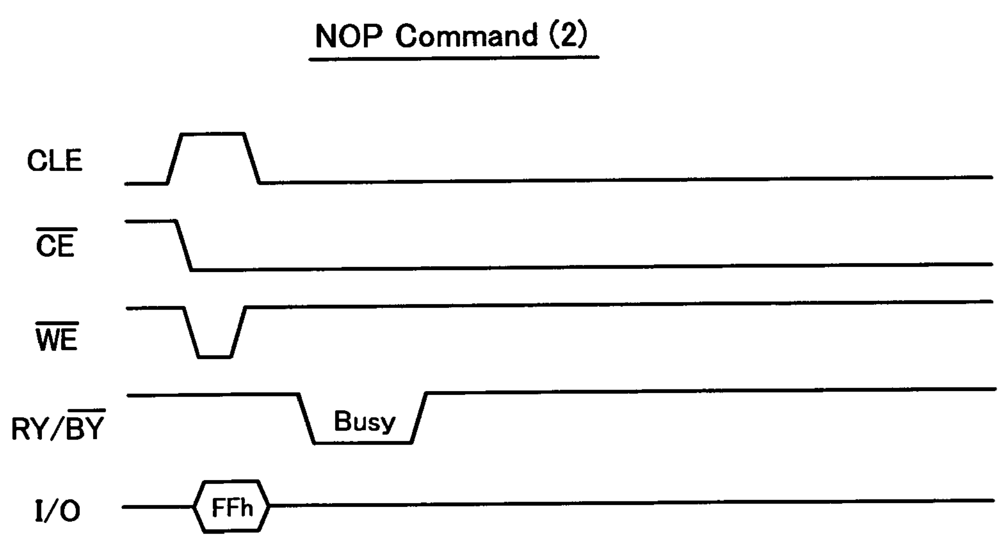
FIG. 92 is a timing diagram of registration of another NOP command.

FIGS. 91 and 92 show a command to be registered as a NOP command, among the commands previously used. In FIG. 91, <60h>-<D0h> is an old erase command, which is registered at an appropriated address. In FIG. 91, <FFh> is an old reset command, which is validated as an address reset command in the PNR mode (see FIG. 85).

Figure 93:
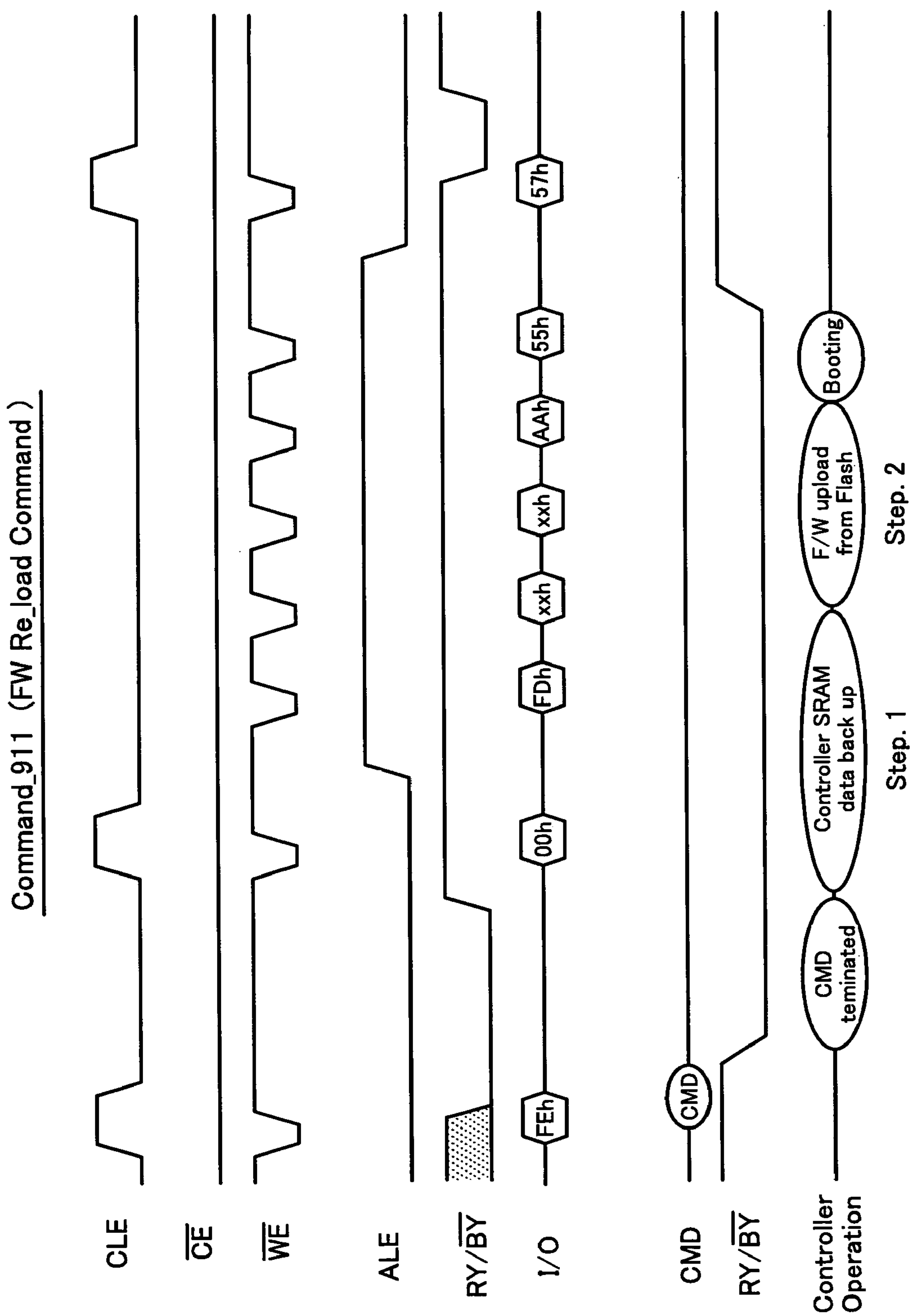
FIG. 93 is a timing diagram of operation associated with a firmware reload command.

FIG. 93 shows a sequence of a firmware (FW) reload command <CMD> required for the memory controller. When the controller receives this command, it terminates the current command and executes backup write of the data from the buffer RAM into the flash memory chip (step 1). Thereafter, it reads out FW from the flash memory chip and transfers it for reload (step 2). After execution of the command, it executes system boot and returns to the Ready state.

Figure 94:
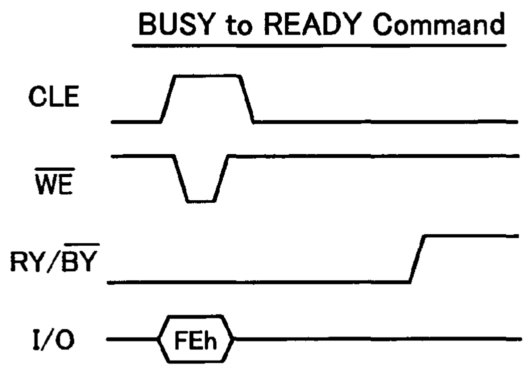
FIG. 94 is a timing diagram of a busy/ready change command.

FIG. 94 shows a timing diagram of a command <FEh> that is used to forcibly return the LBA-NAND memory to the Ready state when it is stuck at the Busy state.

Figure 95:
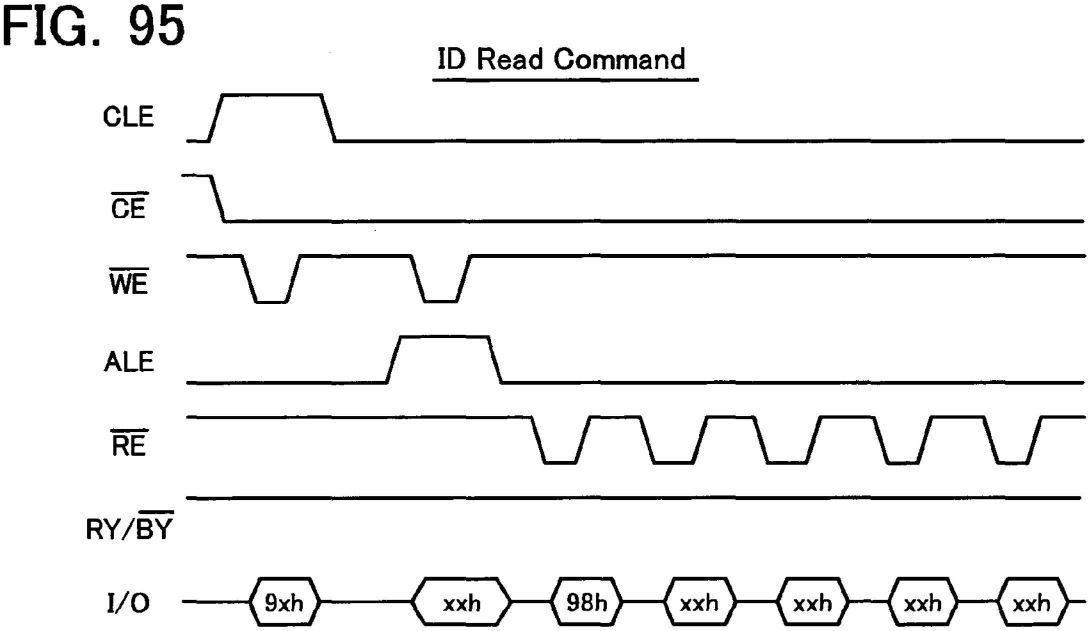
FIG. 95 is a timing diagram of an ID read command.

FIG. 95 shows an ID data read command sequence, which prepares commands for pseudo-ID code data read and for ID code read from the original LBA-NAND memory as described earlier (see FIG. 11B).

Figure 96:
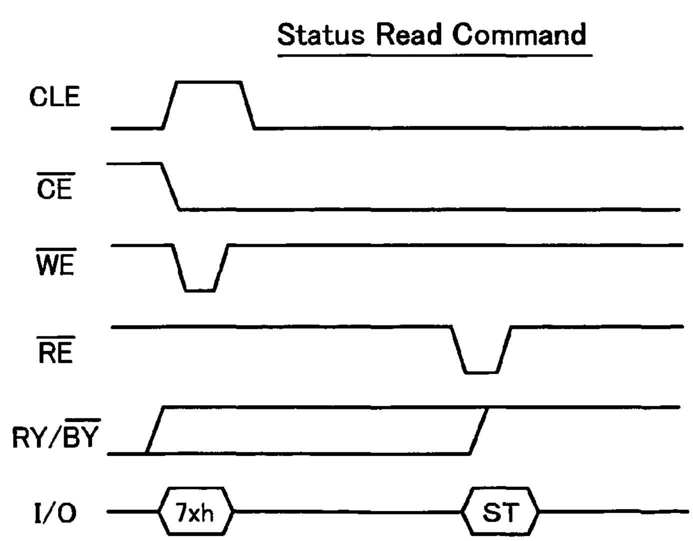
FIG. 96 is a timing diagram of a status read command.

FIG. 96 shows a status read command sequence. The LBA-NAND memory has two kinds of status: a general status that is output using a command <70h>; and an LBA-NAND specified status that is output using a command <71h> as shown in FIG. 11C.

Figure 97:
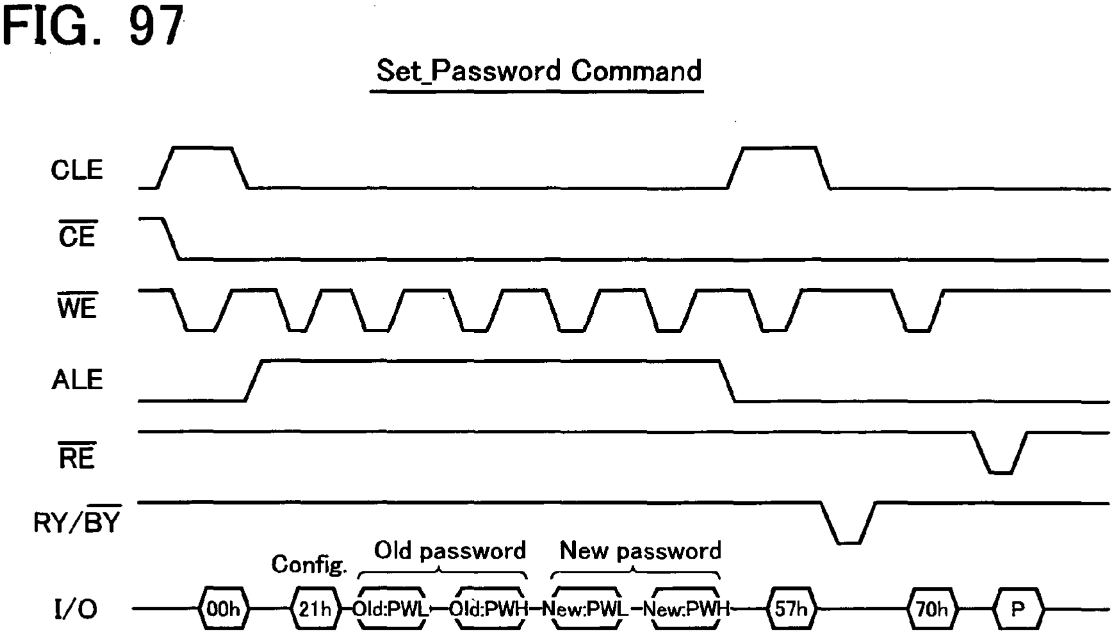
FIG. 97 is a timing diagram of a password setting command.

FIG. 97 is a timing diagram of a password setting command. A default password is "FFhFFh" and during that period a password authenticating function is disabled. After this command is used to set a user-specified password, the password authenticating function is enabled. On execution of this command, status check is performed preferably. FIG. 97 shows the case where pass "P" is obtained using a status command <71h>.

Figure 98:
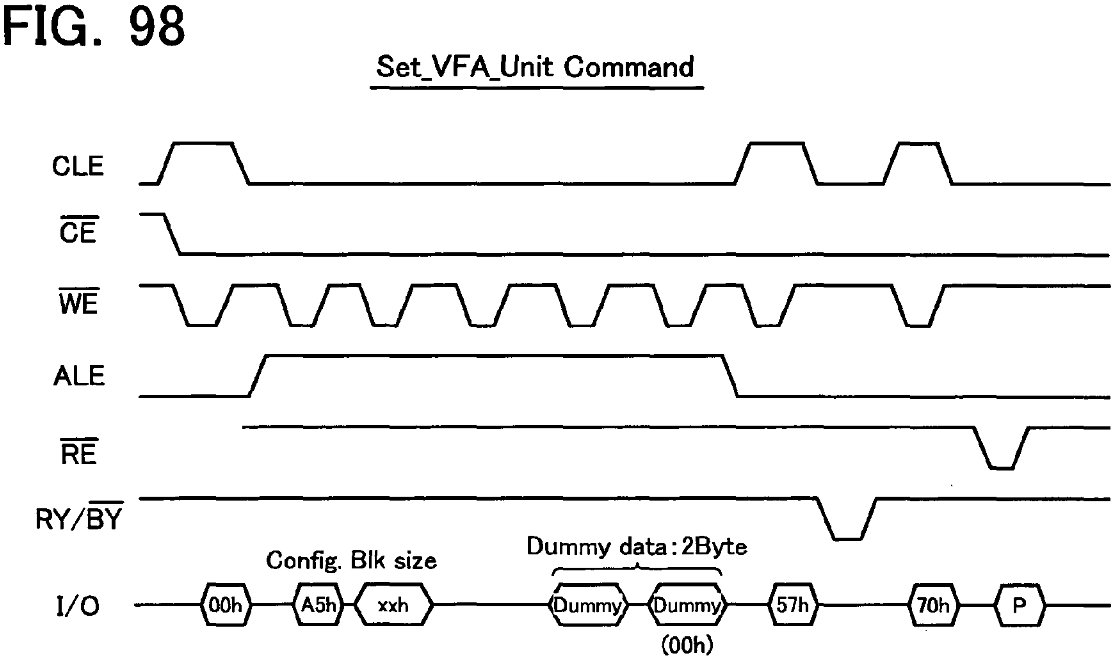
FIG. 98 is a timing diagram of a VFA unit setting command.

FIG. 98 is a timing diagram of a VFA unit setting command. As described above, the VFA area is expandable. It is possible to change the capacity of the VFA area using this command. When the capacity of the VFA area gets an increase, the MDA area loses a capacity double the increase. On execution of this command, status check is performed preferably as well. FIG. 98 shows the case where pass "P" is obtained using a status command <71h>.

Figure 99:
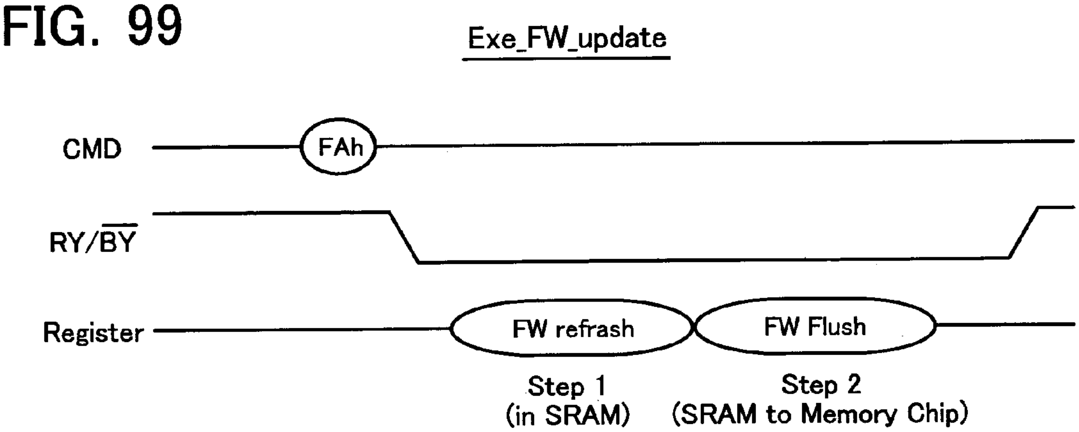
FIG. 99 is a timing diagram of a firmware update execution command.

FIG. 99 is a timing diagram of a reset command after FW update in the controller. When this command is input, FW is refreshed in the buffer RAM (Step 1) and this is written in the memory chip (Step 2). This data flush into the memory chip can be controlled using the hardware sequencer 27.

Figure 100:
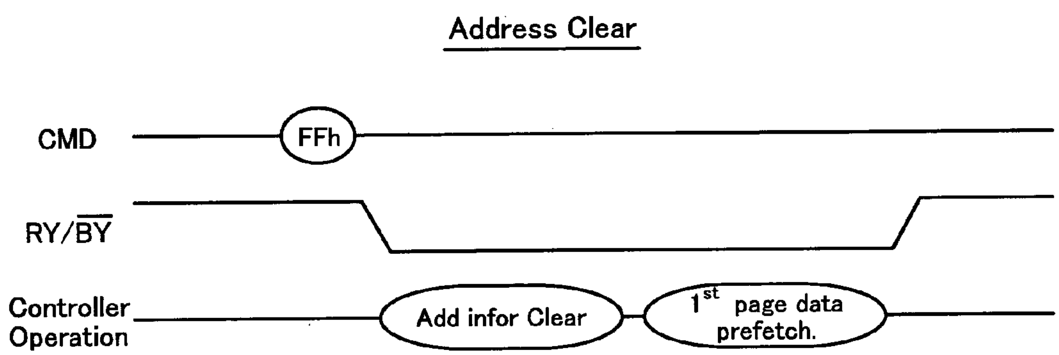
FIG. 100 is a timing diagram of an address reset command.

FIG. 100 is a timing diagram of an address clear command <FFh>. This command is effective only in the PNR mode.

Figure 101:
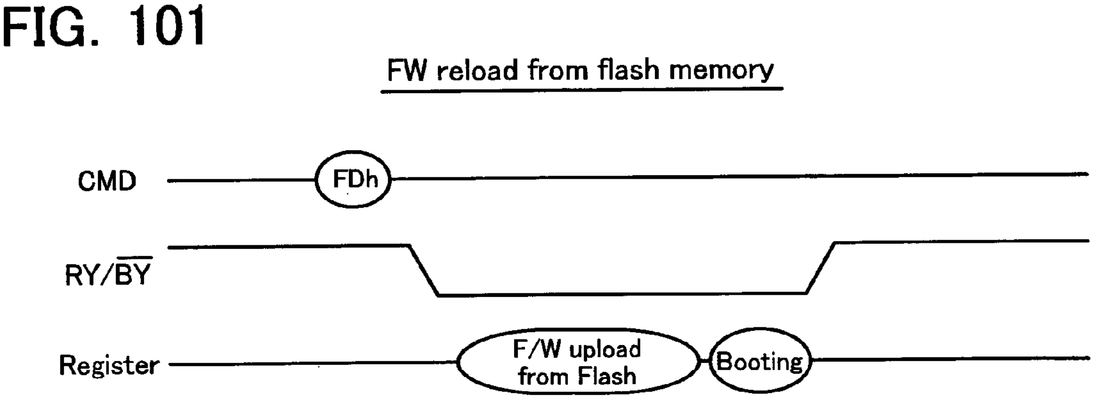
FIG. 101 is a timing diagram of a firmware reload command.

FIG. 101 is a timing diagram of a FW reload command <FDh>. With the use of this command, FW can be reread from the flush memory and loaded into a buffer SRAM in the controller. This data read and transfer can be controlled also using the hardware sequencer 27.

Figure 102:
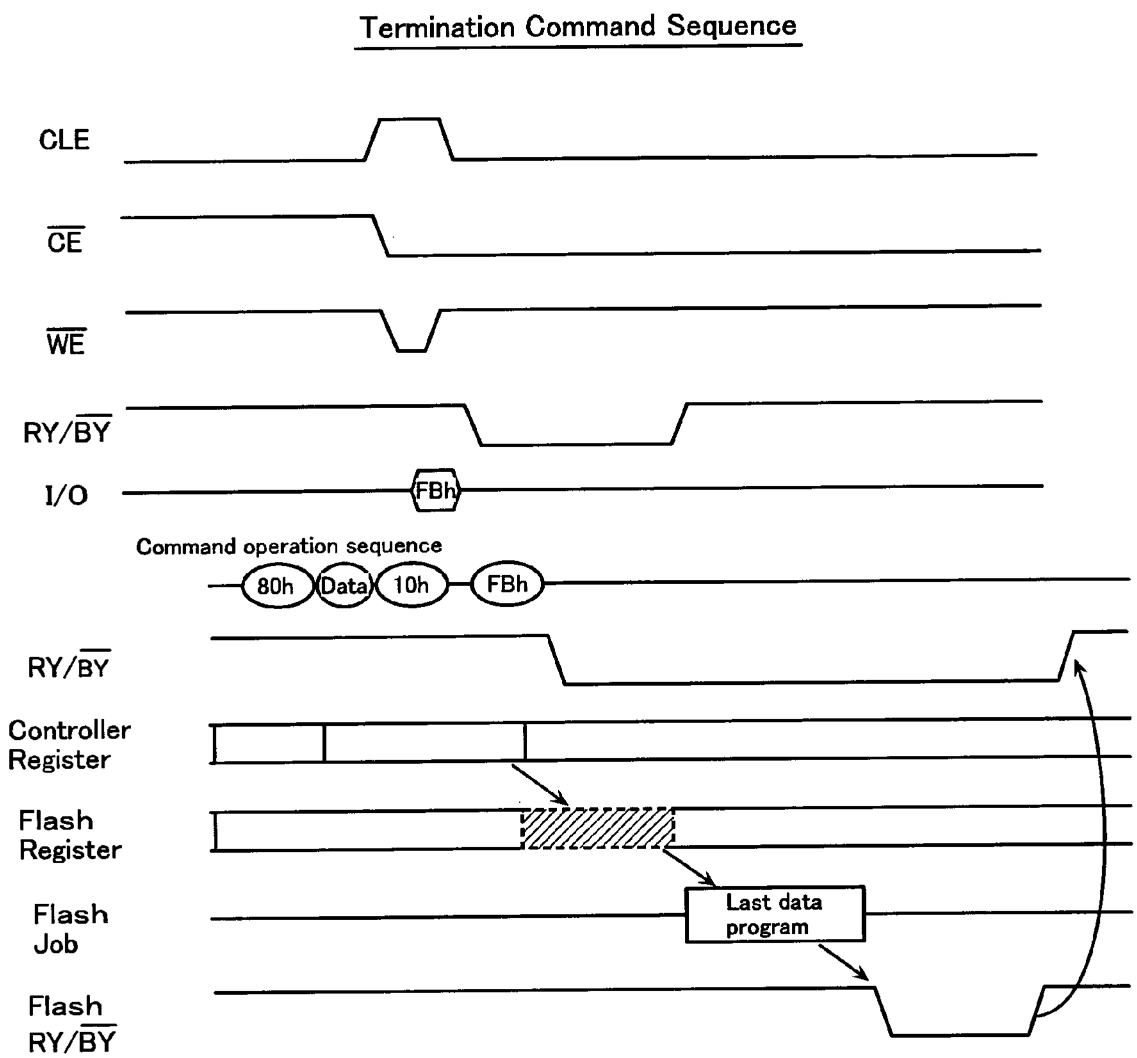
FIG. 102 is a timing diagram of a read/write termination command.

FIG. 102 shows a sequence of a command <FBh> for use in termination of the currently proceeding read/write. This command responds as follows.

During data read in the Ready period, the data buffer is cleared after completion of the data output. If write data is being input, after writing the received write data into the flush memory, the data buffer is cleared to terminate the command. If data is not being read, the data buffer is cleared to terminate the command. If write data is not being input, after writing the already received write data into the flush memory, the data buffer is cleared to terminate the command.

During the Busy period, no command is accepted.

Figure 103:
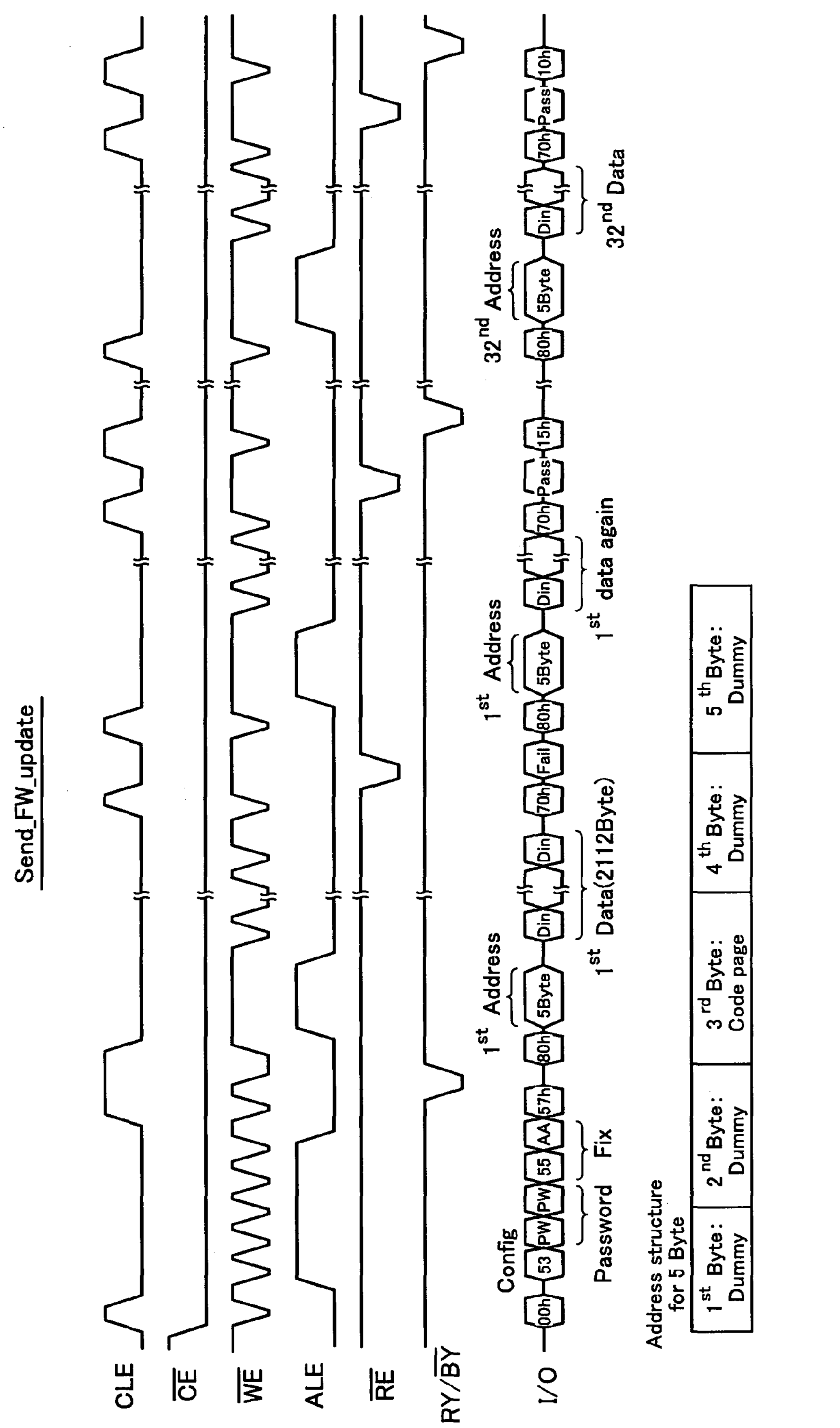
FIG. 103 is a timing diagram of a firmware update send command.

FIG. 103 is a command sequence of data transfer from the host to the LBA-NAND memory for FW update. The data structure of 528 Bytes contains a 512-Byte data body+2-Byte dummy data+2-Byte CRC16+11-Byte dummy data+a 1-Byte address. The last 528th Byte corresponds to the address.

Data is always subjected to data transfer on a 528-Byte basis with Multiple=4. The figure shows the data transfer unit of 2K Bytes in which a 5-Byte address and 2K-Byte data are sent together. In the shown example, when a transfer error "Fail" is detected through status check, the same data is transferred again.

In the 5-Byte address, the first, second, fourth and fifth bytes are dummies while the third byte is a code page.

Figure 104:
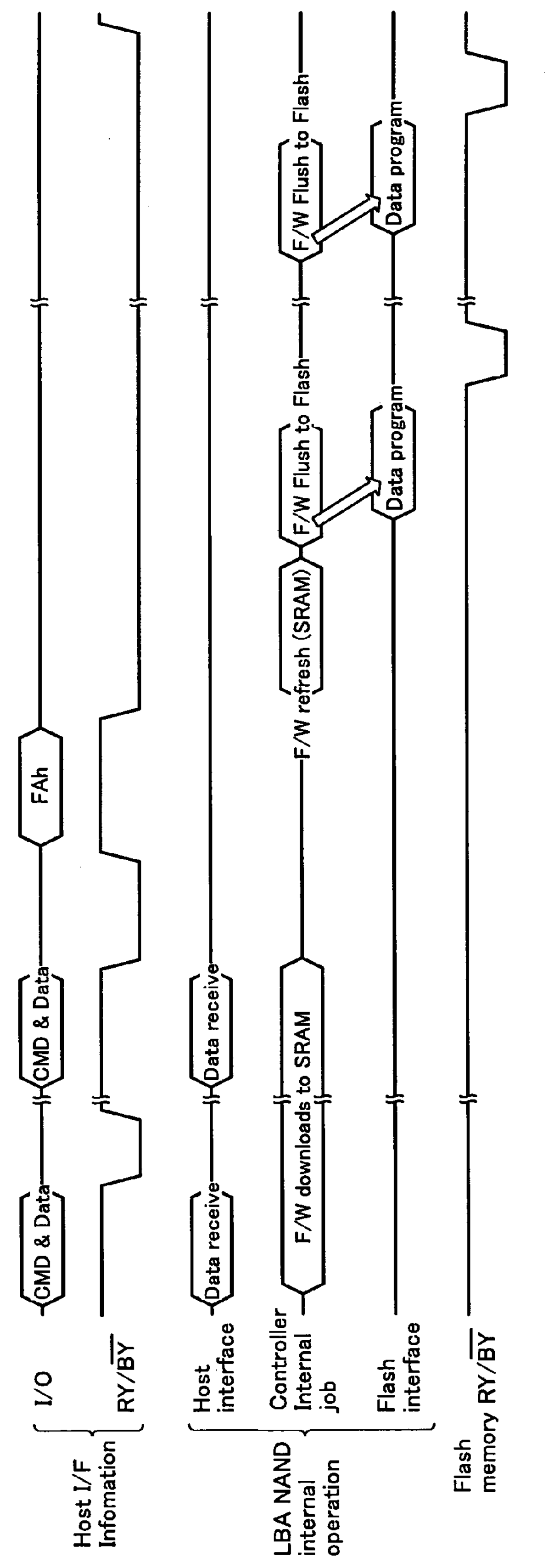
FIG. 104 is a diagram illustrative of a relation between host I/O and LBA-NAND memory internal operation.

FIG. 104 shows a sequence of controller FW update. A host device (Music Engine) sends a command and FW data sequentially to the LBA-NAND memory. When a host interface at the LBA-NAND memory receives them, the memory controller downloads the FW in the buffer SRAM.

When the host enters a reset command <FAh> and the LBA-NAND memory becomes busy, FW is refreshed on the buffer SRAM and sequentially written into the flash memory.

Figure 105:
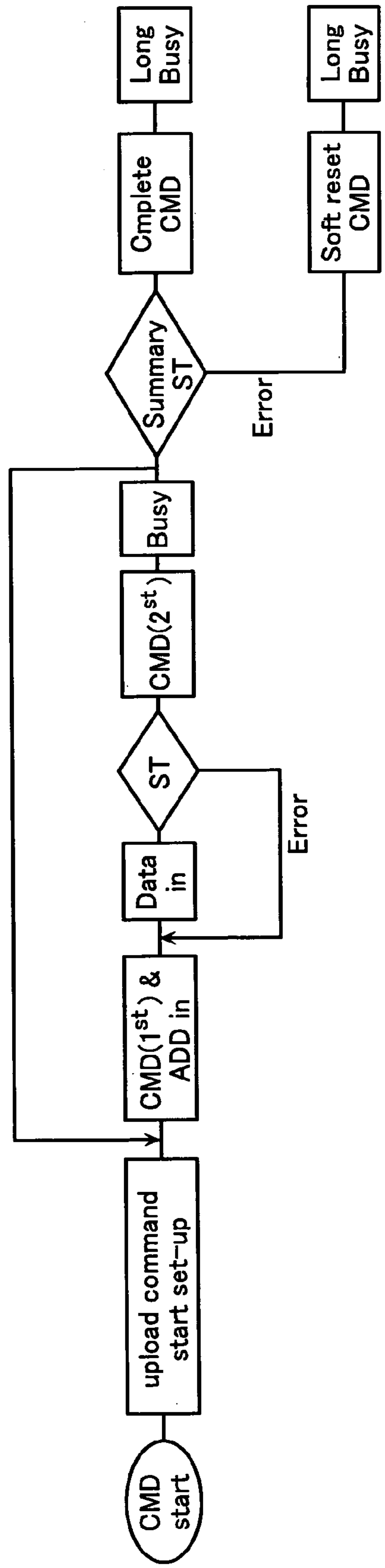
FIG. 105 is a diagram illustrative of a flow of error processing in firmware update.

FIG. 105 shows an overview of error processing for the above-described FW update command. After start setup, the first command and address, and data are transferred to the LBA-NAND memory. The data transfer is checked from the status "ST" and, when the host detects an error, the data is subjected to retransfer.

After the input of the second command, a certain busy period is placed, then the same operation is repeated. When an error is found in a final FW update status check, the command is soft reset to abandon FW renewal. When no error is found, a write command FAh for writing FW in the NAND flash memory is issued to renew FW.

Figure 106:
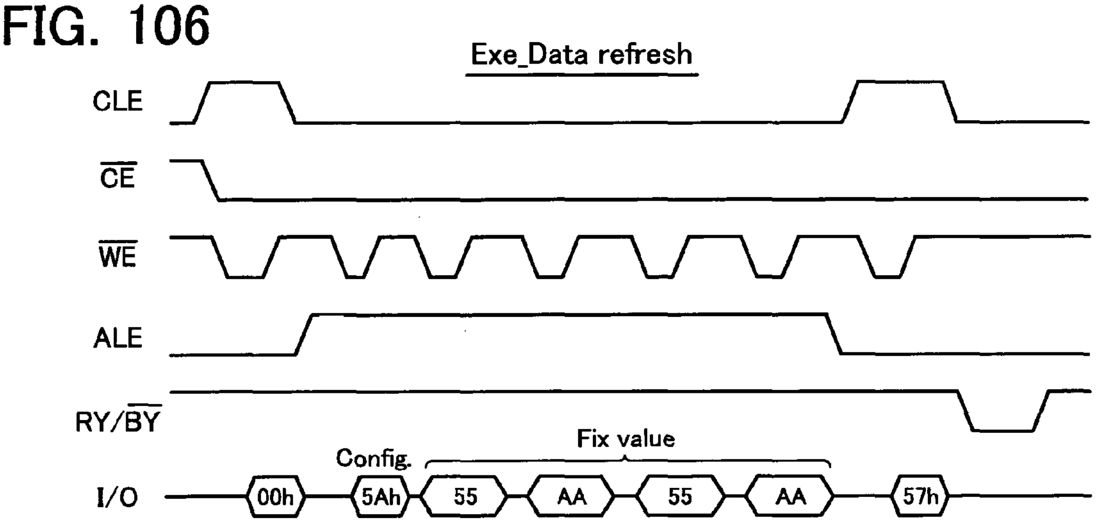
FIG. 106 is a timing diagram of a data refresh execution command.

FIG. 106 is a timing diagram of a data refresh command. This command is used to identify the consistency of data recorded in the flash memory. If a block is found to contain an error in verify-read data, it is replaced with a spare block and the original block is reused as a spare block.

This command serves as a background command and the Ready/Busy pin outputs the Ready state. The adoption of this command requires new establishment of a data refresh status command and a data refresh termination command.

Figure 107:
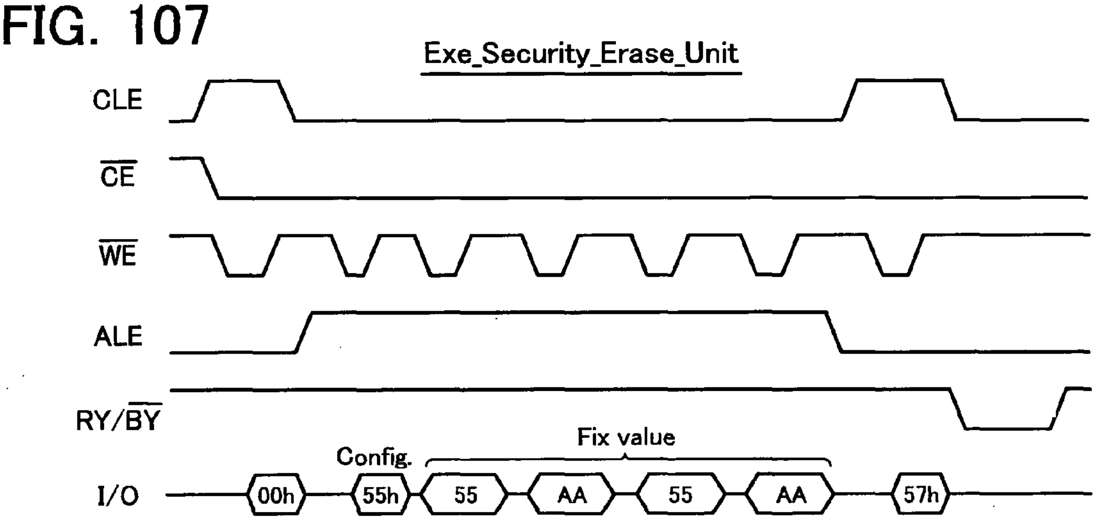
FIG. 107 is a timing diagram of a MDA area erase command.

FIG. 107 shows a command used to erase all data in the MDA area from the flash memory for security.

Figure 108:
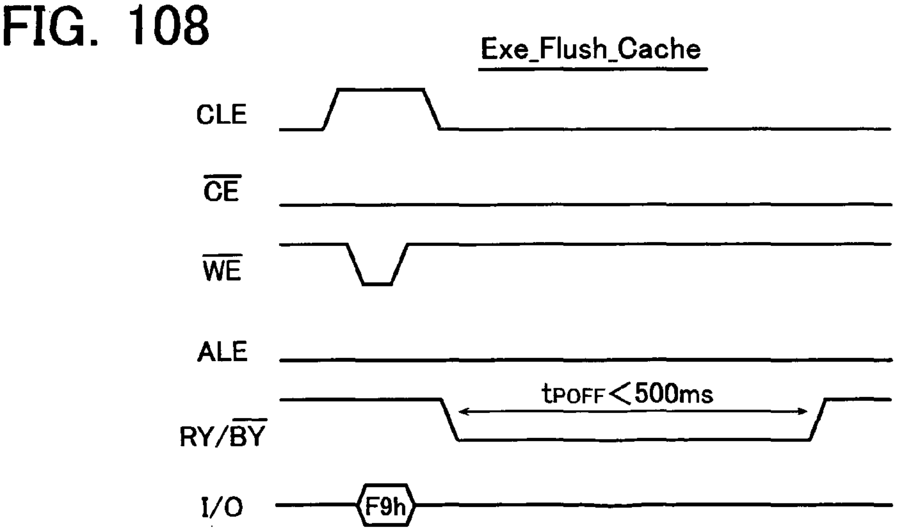
FIG. 108 is a timing diagram of a flash cache execution command.

FIG. 108 shows a flash cache command for terminating all processes executed in the LBA-NAND memory, which command is recommended input before power-off. In a word, after execution of this command <F9h> and a certain busy period, the ready state is established to indicate termination of all processes. Power-off at this state can avoid a system trouble that is caused by power-off at the state when processes are not terminated completely.

Figure 109:
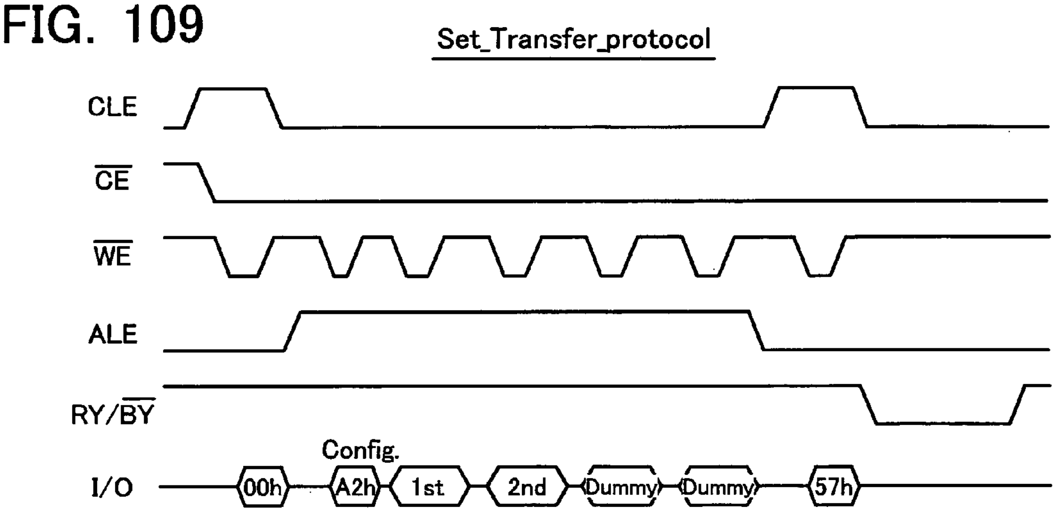
FIG. 109 is a timing diagram of a transfer protocol setting command.

FIG. 109 is a timing diagram of a transfer protocol setting command. A default data transfer format is ECC-corrected in the form of 1 sector=528 Bytes. The input of data subsequent to a configuration command makes it possible to set the data transfer protocol as shown in FIG. 11D.

Figure 110:
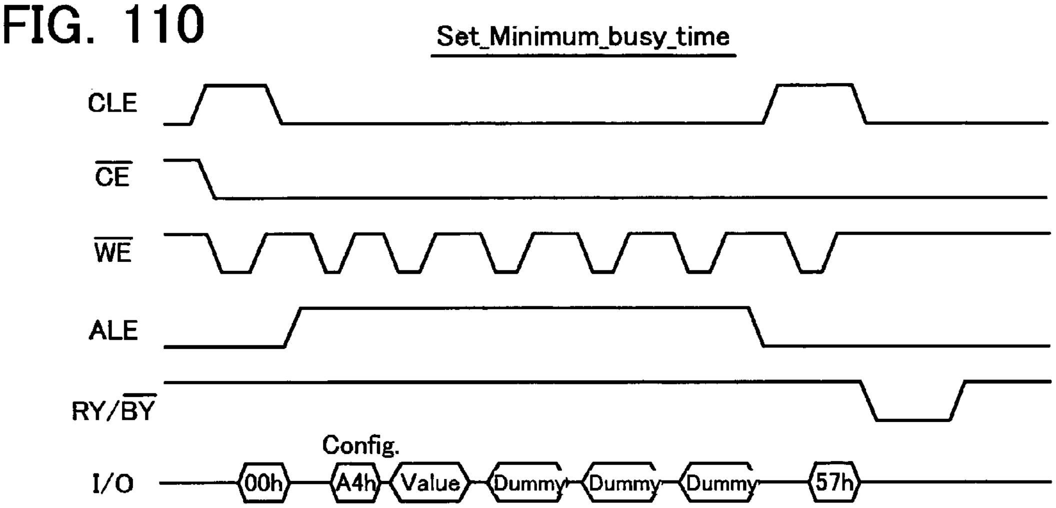
FIG. 110 is a timing diagram of a minimum busy time setting command.

FIG. 110 is a timing diagram of a minimum busy time setting command. The input of 1-Byte data subsequent to a configuration command makes it possible to determine the minimum busy time as shown in FIG. 11F.

Figure 111:
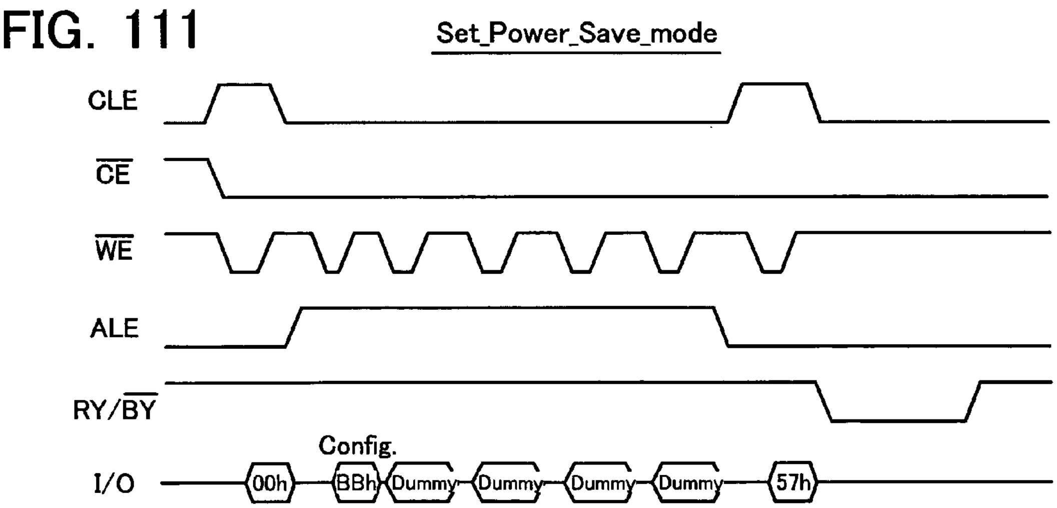

FIG. 111 is a timing diagram of a power save mode setting command. This command brings both read/write accesses into an operation mode that is lower in power consumption than a normal operation.

Figure 112:
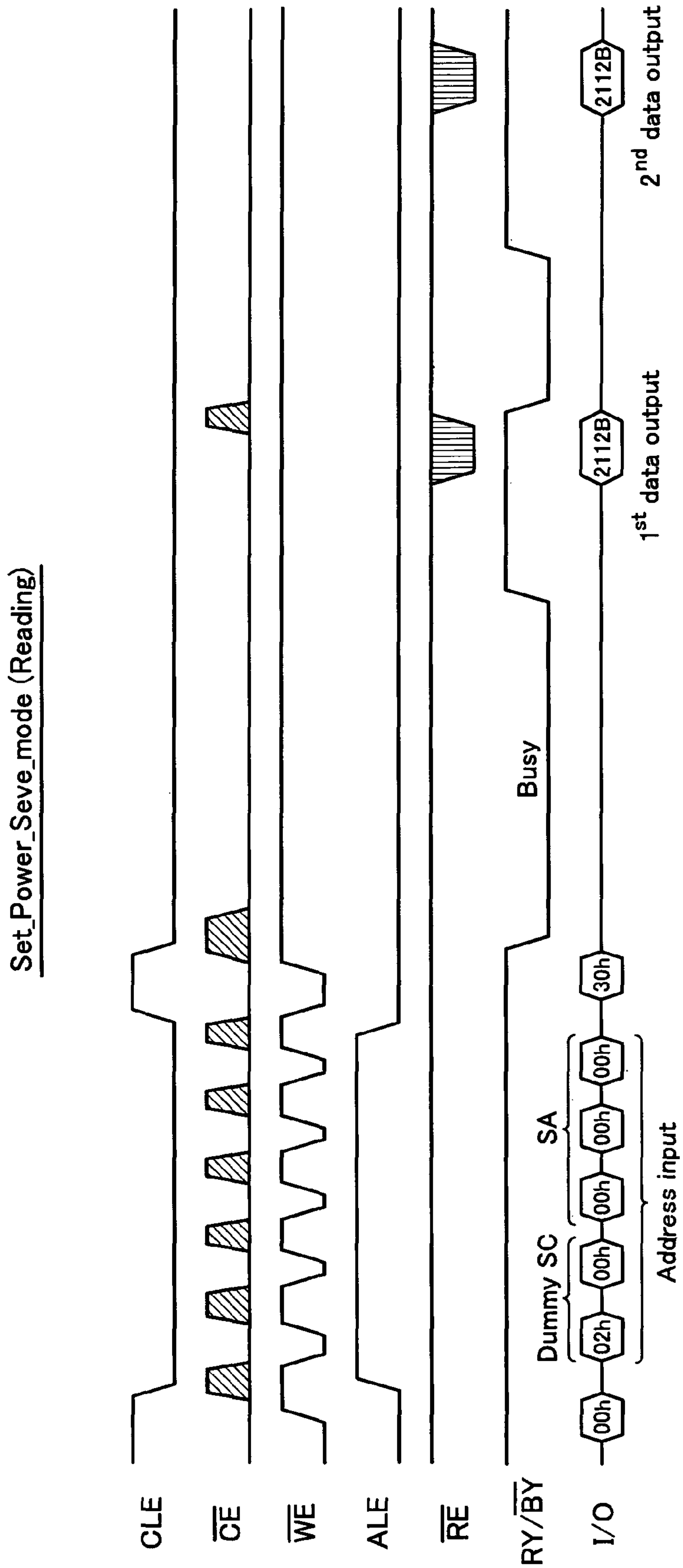

FIG. 112 is related to the case where a power save mode is specifically applied to the read operation. Setting of the power save mode makes it possible to set the busy period and so forth longer than normal.

Figure 113:
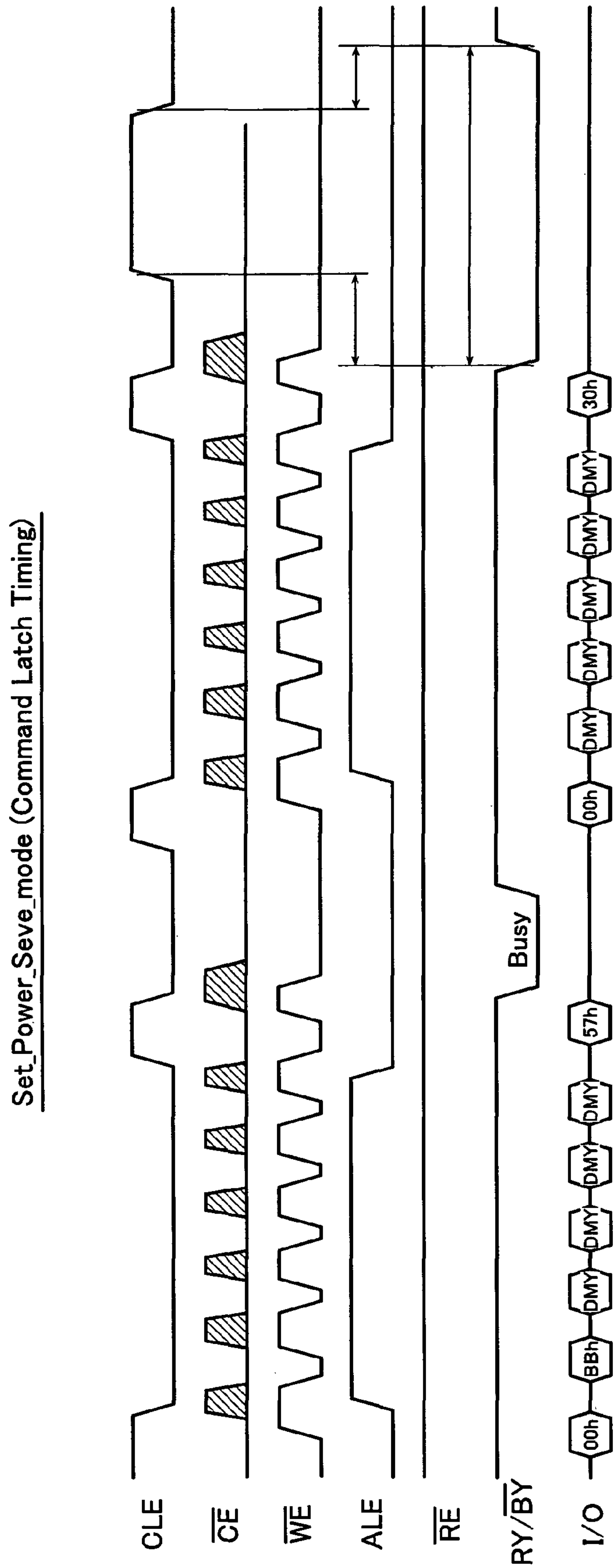

FIG. 113 shows another power save mode setting method. Between a busy period after the input of a power save mode command and a subsequent address and the timing of the command latch enable CLE, an offset time is set to reduce power consumption.

Figure 114:
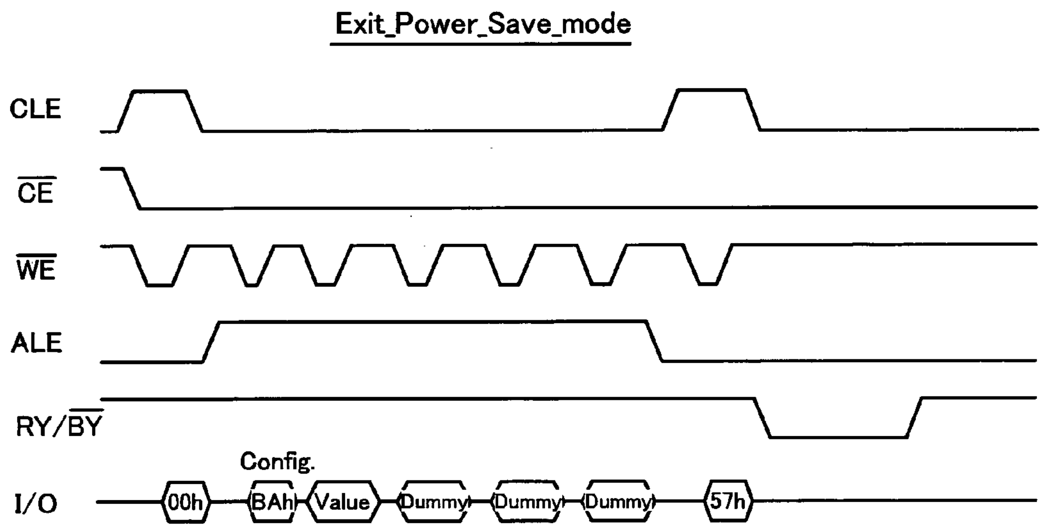

FIG. 114 is a timing diagram of a power save mode exit command. This command makes it possible to reset the power save mode to a normal mode.

Figure 115:
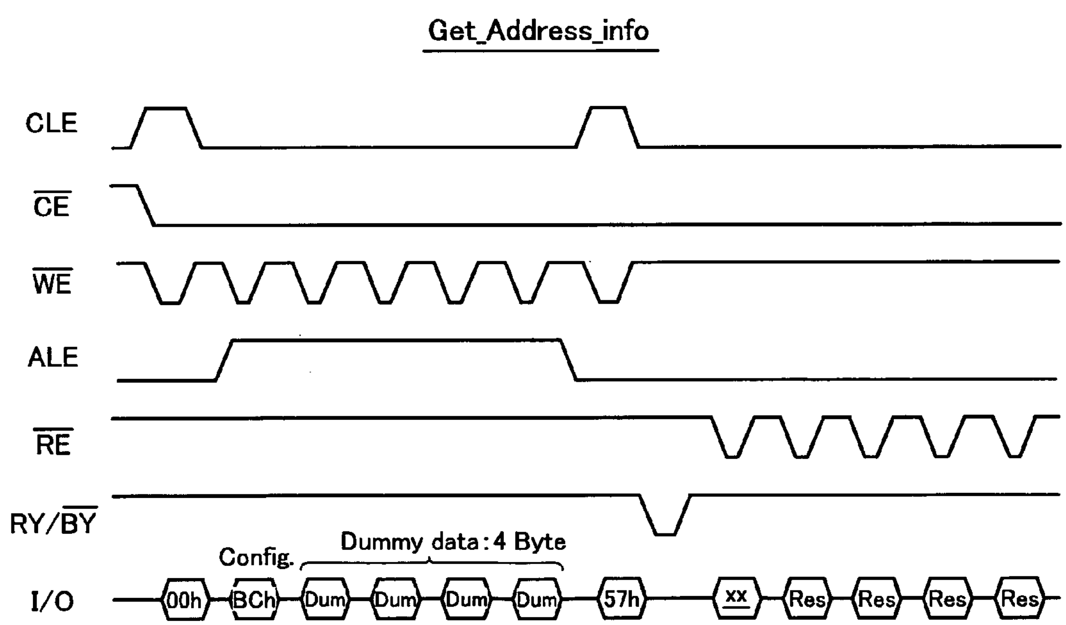

FIG. 115 is a timing diagram of an address acquisition command. This command makes it possible to notice the host of the default in an address latch cycle of the LBA-NAND memory.

Figure 116:
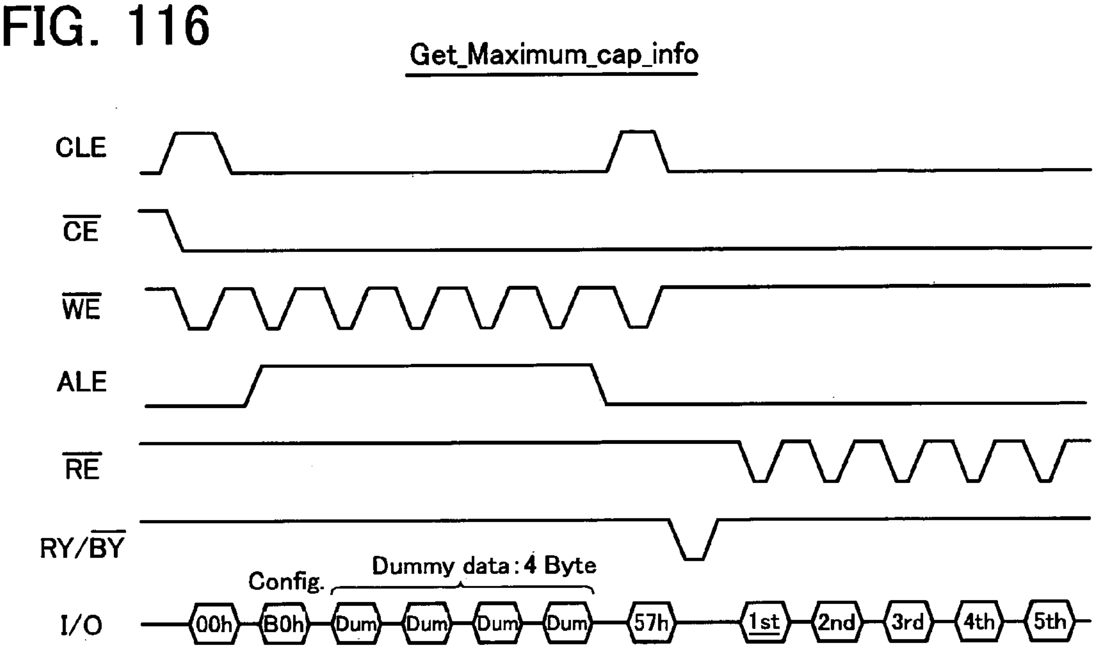

FIG. 116 is a timing diagram of a maximum capacity acquisition command. This command makes it possible to use 5-Byte data to indicate a total number of sectors in the sum of the MDA area and the VFA area supported by the LBA-NAND memory. One sector includes 512 Bytes.

Figure 117:
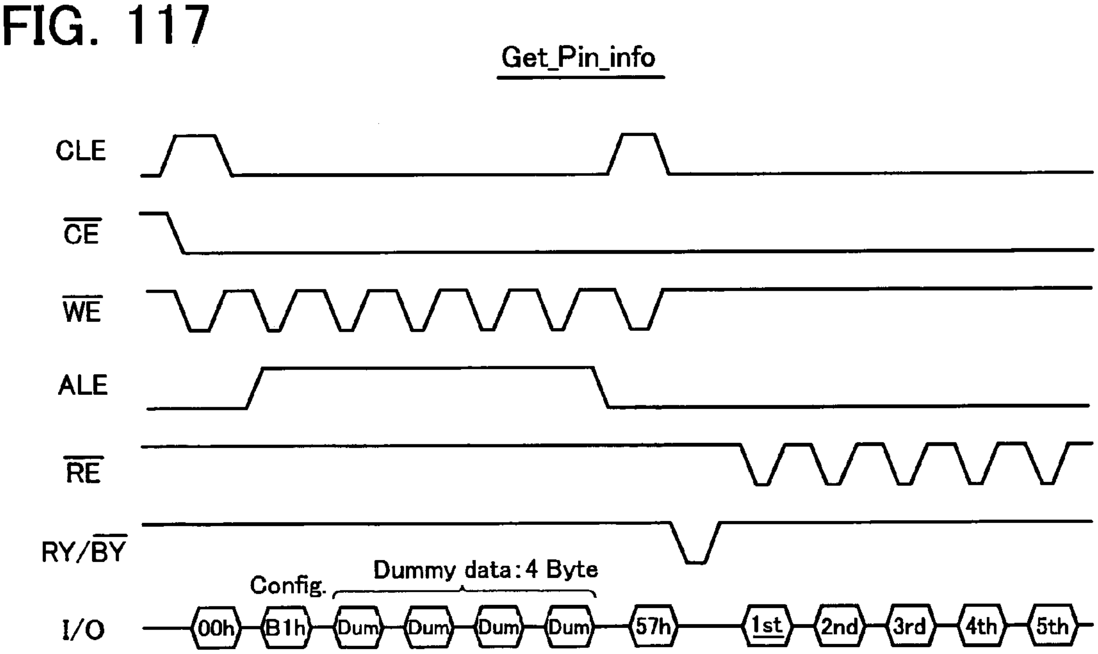

FIG. 117 is a timing diagram of a pin information acquisition command. This command allows the host to identify the levels on the common pins (COME, COM0, COM1) detected in the LBA-NAND memory.

Figure 118:
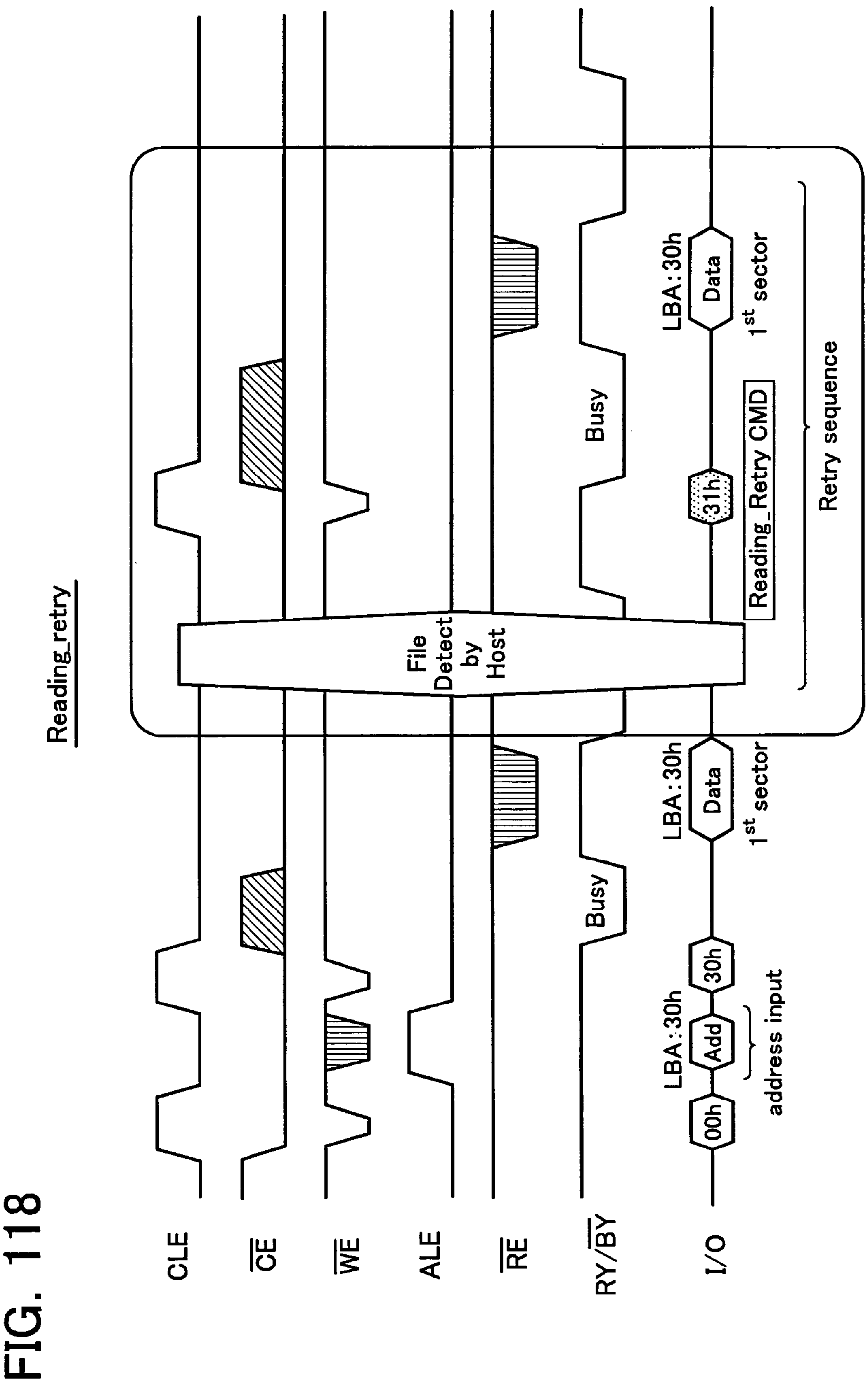

FIG. 118 is a timing diagram of a read data resend request command. When the host detects transfer fail and enters this command <31h>, the LBA-NAND memory resends the same read data.

Additional Embodiment

Figure 119:
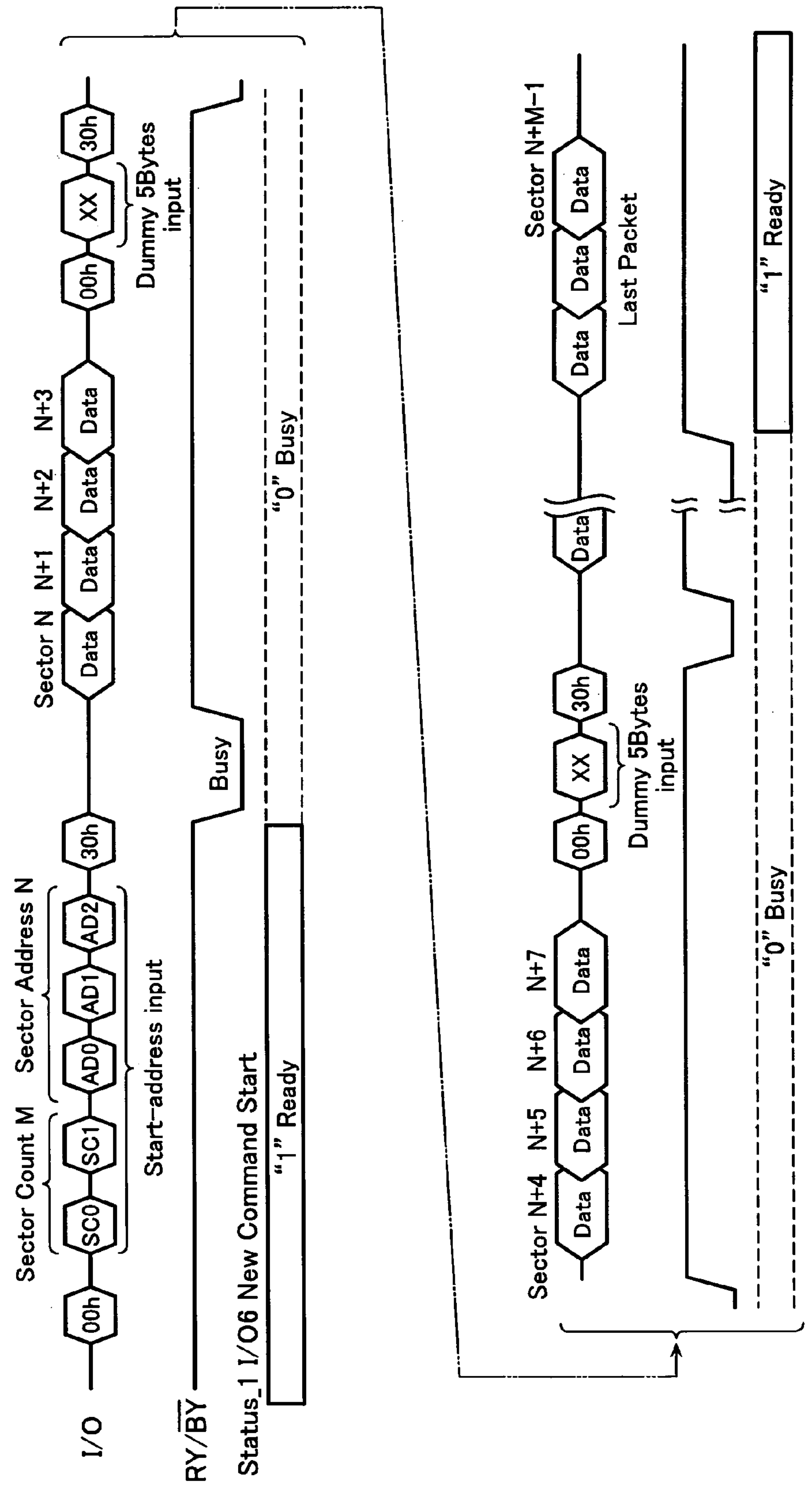
Figure 120:
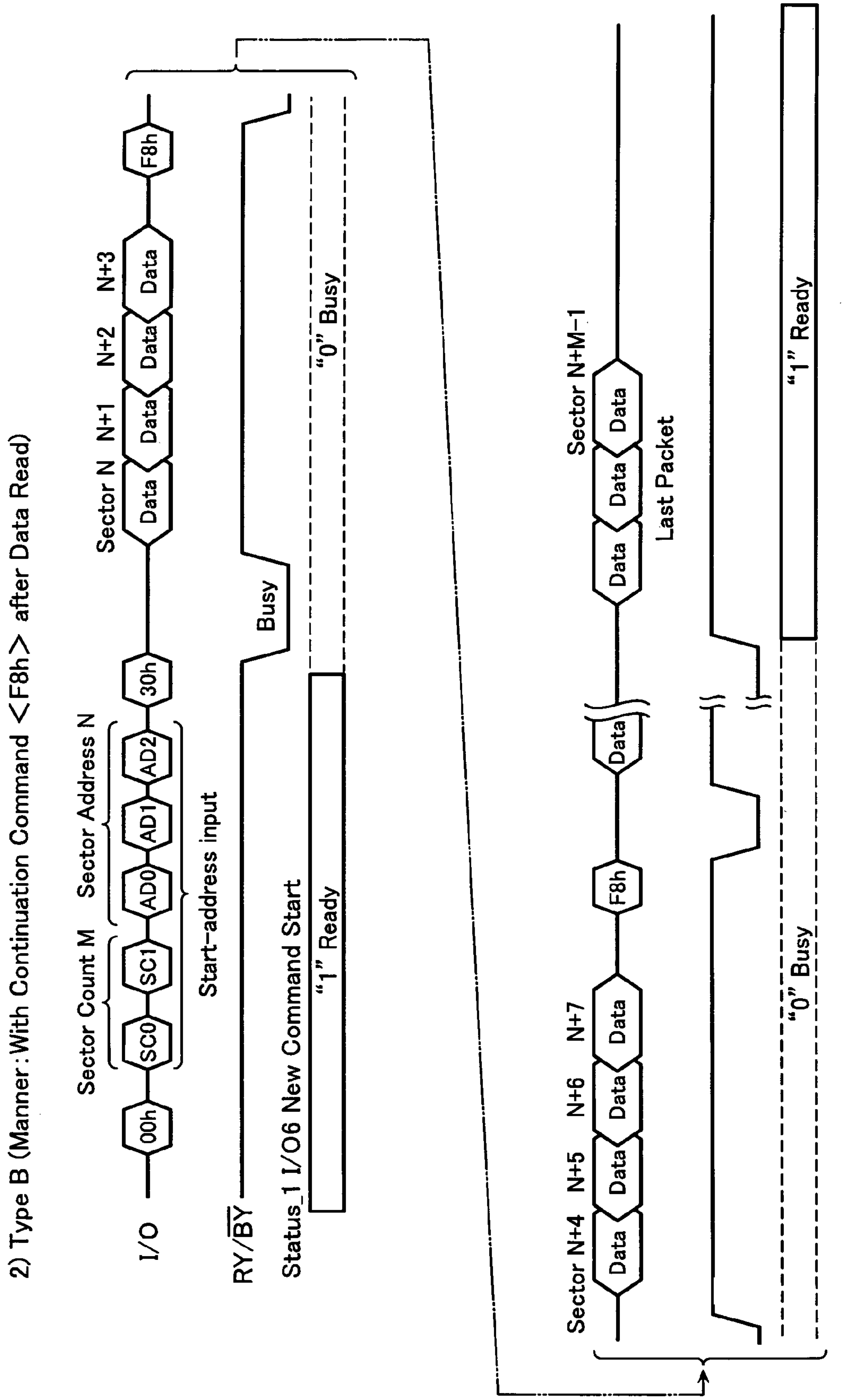
Figure 121:
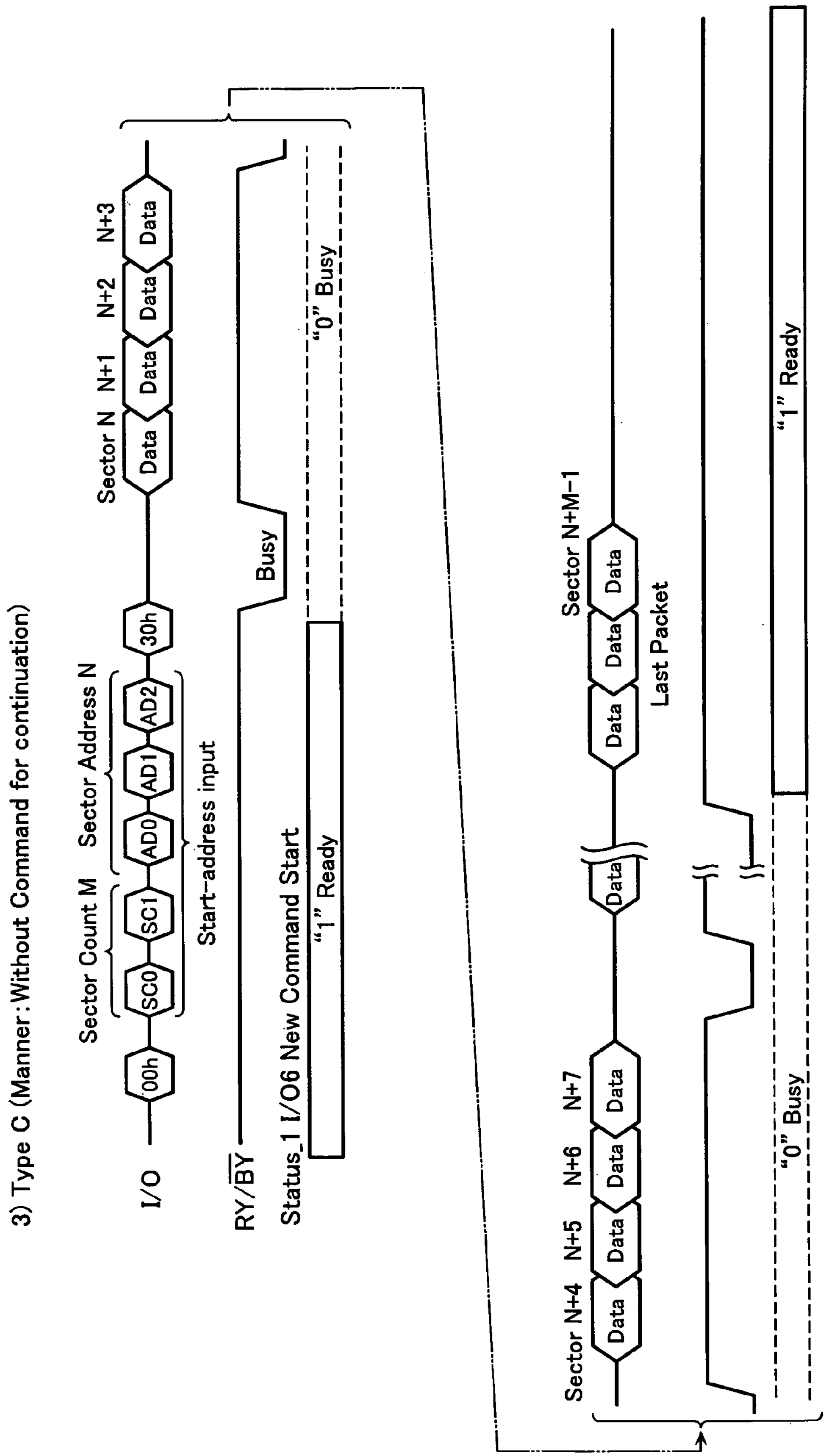

FIGS. 119, 120, and 121 show timing charts of three type sector readings applied to MDA and VFA, i.e., timing charts of types A, B and C, respectively, with status information "Status_1." Each of them is an example of specifying a start address by 2-byte sector count SC and 3-byte sector address AD.

Although a transfer data length is chosen from six options: 512 Bytes·N, or (512+16Bytes)·N (N=1, 4, 8). In this example, N is set at 4. +16Bytes in a data length is transfer-data checkbit by CRC, ECC or the like.

Type A shown in FIG. 119 is an example in which input of dummy sector address <00h>-<xx>-<30h> (xx is a 5-byte dummy address) is performed after the data read of sectors N to N+3, and the following sector read is continued.

Type B shown in FIG. 120 is an example in which the following sector read is continued by the input of a continuation command <F8h> after the read of sectors N to N+3.

Type C shown in FIG. 121 is an example in which the following sector read is continued without input of a continuation command after the read of sectors N to N+3.

FIGS. 119-121 each shows an example in which a busy state (I/O6="0") is continuously indicated in "Status_1" read, since first data is read and until the last data packet of sector read arrives, using I/O6 among I/O1 to I/O8, aside from internal Ready/Busy.

"Status_1" read serves as the following command sequences <70h>-[Status_1 value].

Figure 122:
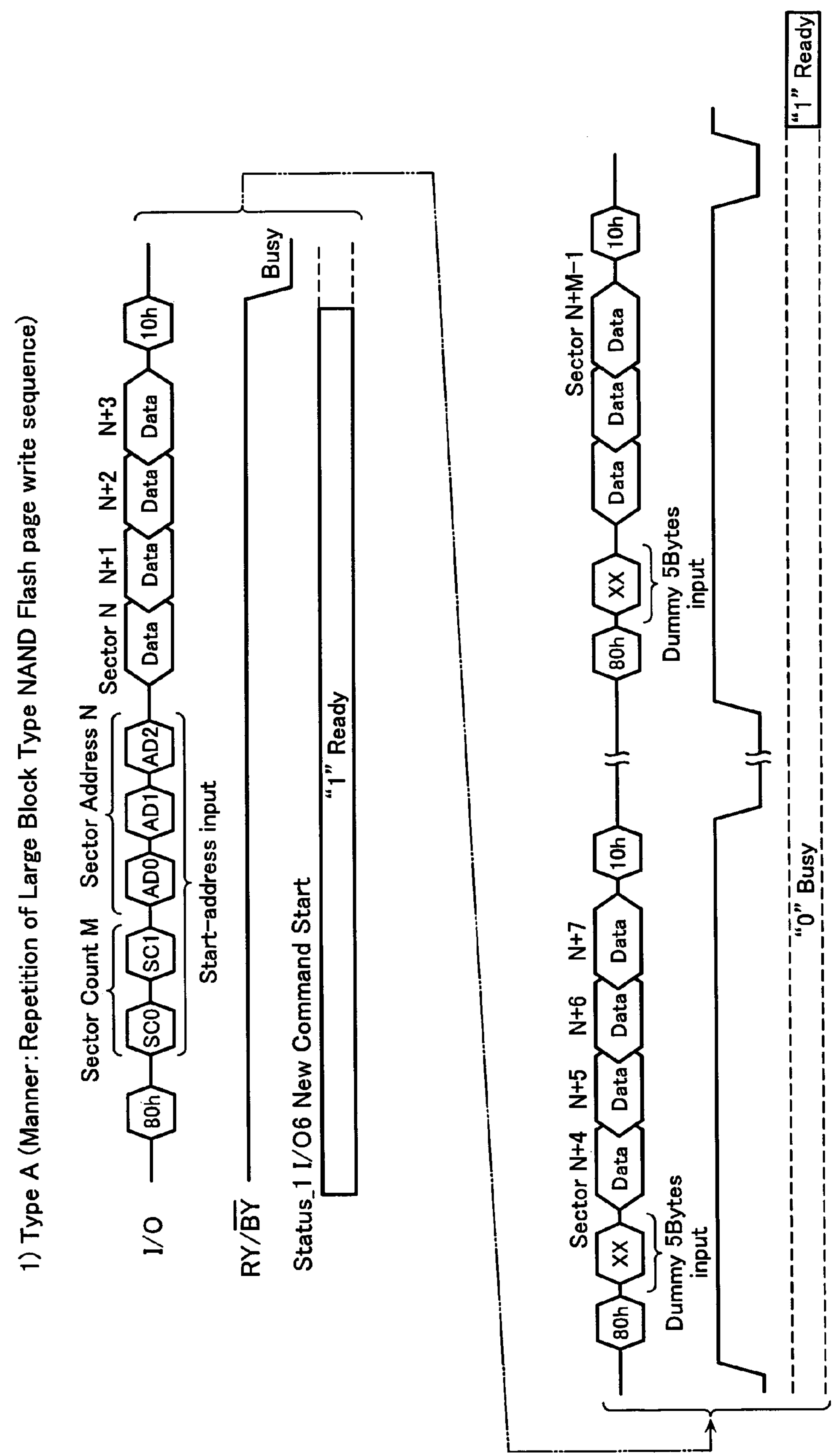

FIGS. 122 and 123 show timing charts of two type sector writings applied to MDA and VFA, i.e., timing charts of types A and B respectively, with status information "Status_1." Each of them is an example of specifying a start address by 2-byte sector count SC and 3-byte sector address AD.

Type A shown in FIG. 122 is an example in which input of dummy sector address <80h>-<xx> is performed after the data writing of sectors N to N+3, and the following sector writing is continued.

Type B shown in FIG. 123 is an example in which the following sector read is continued without input of dummy sector address after the writing of sectors N to N+3.

Note that the read mode of status information "Status_1" includes a case under a PNR mode (FIG. 124), a case under a VFA/MDA mode (FIG. 125), and a case under a boot code maintenance mode (FIG. 126).

In each case, when data read or a write is continuously performed after reading [Status_1 value] according to the above-described command sequence, it is necessary to return to a data read mode or a data write mode by inputting <00h>. The status "Status_1" shown in FIGS. 119-123 is the one shown in FIG. 125, in which a busy status is continuously displayed to the last data packet of a sector reading or a sector writing using I/O6.

The host may detect whether a LBA-NAND memory system is working on a series of sector reading/writing operation, or the LBA-NAND memory system has already completed the series of operation and is ready to perform a new operation, using I/O6 of "Status 1".

For example, let us suppose a case when a new task with a high priority level is generated while an application conducting a sector read is running in a multi-task operation host, and a new access to the LBA-NAND memory system is sought. In this case, if I/O6 of "Status_1" is busy, a termination command <FBh> shown in FIG. 50 may be issued. Then, after the series of the operation under processing is completed, an access to the LBA-NAND memory system corresponding to the new task may be started.

[LBA-NAND System—Summary]

FIG. 127 shows an operation mode overview of the LBA-NAND memory including operation mode changes as described in FIGS. 8 and 9. After initial setup at power-on, a certain command is input to set the PNR mode or Serial-EEP mode to read out PNA data, thereby executing boot code load and system boot.

The PNR mode or Serial-EEP mode can be changed to the MDA access mode using a change command <FCh>. The change command can be used to change the LBA-NAND access mode among the accesses to three areas, that is, among the MDA access mode, the PNA access mode and the VFA access mode. These access modes are terminated after completion of flash cache that finally writes all data from the buffer RAM into the flash memory.

The invention claimed is:

1. A nonvolatile memory system connectable to a host device, comprising:

a nonvolatile memory having a plurality of data areas; and a memory controller operative to control read and write operations to the nonvolatile memory, wherein the memory controller successively executes read/write operations to plural sectors within a selected data area in the nonvolatile memory in accordance with a command and a sector count and sector address fed from a host device, and the memory controller determines that data received from the host device denotes the sector count and the sector address when an address latch enable signal is activated.

2. The nonvolatile memory system according to claim 1, wherein as the plurality of data areas, a first application program area having a capacity capable of being increased/decreased in accordance with the input of a capacity change command, a second application program area having a capacity to be decreased or increased in response to an increase or decrease in capacity of the first application program area, and a boot data record area for a host system are provided.

3. The nonvolatile memory system according to claim 2, wherein the first application program area is a program area for vender applications, and the second application program area is a program area for end user applications.

4. The nonvolatile memory system according to claim 2, wherein the first and second application program areas have read/write data transfer units, which can be set changeable with a selection of sector multiples.

5. The nonvolatile memory system according to claim 1, wherein the nonvolatile memory comprises a memory cell array in which a plurality of NAND cell units with a plurality of electrically-rewritable nonvolatile memory cells serially connected are arrayed, a bit line is connected to one end of the NAND cell unit via a selection gate transistor, and a common source line is connected to the other end of the NAND cell unit via a selection transistor.

6. The nonvolatile memory system according to claim 5, wherein the memory controller performs write control in the boot data record area such that write to a cell adjacent to the selection gate transistor is not performed.

7. The nonvolatile memory system according to claim 5, wherein the memory controller performs write control in the boot data record area such that write is executed only to one of odd pages and even pages of the memory cell array.

8. The nonvolatile memory system according to claim 5, wherein the nonvolatile memory cell array is configured to store data of multivalue bit per nonvolatile memory cell, and the memory controller performs write control in the boot data record area such that 1 bit data storing is performed per nonvolatile memory cell.

9. The nonvolatile memory system according to claim 1, wherein the memory controller comprises:

a first interface performing data transfer with the nonvolatile memory;

a second interface performing data transfer with the host devices;

a data resistor temporarily holding data transferred by the first and second interfaces; and a processing unit controlling data transfer via the first and second interfaces.

10. The nonvolatile memory system according to claim 1, wherein as the plurality of data areas, a first application program area having a capacity to be increased/decreased in accordance with the input of a capacity change command, a second application program area having a capacity to be decreased or increased in response to an increase or decrease in capacity of the first application program area, a boot data record area for a host system, and a system data record area for the memory controller are provided.

11. The nonvolatile memory system according to claim 10, wherein data is automatically read from the boot data record area and the system data record area into the memory controller at the time of power-on, and then a read command is input to set a read mode in which the boot data is read into the host device.

12. The nonvolatile memory system according to claim 10, wherein the first and second application program areas have read/write data transfer units, which can be set changeable with a selection of sector multiples.

13. A data read/write method for nonvolatile memory system comprising a nonvolatile memory having a plurality of data areas and a memory controller operative to control read and write operations to the nonvolatile memory, the system being connectable to a host device, the method comprising:

providing a command, a sector count and sector address from a host device; and successively executing read/write to plural sectors within a selected data area in the nonvolatile memory in accordance with a command and a sector count and sector address under a control of the memory controller, wherein the memory controller determines that data received from the host device denotes the sector count and the sector address when an address latch enable signal is activated.

14. The data read/write method for nonvolatile memory system according to claim 13, wherein as the plurality of data areas, a first application program area having a capacity capable of being increased/decreased in accordance with the input of a capacity change command, a second application program area having a capacity to be decreased or increased in response to an increase or decrease in capacity of the first application program area, and a boot data record area for a host system are provided.

15. The data read/write method for nonvolatile memory system according to claim 14, wherein the first and second application program areas have read/write data transfer units, which can be set changeable with a selection of sector multiples.

16. The data read/write method for nonvolatile memory system according to claim 13, wherein as the plurality of data areas, a first application program area having a capacity to be increased/decreased in accordance with the input of a capacity change command, a second application program area having a capacity to be decreased or increased in response to an increase or decrease in capacity of the first application program area, a boot data record area for a host system, and a system data record area for the memory controller are provided.

17. A data read method for a memory system including a nonvolatile memory, the method comprising:

inputting a first read command;

inputting a sector count and sector address with an address latch enable (ALE) signal asserted;

inputting a second read command; and receiving a sector specified by the sector count and the sector address.

18. The method according to claim 17, further comprising:

inputting the first read command after receiving the sector;

inputting a dummy address;

inputting the second read command; and receiving a next sector being continuous to the sector.

19. The method according to claim 17, further comprising:

inputting a continuation command after receiving the sector; and receiving a next sector being continuous to the sector.

20. The method according to claim 19, wherein the continuation command is <F8h>.

21. The method according to claim 17, further comprising:

receiving a next sector being continuous to the sector without inputting a command.

22. The method according to claim 17, wherein the first read command is <00h> and the second read command is <30h>.

23. The method according to claim 17, further comprising:

inputting a status read command; and receiving status indicating whether the memory system is working on a series of sector reading operations aside from a Ready/Busy (R/B) signal.

24. The method according to claim 23, wherein the status read command is <70h>and the status is output from an input/output terminal (I/06).

25. A data write method for a memory system including a nonvolatile memory, the method comprising:

inputting a first write command;

inputting a sector count and sector address with an address latch enable (ALE) signal asserted;

inputting a sector specified by the sector count and the sector address; and inputting a second write command.

26. The method according to claim 25, further comprising:

inputting the first write command after inputting the second write command and Ready/Busy (R/B) signal is negated;

inputting a dummy address;

inputting a next sector being continuous to the sector; and inputting the second write command.

27. The method according to claim 25, further comprising:

inputting the first write command after inputting the second write command and Ready/Busy (R/B) signal is negated;

inputting a next sector being continuous to the sector without inputting a dummy address; and inputting the second write command.

* * * * *